United States Patent [19]
Sano et al.

[11] Patent Number: 5,523,126
[45] Date of Patent: Jun. 4, 1996

[54] METHOD OF CONTINUOUSLY FORMING A LARGE AREA FUNCTIONAL DEPOSITED FILM BY MICROWAVE PCVD

[75] Inventors: Masafumi Sano, Nagahama; Masahiro Kanai, Hikone, both of Japan

[73] Assignee: Canon Kabushiki Kaisha, Tokyo, Japan

[21] Appl. No.: 351,949

[22] Filed: Dec. 8, 1994

Related U.S. Application Data

[62] Division of Ser. No. 295,487, Aug. 25, 1994, Pat. No. 5,397,395, which is a continuation of Ser. No. 181,478, Jan. 14, 1994, abandoned, which is a continuation of Ser. No. 784,255, Oct. 29, 1991, abandoned.

[30] Foreign Application Priority Data

Oct. 29, 1990 [JP] Japan .................................. 2-292712

[51] Int. Cl.[6] ............................ B05D 3/06; H05H 1/46
[52] U.S. Cl. ..................... 427/575; 427/255.5; 118/718; 118/723 MW; 118/729
[58] Field of Search ................................. 427/575, 255.5, 427/569; 118/718, 719, 723 MW, 725, 729, 730

[56] References Cited

U.S. PATENT DOCUMENTS

| | | | |
|---|---|---|---|
| 3,814,983 | 6/1974 | Weissfloch et al. | 315/39 |
| 4,265,932 | 5/1981 | Peters | 118/725 |
| 4,504,518 | 3/1985 | Ovshinsky et al. | 427/38 |
| 4,517,223 | 5/1985 | Ovshinsky et al. | 427/39 |
| 4,521,717 | 6/1985 | Keiser | 315/39 |
| 4,729,341 | 3/1988 | Fournier et al. | 118/723 |
| 4,785,763 | 11/1988 | Saitoh | 118/715 |
| 4,909,184 | 3/1990 | Fujiyaria | 118/723 |
| 4,951,602 | 8/1990 | Kanai | 118/719 |
| 4,995,341 | 2/1991 | Matsugama et al. | 118/723 |
| 5,016,565 | 5/1991 | Saitoh et al. | 118/723 MW |
| 5,038,713 | 8/1991 | Kawakami et al. | 118/723 |
| 5,114,770 | 5/1992 | Echizen et al. | 427/45.1 X |

FOREIGN PATENT DOCUMENTS

| | | |
|---|---|---|
| 55-141729 | 11/1980 | Japan . |
| 57-133636 | 8/1982 | Japan . |
| 61-288074 | 12/1986 | Japan . |
| 2175878 | 7/1990 | Japan . |
| 3-30419 | 2/1991 | Japan . |

OTHER PUBLICATIONS

M. Dahimene et al., "The performance of a microwave ion source immersed in a multicusp static magnetic field," *J. Vac. Sci. Technol. B*, vol. 4, No. 1 Jan./Feb. 1986, pp. 126–130.

T. Roppel et al., "Low temperature oxidation of silicon using a microwave plasma disk source," *J. Vac. Sci. Technol. B*, vol. 4, No. 1, Jan./Feb. 1986, pp. 295–298.

*Primary Examiner*—Roy V. King
*Attorney, Agent, or Firm*—Fitzpatrick, Cella, Harper & Scinto

[57] ABSTRACT

A method for forming a large area functional deposited film by a microwave PCVD method by continuously moving an elongated member in its lengthwise direction, and forming a columnar film-forming chamber the side wall of which is an intermediate portion of the moving elongated member. A deposited film forming raw material gas is introduced into the film-forming space via a gas supply device. Microwave plasma in the film-forming space is generated by radiating microwave energy from a microwave applicator while continuously, at the same time as that of the introduction of the raw material gas, moving a movable sheet made of a dielectric material which is positioned in contact with a microwave introduction opening and the surface of the microwave introduction opening. A deposited film can then be formed on the surface of the elongated member which constitutes the side wall and which is being continuously moved, the side wall constituted by the elongated member being exposed to the microwave plasma.

13 Claims, 15 Drawing Sheets

METHOD OF CONTINUOUSLY FORMING A LARGE AREA FUNCTIONAL DEPOSITED FILM BY MICROWAVE PCVD

This application is a division of application Ser. No. 08/295,487 filed Aug. 25, 1994 now U.S. Pat. No. 5,397,395, which is a continuation of application Ser. No. 08/181,478 filed Jan. 14, 1994, now abandoned, which is a continuation of application Ser. No. 07/784,255 filed Oct. 29, 1991, now abandoned.

BACKGROUND OF THE INVENTION

1. Field of the Invention

The present invention relates to a method of continuously forming a large area functional deposited film by sustaining a substantially uniform microwave plasma over a large area to cause plasma reactions by which a film forming raw material gas is excited and decomposed, and to an apparatus suitable for practicing the method.

Particularly, the present invention relates to a method capable of continuously forming a uniform functional deposited film over a large area while substantially improving the utilization and efficiency of a film-forming raw material gas at a high deposition rate and to an apparatus suitable for practicing the method. Specifically, the method and the apparatus enable mass-production of a large area thin film semiconductor device such as a photovoltaic device at a reduced cost.

2. Description of the Prior Art

As a result of marked generation of power in order to meet an increased demand in the recent years, serious problems of environmental pollution have arisen all over the world.

In fact, the system for generation of atomic power which had been anticipated as a power generation system capable of replacing the system for generation of steam-power and which has been in operation in some areas of the world, there have been occurrences where the systems were broken down causing radioactive contamination of living things including humans, as for example, the Chernobyl nuclear power plant accident. Because of this, there is fear of further development of the system for generation of atomic power. There are some countries that have already prohibited establishing any new atomic power plants.

In the case of steam-power generation, the amount of a fossil fuel represented by coal or petroleum consumed for power generation in order to satisfy the public demand for increased power supply has continuously increased. Accordingly, the amount of exhaust fumes from the steam-power generation plants has continuously increased so as to raise the content of gases, thereby causing a greenhouse effect such as accumulation of carbon dioxide gas in the air. This results in an earth-warming phenomenon. In fact, the annual average temperature of the earth has been heightened in recent years. In order to prevent the earth-warming phenomenon from further developing, the IEA (International Energy Agency) has proposed reducing the amount of carbon dioxide exhausted from the steam-power generation plant as much as 20% of the current level by the year 2005. Against this background, there is the situation that the populations of the developing countries will continue to increase and along with this, a demand for power supply will be increased. In addition, it is expected that the manner of living in the developed countries will be further modernized with further developments in electronic instruments and consequently, the amount of power consumption per person will be eventually increased. In view of the above, the matter of power supply is now a subject to be internationally discussed in terms of the earth.

In this situation, public attention has now focused on various studies that have been made on the power generation system using a solar cell since it has various advantages. It is a clean power generation system free of the foregoing problems relating to radioactive contamination, earth-warming and environmental pollution. The sunlight to be used as its energy source reaches everywhere on the earth and there is no problem of an energy source to be localized. Further, the power generation equipment can be simplified and a relatively high power generation efficiency can be attained. In order for the solar cell power generation system to be devised so that it can supply power in a quantity to satisfy the public demand, it is basically required that the solar cell be capable of providing a sufficiently high photoelectric conversion efficiency, can stably exhibit the solar cell characteristics and can be mass-produced.

In order to provide the average family with the power to meet consumption needs, a solar cell capable of outputting a power of about 3 KW is necessary. In this case, the photo-electric conversion efficiency of the solar cell should be about 10%. The solar cell is required to have an area of about 30 $m^2$ in order to provide the power. In the case where it is intended to satisfy the demands for power supply of 100,000 families, the solar cell is required to have an area of 3,000,000 $m^2$.

In view of this, public attention has been focused on an amorphous silicon solar cell which is prepared by depositing a semiconductor film such as an amorphous silicon semiconductor film on a relatively inexpensive substrate such as glass or metal sheet wherein glow charge is caused in a film-forming raw material gas such as silane gas. It is anticipated that it can be mass-produced and can be provided at a lower cost in comparison with a single crystal silicon solar cell. Various proposals have been made on the amorphous silicon solar cell.

In the case of the power generation system using a solar cell, there is usually a system employed in which a plurality of unit modules are connected in series or in parallel to form a unit from which a desired current or voltage can be obtained. For each of the plurality of modules, it is required that neither disconnection nor short circuit occur. It is further required that each of the plurality modules stably outputs an even current or voltage. In order to satisfy these requirements, each unit module must be prepared so that its constituent semiconductor layer, being an important element, be formed so as to stably exhibit uniform characteristics. Further, to simplify the design of the module and the process for assembling a plurality of unit modules to a unit, it is essential to provide a large area semiconductor film having uniformity not only in the thickness but also in quality and capability of exhibiting uniform semiconductor characteristics. These features enable economic mass production of a solar cell.

Now, in the solar cell, its constituent semiconductor layers, which are basically important constituent elements thereof, are conjugated to form a semiconductor junction such as pn junction or pin junction. These semiconductor junctions can be attained by respectively stacking different semiconductor layers having a different conduction type from one another, by ion-implanting or thermally diffusing a dopant of a different conduction type into one of the constituent semiconductor layers of the same conduction type.

This situation is to be more detailed in the case of the amorphous silicon solar cell. It is known that glow discharge is caused in a gas mixture composed of a film-forming raw material gas such as silane gas ($SiH_4$) and a raw material gas capable of supplying an element to be a dopant such as phosphine ($PH_3$) or diborane ($B_2H_6$) to form a semiconductor film having a desired conduction type. When a plurality of semiconductor films respectively having a different conduction type are formed successively on a substrate in this manner, these semiconductor films are conjugated to form a desired semiconductor junction. In view of this, various proposals have been made that respective constituent semiconductor layers are individually formed in the respective independent film-forming chambers and stacked on a substrate to form a desired semiconductor junction between each pair of the semiconductor layers stacked, thereby obtaining an amorphous silicon solar cell.

For instance, the specification of U.S. Pat. No. 4,400,409 discloses a continuous plasma CVD (hereinafter called a "PCVD") apparatus wherein the so-called roll to roll system is employed. The continuous PCVD apparatus comprises a plurality of glow discharge regions, wherein a sufficiently long flexible substrate having a desired width is disposed in a route through which the substrate sequentially passes through a plurality of the glow discharge regions. The substrate is continuously conveyed in its longitudinal direction while forming the required conductive type semiconductor layer in each of the glow discharge regions. Thus, the desired devices having the semiconductor junction can be continuously formed. The specification describes a gas gate provided for preventing the diffusion and mixture of the dopant gas with the other glow discharge regions. The plurality of glow discharge regions are isolated one from the other by a slit-shape isolation passage way provided with means for forming a cleaning gas flow of Ar, $H_2$, etc. It may be considered that this roll to roll PCVD apparatus will be suitable for the mass-production of a semiconductor device. However, this roll to roll PCVD apparatus is problematic in the case of mass-producing a semiconductor device with a plurality of semiconductor junctions since each of the constituent semiconductor layers is formed by the PCVD method using a RF energy, there is a limit for continuously forming those constituent semiconductor layers at a high deposition rate while maintaining the characteristics desired for each of those constituent semiconductor layers. That is, even in the case of forming a thin semiconductor layer of, for example, about 5000 Å, it is necessary to always sustain a substantially uniform plasma over a large area. However in this roll to roll PCVD apparatus, there are many correlated film-forming parameters which are difficult to be generalized and highly-skilled technicians are required to do so. In addition to this, there are still other unresolved problems for the roll to roll PCVD apparatus in that the decomposition rate and the utilization efficiency of a film-forming raw material gas are not sufficient making the product unavoidably costly.

Japanese Patent Laid-Open No. 61-288074 discloses an improved roll to roll film-forming apparatus comprising a reaction chamber containing a hollow shaped curtaining portion of a flexible substrate, the reaction chamber having a reaction space circumscribed by the hollow-shaped curtaining portions and the reaction chamber being provided with at least an activation chamber isolated from the reaction chamber. The film formation by this apparatus is carried out by introducing active species formed in the activation chamber and if necessary, other film-forming raw material gas into the reaction space, wherein they are chemically reacted with the action of heat energy to form a deposited film on the inner surface of the hollow-shaped curtaining portion positioned in the reaction chamber. This roll to roll film-forming apparatus is advantageous in the viewpoint that the apparatus can be relatively compact and the deposition rate of a film to be formed may be improved because of using active species in comparison with the known PCVD apparatus.

The film formation by this roll to roll film-forming apparatus utilizes the film-forming chemical reaction with the aid of heat energy. Therefore, when the deposition rate of a film to be formed is desired to be heightened, it is necessary to increase not only the flow rate of active species to be introduced into the reaction space but also the quantity of heat energy to be supplied thereto. However, it is extremely difficult to do so since there is a limit not only for the manner of generating a large amount of the active species in the activation chamber and sufficiently introducing the active species into the reaction space at a high flow rate without leakage but also for uniformly supplying a large quantity of the heat energy into the reaction space.

In recent years, a PCVD method using microwave has been observed to exhibit various advantages which cannot be attained by the RF glow discharge decomposition method. That is, it is possible to heighten the energy density, to effectively generate a plasma and to maintain the plasma in a desired state.

For instance, the specifications of U.S. Pat. Nos. 4,517,223 and 4,504,518 describe processes for forming deposited thin film on a small area substrate in a microwave glow discharge plasma under a low pressure condition. These two patent specifications note that because the processes are conducted under the low pressure condition, any of these processes makes it possible to obtain a high quality deposited film at a remarkably high deposition rate while eliminating not only polymerization of active species which impacts negative effects to the characteristics of a film to be formed. However, neither of these two patent specifications mentions anything about uniform deposition of a film over a large area.

The specification of U.S. Pat. No. 4,729,341 discloses a low pressure microwave PCVD method and an apparatus suitable for practicing the same, wherein a photoconductive semiconductor thin film is deposited on a large area cylindrical substrate using a pair of radiative waveguide applicators in a high power process. However, the large area substrates are limited to cylindrical substrate. That is, the electrophotographic photoreceptors, and the teachings described therein are not directly applied to elongated substrates having a large area. Further, the film-forming process is to be practiced in a batch system and the amount of deposited film products obtained by one batch is limited. The specification does not teach anything about continuous film deposition on a large area planar substrate.

Hitherto, the microwave PCVD apparatus has encountered a problem of deterioration in reproducibility due to changes occuring during the time the microwave energy is introduced into the deposition film forming device because the deposited film undesirably adheres to the microwave introduction opening through which the microwave energy is introduced into the apparatus. Furthermore, the above-described microwave introduction opening must be periodically repaired, causing the deposited film manufacturing cost to be raised excessively.

Furthermore, the above-described adhesion of the deposited film to the microwave introduction opening raises the temperature of the deposited film simultaneously with the rise in the temperature of the microwave introduction opening due to the absorption heat of the microwave and the radiative heat of the plasma. In a case where the deposited film is thin, no critical problem takes place because the quantity of the absorbed microwave is not considerably large. However, the above-described quantity increases in proportion to the thickness of the deposited film. Thus, the temperature of the film deposited on the surface of the microwave introduction opening is raised considerably. As a result, an undesirable phase shift such as crystallization sometimes takes place. As a result, the absorption of the microwave by the deposited film on the microwave introduction opening can be greatly changed, causing the discharge state to be unstable. The worst of it is that the microwave introduction opening is broken. The breakage of the microwave introduction opening is a critical problem in manufacturing the deposited film.

Now, there are still various problems to be solved for large area film deposition by the MW-PCVD method because non-uniformity of a microwave energy is apt to occur in microwave plasma due to the wavelength of a microwave being short.

For instance, in this respect, there is an attempt to use a slow microwave structure in order to provide uniformity of the microwave energy. However, there is an inherent problem in the slow microwave structure in that there is very rapid fall off of microwave coupling into the plasma as a function of the transverse increase in the distance of the microwave applicator. In order to solve this problem, a proposal has been made that the spacing of the slow microwave circuit from a substrate to be processed be varied to thereby make the energy density at the surface of the substrate uniform along the direction of movement of the substrate. For example, such proposal can be found in the specification of U.S. Pat. No. 3,814,983 or the specification of U.S. Pat. No. 4,521,717. More particularly, the former patent specification discloses that it is necessary to incline the slow wave structure at a certain angle with respect to the substrate. However, the efficiency of transmitting the microwave energy with respect to the plasma is unsatisfactory. The latter patent specification discloses the use of two slow wave structures in an anti-parallel arrangement in a plane which runs parallel to the substrate. More particularly, the latter patent specification discloses that it is desired to set the two slow wave applicators at an angle to each other so that the planes normal to the medians of the applicators intersect at a straight line which extends parallel to the surfaces of the substrate to be processed and at right angles to the travel direction of the substrate. Additionally, in order to avoid structure interference between the two slow wave applicators, it is desired to displace the two s low wave applicators from each other transversely of the travel direction of the substrate by a distance equal to half of the space between the cross-bars of the waveguide. Several proposals have been made in order to provide plasma uniformity and more particularly, energy uniformity, as found, for example, in J. Vac. Sci. Tech. B-4 (January–February 1986) pp. 126–130 and pp. 295–298. These reports describe a microwave reactor called a microwave plasma disc source (MPDS) and that the plasma is in the shape of a disc or tablet, with a diameter that is a function of microwave frequency. More particularly, the reports describe that the plasma disc source can be varied with the frequency of microwave. However, in the case of a microwave plasma disc source which is designed for operation at the normal microwave frequency of 2.45 GHz, the plasma confined diameter is at most about 10 centimeters and the plasma volume is at most about 118 $cm^3$. Thus, this is far from being a large surface area. In the case of a system designed for operation at the lower frequency of 915 MHz, the lower frequency source would provide a plasma diameter of approximately 40 cm with a plasma volume of 2000 $cm^3$; and the microwave plasma disc source can be scaled up to discharge diameters in excess of 1 m by operating at still lower frequencies, for example 400 MHz. However, it is extremely expensive to establish such an apparatus which can perform this.

In order to effectively provide high density plasma using microwave, means have been proposed to establish the electron cyclotron resonance condition (namely, the ECR condition) by arranging electro-magnets around the cavity resonator as found in Japanese Patent Laid-Open Publication Nos. 55-141729 and 57-133636. At academic meetings, etc., methods have been reported of forming various semiconductor thin films by utilizing high density plasma and some microwave ECR PCVD apparatus capable of performing such methods have been commercialized.

However, it has been generally recognized in the technical field to which the invention pertains that it is technically difficult to form a deposited film uniformly over a large area substrate because of non-uniformity of plasma caused by the wavelength of microwave and also because of non-uniformity of magnetic field distribution due to the use of the magnets for the control of plasma. In the case where the microwave ECR PCVD apparatus is intended to scale up so that film deposition over a large area can be done, there are various problems to be solved beforehand such as the necessity of scaling up the electric magnets providing means for preventing the apparatus from overheating and providing a special DC high power regulated supply.

Further, the deposited film obtained by the known microwave ECR PCVD method is usually inferior to the deposited film obtained by the known RF PCVD method with respect to the film property. Further, in the case of forming a deposited film on a substrate by the microwave ECR PCVD method, there is a distinguishable difference with respect to the film deposition rate and the film property between the film formed in the space where the ECR condition is established and the film formed in the space where the ECR condition is not established, that is in the dispersed magnetic field space. In view of this, the microwave ECR PCVD method is not suitable for the preparation of such a semiconductor device that is required to excel in quality and in uniformity with respect to the characteristics to be provided.

The foregoing U.S. Pat. Nos. 4,517,223 and 4,729,341 describe the necessity of maintaining very low pressure in order to provide high density plasmas. That is, they describe that the use of low pressure is necessary in order to obtain high film deposition rate and/or high gas utilization efficiency. However, none of the foregoing slow wave structure and electron cyclotron resonance methods is sufficiently capable of maintaining the relationship among high film deposition rate, high gas utilization efficiency, high power density and low pressure.

In view the above, there is an increased demand for eliminating the foregoing problems of the known microwave PCVD method and providing an improved microwave PCVD process which is free of such problems.

There are also other demands for providing a large area or lengthy thin semiconductor film excelling in quality, uniformity of characteristics and deposition rate which is desirably usable in not only solar cells but also in semiconductor device such as TFTs, photoelectric conversion elements for contact image sensors, switching elements, image input line sensors, etc.

SUMMARY OF THE INVENTION

An object of the present invention is to provide a novel method and an apparatus capable of overcoming the above-described various problems experienced with the conventional thin film semiconductor device forming method and apparatus and forming a deposited film over a large area at high speed while maintaining high quality.

Another object of the present invention is to provide a method and an apparatus for continuously forming a functional deposited film on the elongated member.

Another object of the present invention is to provide a method and an apparatus capable of significantly improving the efficiency of utilizing a raw material gas with which the deposited film is formed and realizing mass production of a thin film semiconductor device at low cost.

Another object of the present invention is to provide a method and an apparatus for generating substantially-uniform microwave plasma over a larger area by a large volume.

Another object of the present invention is to provide a method and an apparatus capable of overcoming problems relating to the microwave introduction opening and stably generating microwave plasma for a long time.

Another object of the present invention is to provide a microwave introducing method and an apparatus in which its microwave introduction opening cannot be broken even if the microwave is introduced for a long time.

Another object of the present invention is to provide a novel method and apparatus capable of continuously and stably forming a photovoltaic device, which displays an excellent photoelectric conversion efficiency, on a relatively wide and elongated substrate.

These objects and others are provided by a method of continuously forming a large area functional deposited film by a microwave PCVD method comprising the steps of simultaneously:

(i) forming a columnar film-forming chamber having opposed end walls and a cylindrical side wall, said cylindrical side wall being an intermediate portion of a continuous moving elongated member;

(ii) introducing a deposited film-forming raw material gas into said film forming chamber via gas supply means; and (iii) generating a microwave plasma in said film-forming chamber through a continuously moving sheet made of dielectric material positioned in contact with surface of a microwave introduction opening to said film-forming chamber; and thereafter depositing a film from said raw material gas on the surface of said elongated member constituting said side wall of said columnar film-forming chamber by exposing said side wall to said microwave plasma.

These objects are also provided by an apparatus for continuously forming a functional deposited film by a microwave PCVD method on an elongated member which is being continuously moved comprising:

(i) a columnar film-forming vacuum chamber having a side wall defined by said elongated member wherein said elongated member is curved at an intermediate portion of said elongated member while means for support and conveying said elongated member is continuously moving said elongated member in the lengthwise direction of said elongated member;

(ii) a microwave introduction opening for introducing microwave energy into said film-forming opening;

(iii) microwave applicator means for radiating microwave energy to generate microwave plasma in said film-forming chamber;

(iv) means for continuously moving a movable sheet made of a dielectric material which is positioned in contact with said microwave introduction opening;

(v) exhaust means for exhausting said film-forming chamber;

(vi) means for introducing a deposited film-forming raw material gas into said film-forming chamber; and (vii) temperature control means for heating or cooling said elongated member.

Other and further objects, features and advantages of the invention will be more fully apparent from the following description.

BRIEF DESCRIPTION OF THE DRAWINGS

FIG. 2 (b) is a schematic view which illustrates the sheet conveying means made of the dielectric material according to the present invention;

DESCRIPTION OF THE PREFERRED EMBODIMENTS

Figure 1:
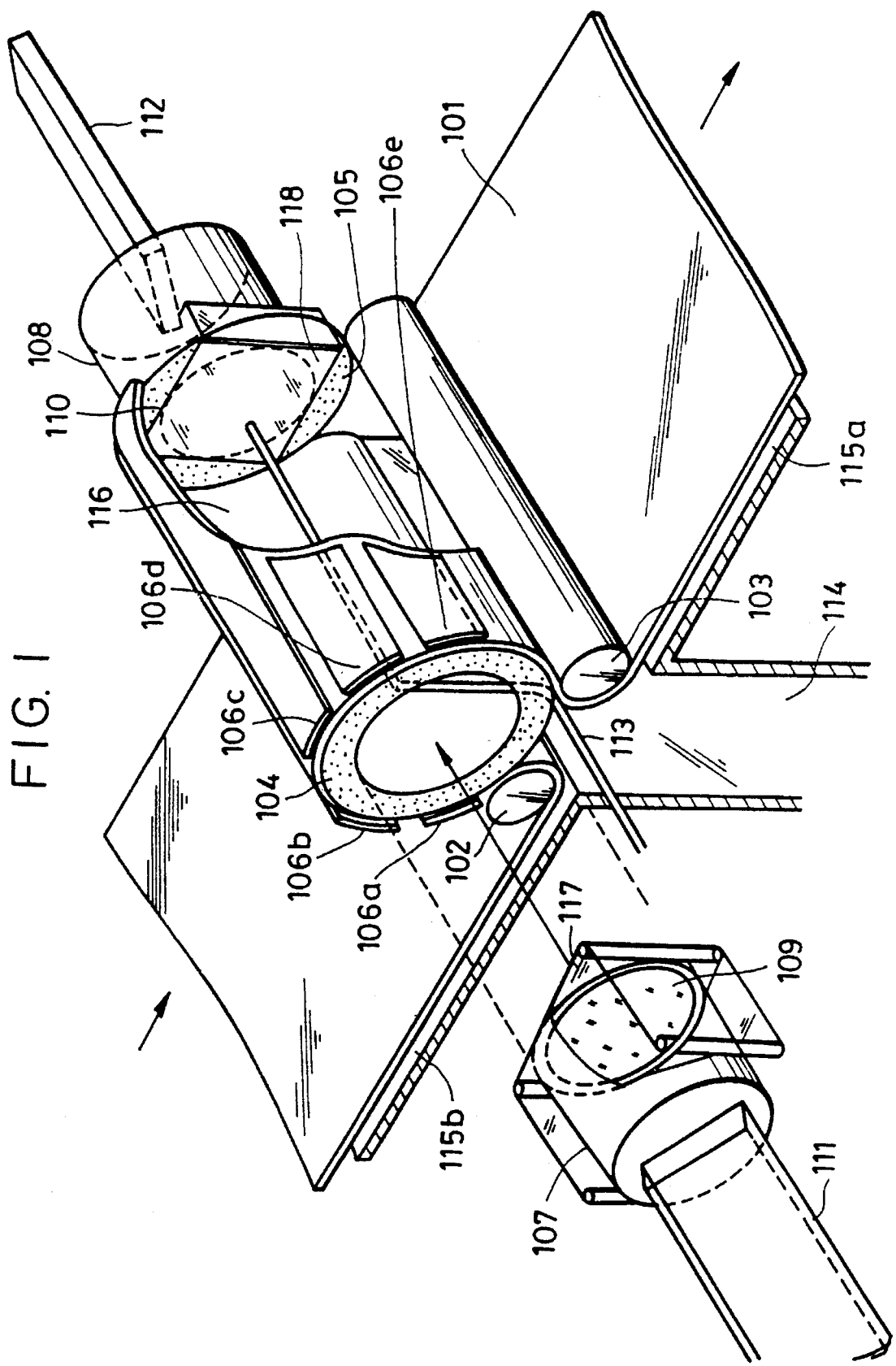
FIG. 1 is a schematic view which illustrates a microwave PCVD apparatus according to the present invention.

The present inventors have made earnest studies to overcome the foregoing various problems in the conventional thin film semiconductor device forming apparatus, and as a result, have discovered that a substantially uniform microwave plasma can be generated in the film-forming chamber in the widthwise direction of the elongated member by the following method: curving the elongated member by a supporting/conveying ring for forming a supporting/conveying roller curving portion for forming a curving initial end and supporting/conveying rollers for forming a curving completion end while leaving a spacing between the supporting/conveying rollers; forming a columnar film-forming chamber, the side wall of which is constituted by the elongated member; disposing a pair of microwave applicator means at the two end surfaces of the film-forming chamber to confront each other in such a manner that microwave energy can be radiated in a direction parallel to the direction in which microwave propagates; disposing a movable sheet made of a dielectric material adjacent to the surface of a microwave introduction opening which introduces microwave energy into the film-forming chamber; introducing a raw material gas for forming a deposited film into the film-forming chamber; exhausting the raw material gas from the spacing left between the pair of the supporting/conveying rollers to maintain the pressure in the film-forming chamber at a predetermined negative pressure; and radiating microwave energy substantially parallel to the side wall.

The present invention was made after further development and relates to a method and an apparatus for continuously forming a large area functional deposited film according to a microwave PCVD method.

According to one aspect of the present invention, a method is provided of continuously forming a large area functional deposited film by a microwave PCVD method comprising the steps of: continuously moving an elongated member in its lengthwise direction, and forming a columnar film-forming space, the side wall of which is an intermediate portion of the moving elongated member; introducing a deposited film forming raw material gas into the film-forming space via gas supply means; generating microwave plasma in the film-forming space by radiating microwave energy from microwave applicator means while continuously and simultaneously with the introduction of the raw material gas, moving a movable sheet made of a dielectric material positioned in contact with a microwave introduction opening and the surface of the microwave introduction opening, whereby a deposited film can be formed on the surface of the elongated member which is being continuously moved, which constitutes the side wall of the film-forming space and is exposed to the microwave plasma.

According to another aspect of the present invention, an apparatus is provided for continuously forming a functional deposited film on an elongated member which is being continuously moved during a microwave PCVD method. The apparatus for continuously forming a functional deposited film comprises: a columnar film-forming chamber which is formed in such a manner that its side wall is formed by the elongated member by curving portion forming means which curves the elongated member at an intermediate portion of the elongated member while continuously moving the elongated member in the lengthwise direction of the elongated member, the columnar film-forming chamber being capable of maintaining the inner portion thereof at substantially vacuum pressure level; a microwave introduction opening for introducing microwave energy into the film-forming opening; microwave applicator means for radiating microwave energy so as to generate microwave plasma in the film-forming chamber; means for continuously moving a movable sheet made of a dielectric material and positioned in contact with the microwave introduction opening; exhaust means for exhausting the inside portion of the film-forming chamber; means for introducing a deposited film forming raw material gas into the film-forming chamber; and temperature control means for heating and/or cooling the elongated member, wherein the deposited film is continuously formed on the side of the elongated member, which is exposed to the microwave plasma.

The method according to the present invention is conducted in such a manner that the elongated member which constitutes the side wall of the film-forming space is continuously moved; microwave energy is radiated in the widthwise direction of the elongated member which constitutes the side wall of the film-forming space, as well as in a direction parallel to the direction of the propagation of the microwave; the movable sheet made of a dielectric material and positioned adjacent to the surface of the microwave introduction opening which introduces the microwave energy is continuously moved. Thereby, the microwave plasma is confined in the film-forming space, so that the large area functional deposited film can be continuously and uniformly formed over a long period of time.

Since the microwave plasma is confined in the film-forming chamber by the method and the apparatus according to the present invention, the stability and reproducibility of the microwave plasma can be improved. Furthermore, the utilization efficiency of the deposited film forming raw material gas can be significantly improved. In addition, the elongated member is continuously conveyed so that the shape and the length of the curve and the conveyance speed are varied. As a result, a deposited film of an arbitrary film thickness can be uniformly and continuously deposited for a long period of time over a large area.

The method and the apparatus according to the present invention are arranged in such a manner that the functional deposited film can be continuously and uniformly formed for a long period of time on the surface of a very long elongated member having a relatively large width. Therefore, they are suitable to be used in a mass-production apparatus for manufacturing large area solar cells.

Furthermore, the deposited film can be continuously formed while continuing the discharge. Therefore, a laminated type device having excellent interfacial characteristics can be manufactured.

In addition, the deposited film can be formed under low pressure, generation of polysilane powder can be prevented and a polymerization or the like of active species can also be prevented. Therefore, faults can be prevented, the film characteristics can be improved and the stability of the film characteristics can be improved.

Accordingly, the operation rate and the yield can be improved and, thereby, low cost and efficient solar cells can be mass-produced.

Furthermore, the semiconductor device manufactured by the method and the apparatus according to the present invention has excellent characteristics in that the photoelectric conversion efficiency is excellent and deterioration of the properties can be prevented for a long period of time.

According to the present invention, the moving elongated member is curved at its intermediate portion by using curving initial end forming means and curving completion end forming means while leaving a spacing in the lengthwise direction of the elongated member between the curving initial end forming means and curving completion end forming means so that the side wall of the film-forming space is formed.

Microwave energy is radiated into the film-forming space via at least one microwave applicator means disposed in either one or two end surfaces of the columnar film-forming space formed in such a manner that the elongated member serves as the side wall.

The microwave applicator means is vertically disposed with respect to the end surface so as to radiate the microwave energy in a direction which is in parallel to the side wall.

The method according to the present invention is conducted in such a manner that the microwave energy is radiated via the microwave introduction opening made of a dielectric material and disposed at the leading portion of the microwave applicator means and the movable sheet made of a dielectric material is positioned adjacent to the surface of the microwave introduction opening.

The microwave applicator means and the film-forming space are hermetically sealed at the microwave introduction opening made of a dielectric material. In a case where the microwave applicator means are disposed to confront each other at the two end surfaces, the microwave applicator means are disposed in such a manner that microwave energy radiated from either of the microwave applicator means is not received by the other microwave applicator means.

According to the method of the present invention, leakage of microwave energy radiated into the columnar film-forming space to the outside portion of the film-forming space is prevented.

The deposited film forming raw material gas introduced into the film-forming space is exhausted through the spacing left in the lengthwise direction of the elongated member between the curving initial end forming means and the curving completion end forming means.

The method according to the present invention is conducted in such a manner that either side of the elongated member is subjected to an electroconductive treatment.

The apparatus according to the present invention is arranged in such a manner that the curved portion forming means consists of at least one pair which is composed of curving initial end forming means and curving completion end forming means and the curving initial end forming means and the curving completion end forming means are so disposed as to leave a spacing in the lengthwise direction of the elongated member.

The curved portion forming means consists of at least one pair composed of supporting/conveying rollers and one pair composed of supporting/conveying rings with one pair of supporting/conveying rollers being disposed parallel to each other while leaving a spacing in the lengthwise direction of the elongated member.

The apparatus according to the present invention is arranged in such a manner that at least one microwave applicator means is disposed on either one or two end surfaces of the columnar film-forming chamber formed in such a manner that its side wall is constituted by the elongated member.

The microwave applicator means is disposed vertically to the end surface.

The apparatus according to the present invention is arranged in such a manner that a microwave introduction opening, which is made of a dielectric material and capable of hermetically separating the film-forming chamber and the microwave applicator means from each other and through which microwave energy radiated from the microwave applicator can be transmitted, is disposed at the leading portion of the microwave applicator means.

The apparatus according to the present invention is arranged in such a manner that a movable sheet made of a dielectric material capable of transmitting microwave energy is disposed adjacent to the surface of the microwave introduction opening made of a dielectric material.

The apparatus according to the present invention is arranged in such a manner that either side of the elongated member is subjected to an electroconductive treatment.

The apparatus according to the present invention is arranged in such a manner that microwave energy is transmitted to the microwave applicator means via a rectangular and/or oval waveguide tube.

In a case where the microwave applicator means are disposed to confront each other at the two end surfaces of the film-forming chamber, they are disposed in such a manner that planes including the longer side of the rectangular and/or oval waveguide tube, planes including the longer axis and a plane including the longer side and a plane including the longer axis do not run parallel to each other.

An arrangement is made in such a manner that a perpendicular angle is not made by a plane including the longer side of the rectangular and/or oval waveguide tube and/or a plane including the longer axis of the same and a plane including the central axis of a pair of the supporting/conveying rollers.

EXPERIMENTS

Experiments carried out to examine the conditions for generating microplasma which enables a functional deposited film to be uniformly formed on an elongated member will now be described.

Experiment 1

In this experiment, studies were made of the stability of microwave plasma and leakage of microwave out of the film-forming chamber due to a difference in the setting angle of a pair of waveguides 111 and 112 using the MW-PCVD apparatus of Apparatus Embodiment 2 which will be later described and in accordance with the procedure of Production Example 1 which will be later described.

Figure 6:
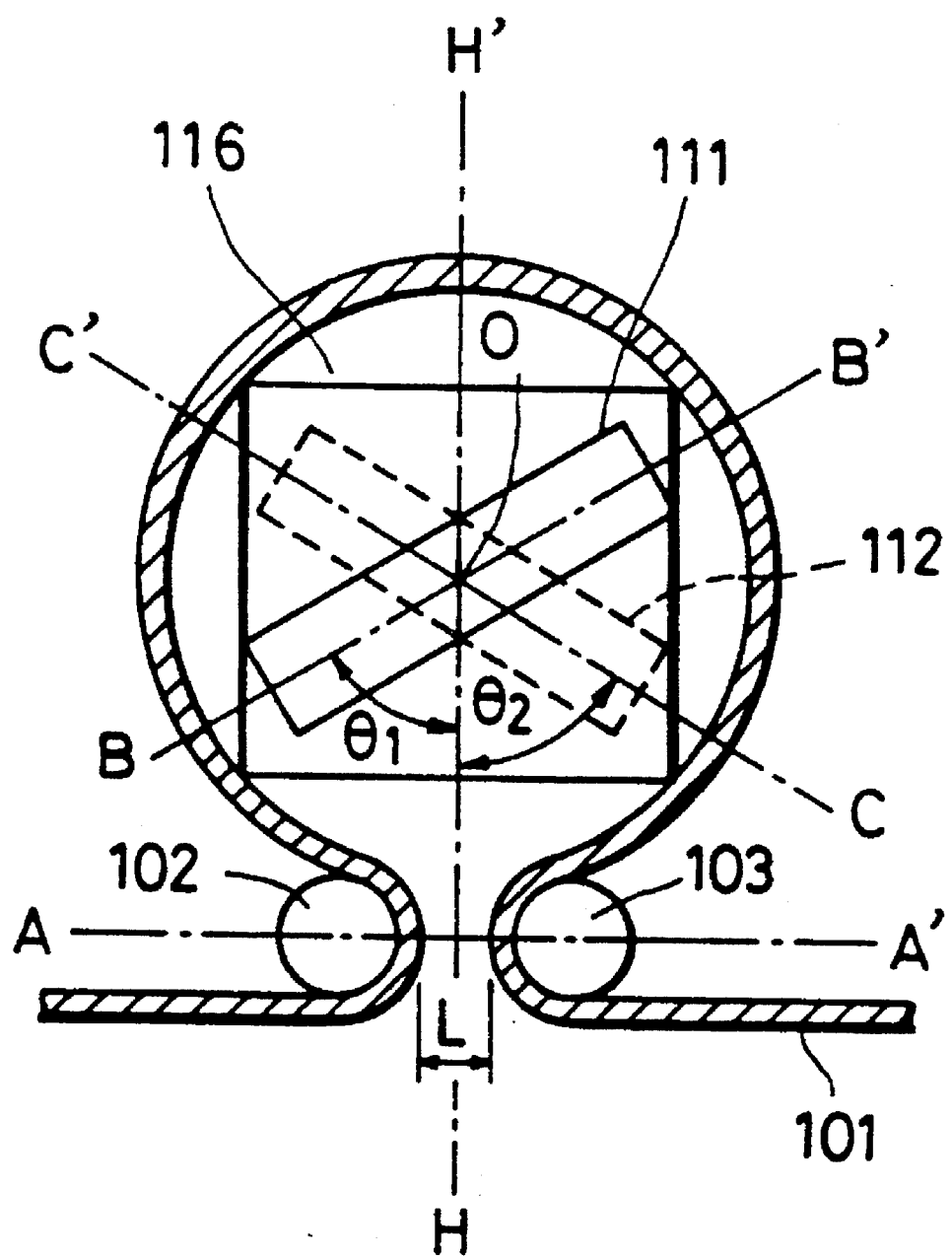
FIG. 6 is a cross sectional schematic view which illustrates the angle of installing a rectangular waveguide pipe according to the present invention.

FIG. 6 is a schematic view which illustrates the angle at which a pair of rectangular waveguides 111 and 112 are set.

In FIG. 6, each of the rectangular waveguide 111 shown by a true line and the other rectangular waveguide 112 shown by a dotted line is connected to the corresponding microwave applicator (not shown) provided to the side face of a film-forming chamber 116. For instance, the rectangular waveguide 111 is situated in the front and the rectangular waveguide 112 is situated in the back. Mark "0" stands for the center of the curved shape and line A—A' stands for a face containing a central axis between a pair of supporting/conveying rollers 102 and 103. Line H—H' stands for a face which is perpendicular to the face A'—A'. The angle made by a face B—B' in parallel to the face containing a major edge of the rectangular waveguide 111 and the face H—H' is made to be $\theta_1$. This angle $\theta_1$ is considered as the setting angle of the rectangular waveguide 111. The angle which is made by face C—C' in parallel to the face containing a major edge of the rectangular waveguide 112 and the face H—H' is made to be $\theta_2$. This angle $\theta_2$ is considered as the setting angle of the rectangular waveguide 112. In the case where each of the angles $\theta_1$ and $\theta_2$ goes beyond 180°, the rectangular waveguides 111 and 112 become symmetrical to the face H—H' as is the case where each of the angles is less than 180°. Therefore, their arrangement relationship is the same as in the case of less than 180°. Likewise, when the angles $\theta_1$ and $\theta_2$ are transported, their arrangement relationship is not changed because they are so positioned as to confront each other.

The distance between the end portions of curved portions of the elongated member defined by the two supporting/conveying rollers 102 and 103 is made to be distance L.

Discharge was performed under the microwave plasma discharge condition shown in Table 1 while varying the angles $\theta_1$ and $\theta_2$ as shown in Table 2 to examine the stability of microwave plasma.

The examination of the microwave leakage was conducted by a microwave detector placed at a position being about 5 cm distant from the foregoing space between the two supporting/conveying rollers 102 and 103.

The evaluated results obtained were as shown in Table 2.

TABLE 1

| raw material gas and its flow rate | SiH4: 385 sccm |
| --- | --- |
| | H2 : 80 sccm |
| microwave frequency and microwave power | 2.45GHz |
| | 760W × 2 |
| spacing L | 3.3. cm |
| inner diameter and width of curved portion | φ20 cm, 45 cm |
| internal pressure of the film-forming chamber | 6 mtorr |
| the kind and the thickness of elongated member | SUS430BA, 0.25 mm |
| the size of microwave applicator (inner diameter × length) | φ98 mm × 150 mm |
| microwave propagating waveguide | EIAJ, WRI-26 |
| conveyance speed of dielectric sheet | 5 mm/min |

TABLE 2

| $\theta_1$ ( ) | $\theta_2$ ( ) | $\theta_1 + \theta_2$ ( ) | evaluated results |
| --- | --- | --- | --- |
| 0 | 0 | 0 | microwave leakage is large, discharge is unstable and noise of the power source is large (abnormal oscillation) |
| 0 | 45 | 45 | microwave leakage is large, discharge is unstable |
| 0 | 90 | 90 | " |
| 15 | 15 | 30 | microwave leakage is medium, discharge is unstable |
| 15 | 45 | 60 | microwave leakage is small, discharge is unstable |
| 15 | 75 | 90 | " |
| 15 | 135 | 150 | " |
| 15 | 165 | 180 | microwave leakage is medium, discharge is unstable and noise of the power is large (abnormal oscillation) |
| 30 | 30 | 60 | no leakage of microwave, discharge is stable |
| 30 | 60 | 90 | " |
| 30 | 105 | 135 | " |
| 30 | 150 | 180 | no leakage of microwave, discharge is unstable and noise of the power source is large (abnormal oscillation) |
| 45 | 45 | 90 | no leakage of microwave, discharge is stable |
| 45 | 90 | 135 | " |
| 45 | 105 | 150 | " |
| 45 | 135 | 180 | no leakage of microwave, discharge is unstable and noise of the power source is large (abnormal oscillation) |
| 60 | 60 | 120 | no leakage of microwave discharge is stable |
| 60 | 75 | 135 | " |
| 60 | 90 | 150 | " |
| 60 | 120 | 180 | no leakage of microwave, discharge is unstable and noise of the power source is large (abnormal oscillation) |
| 75 | 75 | 150 | no leakage of microwave, discharge is stable |
| 75 | 90 | 165 | no leakage of microwave, discharge is fairly unstable |
| 75 | 105 | 180 | no leakage of microwave discharge is unstable and noise of the power source is large (abnormal oscillation) |
| 90 | 90 | 180 | no leakage of microwave discharge is unstable and noise of the power source is large (abnormal oscillation) |

From the results shown in Table 2, the following findings were obtained:

The stability of microwave plasma and the microwave leakage out of the film-forming chamber will be changed depending to a great extent upon the angle of the microwave applicator to be set to the rectangular waveguide. More particularly, in the case where the angle $\theta_1$ and/or $\theta_2$ is 0°, the amount of microwave leaked is the largest and the state of discharge is undesirably unstable. In the case where the angle is about 15°, although the amount of microwave leaked is relatively small, the state of discharge is still undesirably unstable. In the case where the angle is more than 30°, microwave is not leaked and discharge is stably caused. However, when the angle which is formed by the angles $\theta_1$ and $\theta_2$ is 180° or 0°, that is, when the two faces respectively containing a major axis of the rectangular waveguides are in parallel to each other, the noise of the microwave power source becomes great due to abnormal oscillation thereby causing unstable discharge regardless of the amount of the leakage of the microwave. The discharge experiments were carried out in the case where the elongated member 101 was not moved and also in the case where the same was moved at a speed of ½ m/min while conveying the dielectric sheet 117 (118) at a speed of 5 mm/min. No distinguishable difference with respect to the stability of discharge between the two cases was found.

The foregoing experiments were carried out by changing the kind of the film-forming raw material gas, the flow rate of the film-forming raw material gas, the microwave power to be applied, the internal diameter of the curved columnar chamber, the inner pressure of the film-forming space and the speed of conveying the dielectric sheet. However, no distinguishable difference was found with respect to the stability of discharge and the amount of microwave leaked among these cases.

Experiment 2

In this experiment, studies were made of the stability of microwave plasma to be generated and the thickness distribution of a film to be formed using the same MW-PCVD apparatus according to the Apparatus Embodiment 2 used in Experiment 1 by varying the spacing L shown in FIG. 6 between the supporting/conveying rollers 102 and 103.

As for the spacing L, it was varied as shown in Table 3. Discharge was performed for about 10 minutes under the other microwave plasma discharge condition shown in Table 1 while the angles $\theta_1$ and $\theta_2$ at which the rectangular waveguide tubes are installed were made 45°. It should be noted that the inner pressure was purposely not adjusted by the exhaust means but was caused because of the increase in conductance by enlarging the spacing L.

In any of the cases, the temperature controlling mechanisms 106a to 106e were actuated to control the surface temperature of the elongated member 101 to about 250° and the elongated member 101 was moved at a transportation speed of 35 cm/min. The conveying speed of the dielectric sheet was set to 3 cm/min.

The results of the evaluations of the discharge situation and the film thickness distribution are shown in Table 3.

The evaluation of the discharge state was visually conducted. The evaluation of the film thickness distribution was conducted by measuring the film thickness at selected 10 positions in the widthwise direction and also at plural positions, with a 20 cm interval in the longitudinal direction by a film thickness gauge.

wave, the amount of microwave leaked through the spacing is desirably small. It was also found that the film thickness distribution in the longitudinal direction on the elongated member is maintained in a desirable state as long as the elongated member is continuously moved.

Among the deposited film specimens obtained in this experiment which provided good evaluation results as shown in Table 3, the specimen No. 4 provided the most satisfactory results for all the evaluation items and the deposition rate thereof was about 100 Å/sec. In addition, the gas utilization efficiency calculated from the amount of the film deposited on the elongated member versus the total amount of the film-forming raw material gases fed into the film-forming chamber was 55%.

It was further found that among the discharge conditions, changes in the microwave power, inside diameter of the columnar structure, etc. cause slight changes in the film thickness distribution and the stability of discharge but do not lead to solving the substantive problems caused by the extent of the spacing L.

Experiment 3

In this experiment, studies were made of the stability of microwave plasma to be generated and the thickness distribution of a film to be formed upon varying the inside

TABLE 3

| specimen No. | spacing L (cm) | inner pressure of film-forming chamber (mTorr) | discharge state | distribution of film thickness(in the width direction) (%) | distribution of film thickness(in the longitudinal direction) (%) |
| --- | --- | --- | --- | --- | --- |
| 1 | 0.4 | 75 | discharge was centralized in the vicinity of the microwave applicator | 1000 ✗ | 100 ✗ |
| 2 | 0.8 | 28 | discharge was localized in the vicinity of the microwave applicator | 25 | 12 |
| 3 | 1.5 | 12 | discharge is stable | 8 | 7 |
| 4 | 3.5 | 6 | " | 5 | 5 |
| 5 | 5.0 | 4 | " | 7 | 5 |
| 6 | 7.2 | 2 | discharge is unstable (microwave leakage is medium) | 30 | 7 |
| 7 | 10.0 | 1.2 | no discharge (microwave leakage is large) | — | — |

✗ no film was formed in the width direction and in the central portion of the substrate web From the results obtained in this experiment, the following facts were found: The inner pressure of the film-forming chamber can be changed by varying the spacing L without adjusting the exhaust pump to cause a significant change in the thickness distribution of the deposited film formed particularly in the width direction of the elongated member; even in the case where the rectangular waveguide is set at such angle that does not cause microwave leakage as described in Experiment 1. However, when the spacing L is made excessively large, microwave leakage is caused; and when the spacing L is adjusted to be preferably less than ½ or more preferably less than ¼ of the wavelength of microdiameter of the curved structure in the same manner as in Experiment 1 by using the apparatus according to the Apparatus Embodiment 2. The inside diameter of the film-forming chamber was varied as shown in Table 4. Discharge was conducted under the conditions shown in Table 1, wherein both the setting angle of the angle $\theta_1$ and that of $\theta_2$ were made 45°. In each case, discharge was carried out for 10 minutes while maintaining the surface temperature of the elongated member at 250° similarly to Experiment 2 and while moving the elongated member at a transportation speed of 35 cm/min.

The evaluated results obtained were as shown in Table 4.

TABLE 4

| specimen No. | inside diameter of curbed portion (cm) | discharge state | distribution of film thickness(in the width direction) (%) | distribution of film thickness(in the longitudinal direction) (%) |
| --- | --- | --- | --- | --- |
| 8 | 5.5 | no discharge | — | — |
| 9 | 7 | discharge is unstable | 20 | 12 |

TABLE 4-continued

| specimen No. | inside diameter of curbed portion (cm) | discharge state | distribution of film thickness(in the width direction) (%) | distribution of film thickness(in the longitudinal direction) (%) |
|---|---|---|---|---|
| 10 | 10 | discharge is stable | 10 | 7 |
| 11 | 20 | " | 5 | 5 |
| 12 | 25 | " | 5 | 5 |
| 13 | 35 | discharge is fairly unstable | 12 | 7 |
| 14 | 45 | discharge is unstable | 25 | 12 |

The evaluation of the discharge state was visually conducted. The evaluation of the film thickness distribution was conducted by measuring the film thickness at selected 10 positions in the width direction and at plural positions with a 20 cm interval in the longitudinal direction by a pointer-step type film thickness gauge.

From the results obtained in this experiment, the following facts were found: When the inside diameter of the curved structure is changed while maintaining other discharge conditions unchanged upon film formation, the discharge state is accordingly changed to cause a significant change in the thickness distribution of the deposited film in the width direction of the elongated member; and the thickness distribution in the longitudinal direction for the film is satisfactory as long as it is moved at a constant transportation speed.

Furthermore, changes in the discharge parameters such as microwave power, pressure of the film-forming space, among others, influence the thickness distribution of a film formed and also the stability of discharge.

Experiment 4

In this experiment, studies were made mainly of the stability of microwave plasma to be generated upon varying the flow rate of a film-forming raw material gas to be fed and the power of a microwave energy to be applied into the film-forming space while maintaining the pressure of the film-forming space constant at a predetermined value in the same manner as in Experiment 1 by using the apparatus according to Apparatus Embodiment 2. The pressure of the film-forming space and the flow rate of the film-forming raw material gas were varied as shown in Table 5. Discharge was carried out under the conditions shown in Table 1, wherein both the setting angle of the angle $\theta_1$ and that of the angle $\theta_1$ were made 60°.

The evaluated results obtained were as shown in Table 5. In Table 5, the mark "⊙" shows the case where the discharge was stably maintained; the mark "o" shows the case where minute unevenness were caused in the discharge but the discharge was maintained in a desirable acceptable state; and the mark "Δ" shows the case where distinguishable unevenness were caused in the discharge but the discharge was maintained in a practical acceptable state. From the results obtained, the following facts were found: When the power of a microwave energy to be applied into the film-forming space is reduced, the pressure of the film-forming space is reduced; or as the flow rate of $H_2$ gas as one of the film-forming raw material gas is increased, discharge becomes unstable or sometimes discharge is not caused. On the other hand, when the power of the microwave energy is raised, the pressure is raised, or the flow rate of SiH4 gas as the film-forming raw material gas is raised, desirable discharge is stably caused. Further, the discharge experiments were carried out in the case where the elongated member 101 was not moved and also in the case where the same was moved at a transportation speed of 1.2 m/min. As a result, there was not a distinguishable difference between the two cases.

TABLE 5

| inner pressure of the film-forming chamber(mTorr) | raw material gas and its flow rate (sccm) | microwave power (kW) | discharge state |
|---|---|---|---|
| 1.5 | $SiH_4$ : 100 | 3.0 × 2 | o |
| 1.5 | $SiH_4$ : 100 $H_2$ : 100 | 3.0 × 2 | Δ |
| 3 | $SiH_4$ : 100 $H_2$ : 50 | 2.5 × 2 | o |
| 3 | $SiH_4$ : 100 $H_2$ : 100 | 2.5 × 2 | Δ |
| 5 | $SiH_4$ : 10 $H_2$ : 200 | 1.2 × 2 | o |
| 5 | $SiH_4$ : 300 $H_2$ : 100 | 0.8 × 2 | ⊙ |
| 5 | $SiH_4$ : 300 $H_2$ : 400 | 0.7 × 2 | o |
| 5 | $SiH_4$ : 400 | 0.4 × 2 | ⊙ |
| 10 | $SiH_4$ : 10 $H_2$ : 300 | 1.0 × 2 | o |
| 10 | $SiH_4$ : 300 $H_2$ : 600 | 1.0 × 2 | ⊙ |
| 10 | $SiH_4$ : 400 | 0.3 × 2 | ⊙ |
| 10 | $SiH_4$ : 10 $H_2$ : 800 | 1.0 × 2 | Δ |
| 30 | $SiH_4$ : 10 | 0.25 × 2 | ⊙ |
| 30 | $SiH_4$ : 10 $H_2$ : 300 | 0.7 × 2 | o |
| 30 | $SiH_4$ : 300 $H_2$ : 300 | 0.6 × 2 | ⊙ |
| 30 | $SiH_4$ : 300 $H_2$ : 900 | 0.8 × 2 | o |

Experiment 5

In this experiment, studies were made of the stability of microwave plasma to be generated and the thickness distribution of a film to be formed upon varying the width of the elongated member in the same manner as in Experiment 1.

The width of the elongated member was varied as shown in Table 6 for each discharge carried out for 10 minutes. The other conditions for discharging the microwave plasma were made to be the same as those shown in Table 1. As the rectangular waveguide, a rectangular waveguide of EIAJ, WRI-32 was used. Both the setting angle of the angle $\theta_1$ and that of the angle $\theta_2$ were made 60°. In each case, the surface temperature of the elongated member was controlled to 250° C. similarly to Experiment 2 while moving the elongated member at a transportation speed of 50 cm/min.

In the case of preparing each of Specimen Nos. 15 to 17, a single applicator was used. Likewise, in the case of preparing each of Specimen Nos. 18 to 21, a pair applicators were used.

The evaluated results obtained with respect to the state of discharge and the film thickness distribution were as shown in Table 6. The evaluation was made by the same method as that according to Experiment 2.

TABLE 6

| specimen No. | width of the substrate web (cm) | discharge state | distribution of film thickness (in the width direction) (%) | distribution of film thickness (in the longitudinal direction) (%) |
| --- | --- | --- | --- | --- |
| 15 | 5 | discharge is stable | 3 | 5 |
| 16 | 10 | " | 5 | 7 |
| 17 | 25 | discharge is fairly unstable | 8 | 7 |
| 18 | 35 | discharge is stable | 5 | 5 |
| 19 | 45 | " | 5 | 5 |
| 20 | 60 | discharge is fairly unstable | 10 | 7 |
| 21 | 70 | discharge is unstable | 15 | 10 |

From the results obtained in this experiment, the following facts were found: Changes are caused in the stability of microwave plasma to be generated and the thickness distribution of a film to be formed on the elongated member when the width of the elongated member is varied; when a microwave energy is applied into the film-forming space only from one side of the film-forming chamber, the microwave plasma as generated becomes unstable and the film thickness distribution becomes undesirable; and when a pair of two microwave applicators is disposed so as to confront each other, those problems caused in the foregoing case can be eliminated.

As a result of further studies, it was found that certain influences effect the stability of microwave plasma to be generated as well as the film thickness distribution depending upon changes in some discharge parameters such as the kind of film-forming raw material gas to be fed, the flow rate thereof, the power of a microwave energy to be applied, the pressure of the film-forming space, etc.

Experiment 6

In this experiment, the apparatus according to Apparatus Embodiment 2 was used similarly to Experiment 1 so that the stability of the microwave plasma was evaluated depending upon the material constituting the dielectric sheet and whether or not the dielectric sheet was used by respectively performing discharges 9 times.

The materials used and whether the dielectric sheet was provided were varied in a range shown in Table 7-1 and the discharge was performed for 8 hours.

TABLE 7-1

| Material of dielectric sheet | State of maintaining Microwave plasma (2.5 – 5 – 7.5 – 10) | State of Discharge |
|---|---|---|
| Ceramic Paper | ~10 | Stability maintained |
| Teflon | ~10 | Stability maintained |
| Polyimide | ~8 | Stable discharge |
| Neoprene | ~7 | Unsatisfactory stability of discharge |
| No dielectric sheet | ~5 | Frequent discharge stop |

The remaining conditions for discharging the microwave plasma were made to be the same as those shown in Table 1 and the transportation speed of the dielectric sheet was properly determined to adapt to the material used in the dielectric sheet. The installation angles $\theta_1$ and $\theta_2$ of the rectangular waveguides were set to be 45°. The temperature control mechanisms 106a to 106e were operated so as to make the surface temperature of the elongated member 101 to be 250° C. while making the transportation speed of the elongated member to be 35 cm/min.

The results of the discharge state are shown in Table 7-1.

The discharge state was visually evaluated.

From the results thus obtained, it was found that it is preferable that the dielectric sheet be made of a material having a small dielectric constant and a small product of the dielectric loss angle. Furthermore, it was found that the discharge can be stably maintained for a long time in a case where the dielectric sheet is used in comparison to a case where the same is not used.

Experiment 7

In this experiment, the apparatus according to Apparatus Embodiment 2 was used similar to Experiment 1 so as to examine the influence of the transportation speed of the dielectric sheet upon the stability of the microwave plasma and the film thickness distribution.

The transportation speed was varied in the range shown in Table 7-2 in each of about 8-hours discharge.

TABLE 7-2

| Conveyance speed of dielectric sheet (cm/min) | State of discharge | Film thickness distribution lateral direction (%) | Film thickness distribution longitudinal direction (%) |
|---|---|---|---|
| 0.1 | discharge flickers (large) | 25 | 16 |
| 0.3 | discharge flickers (small) | 23 | 13 |
| 0.36 | stable discharge | 5 | 4 |
| 1 | stable discharge | 4 | 4 |
| 10 | stable discharge | 4 | 4 |

The remaining conditions for discharging the microwave plasma were made to be the same as those shown in Table 1 while making the angles $\theta_1$ and $\theta_2$ of installing the rectangular waveguide pipes to be 45°. The temperature control mechanisms 106a to 106e were operated so as to make the surface temperature of the elongated member 101 to be 250° C. while making the transportation speed of the elongated member to be 35 cm/min.

The results of the discharge state are shown in Table 7-2.

The evaluation of the discharge state was visually conducted. The evaluation of the film thickness distribution was conducted by measuring the film thickness at 10 selected positions in the width direction and at plural positions with a 20 cm interval in the longitudinal direction by a pointer-step type film thickness gauge.

From the results thus obtained, it can be seen that the change in the transportation speed of the dielectric sheet caused the stability of the microwave plasma and the film thickness distribution to be changed. As for the thickness of the deposited film on the dielectric sheet, the film thickness distribution or the like was improved by adjusting the transportation speed to one which makes the thickness of the deposited film to be 25 µm or less.

SUMMARY OF RESULTS OF EXPERIMENTS

In the method and the apparatus according to the present invention, it is difficult to establish the optimum condition which enables to stably maintain uniformity of microwave plasma on the basis of a single parameter since the stability and uniformity of microwave plasma will be maintained in the complicatedly co-related organic situation of a plurality of parameters such as the shape of a microwave applicator, the kind of a waveguide which is connected to the applicator, arrangement of the waveguide, the gas pressure of the film-forming space upon film formation, the microwave power, the degree of microwave plasma to be confined, the transportation speed of the dielectric sheet, the shape and volume of the discharge space, etc. The following tendencies and conditions were found from the above-described experiments:

As for the pressure of the film-forming chamber, it is preferable that it be made to be 1.5 m Torr to 100 m Torr, more preferably, 3 m Torr to 50 m Torr. As for the microwave power, it is preferable that it be made to be 250×2 W to 300×2 W, more preferably, 300×2 W to 1000×2 W. As for the inner diameter of the curved structure, it is preferable that it be made to be 7 cm to 45 cm, more preferably 8 cm to 35 cm. As for the speed of transporting the dielectric sheet, it is preferable that it be made to be determined to make the thickness of the film deposited on the dielectric sheet to be 25 µm. As for the width of the elongated member, it is preferable that it be made to be about 60 cm, more preferably, about 50 cm in a case where a pair of microwave applicators confronting each other is used in order to obtain the widthwise uniformity.

It was also found that the quantity of the leakage of the microwave from the microwave plasma region deteriorates the stability of the microwave plasma. Therefore, it is preferable that the spacing L between the curved portion of the elongated member be made to be ½ or less of the wavelength of the microwave, preferably ¼ or less of the same.

The method according to the present invention will be further described based on the facts found from the above-described experiments.

In the method of the present invention, the major portion of the columnar film-forming space formed by curving the moving elongated member by curving initial portion forming means and curving completion end forming means is composed of the above-described moving elongated member while leaving a spacing between the curving initial portion forming means and the curving completion end forming means in the longitudinal direction of the elongated member as previously described.

In order to uniformly generate and confine microwave plasma in the columnar film-forming chamber, microwave energy is radiated into the chamber in the direction parallel to the side wall formed by the elongated member through the one side or the two sides of the film-forming space such that the microwave energy is confined in the chamber.

In the case where the width of the substrate is relatively narrow, microwave plasma generated in the film-forming chamber may be maintained in a uniform state even in the case of radiating a microwave energy into the chamber solely through the one side thereof. However, in the case where the width of the substrate exceeds, for example, one wavelength of microwave, it is desired to radiate a microwave energy into the film-forming chamber through both the two sides thereof for maintaining the uniformity of microwave plasma.

It is a matter of course that in order to maintain microwave plasma generated in the film-forming chamber in a uniform state, it is necessary for the microwave energy as introduced to be sufficiently propagated in the film-forming chamber. In this respect, the columnar film-forming space is desired to have a so-called waveguide-like structure. For this purpose, the elongated member is preferred to be a member made of an electroconductive material. In any case, it is necessary for at least either side to be subject to an electroconductive process.

The shape of each of the two sides of the columnar portion to be the film-forming space which is formed by curving the moving elongated member by the curving initial portion forming means and the curving completion end forming means is preferred to be formed such that the microwave energy radiated into the film-forming space can be transmitted substantially uniformly. Therefore, it may be formed into a shape such as a circle, oval, rectangle or a polygon. In any case, the shape of each of the two sides of the columnar portion is relatively gentle forms which are symmetrical with each other. The form of the foregoing spacing L provided between the curving initial portion forming means and the curving completion end forming means left in the lengthwise direction of the elongated member sometimes cannot be formed into the continuous shape.

In order to effectively propagate a microwave energy as applied to thereby stably and repeatedly generate microwave plasma and to maintain and control the microwave plasma in a desirable state in the film-forming space, it is desired that the transmission mode of microwave in the microwave applicator means is of a single mode. Specifically, examples of such single mode are $TE_{10}$ mode, $TE_{11}$ mode, $eH_1$ mode, $TM_{11}$ mode, $TM_{01}$ mode, etc. Of these modes, $TE_{10}$ mode, $TE_{11}$ mode and $eH_1$ mode are most desirable. However, it is possible to use two or more of these modes in combination. A microwave energy is transmitted through a waveguide capable of transmitting the microwave energy with the above mode into the microwave applicator means. Then, the microwave energy thus transmitted into the microwave applicator means is radiated through a microwave introduction opening hermetically provided at the top portion of the microwave applicator means.

According to the method of the present invention, a spacing is formed in the film-forming space at a position between the curving initial portion forming means and the curving completion end forming means so that the raw-material gas is exhausted through the above-described spacing for the purpose of maintaining a desired low pressure state in the film-forming space.

The size of the spacing is necessarily designed such that a sufficient exhaust conductance is always provided and the microwave energy radiated does not leak out of the film-forming space.

In more detail in this connection, the microwave applicator means is provided in such a manner that the direction of an electric field of the microwave transmitting in the microwave applicator means and the face containing the central axis of the supporting/conveying roller serving as the curving initial portion forming means and the central axis of the supporting/conveying roller serving as the curving completion end forming means do not run parallel to each other.

This situation is also the same in the case where a plurality of microwave applicator means are provided so as to radiate the microwave energy into the film-forming space.

The maximum open width of the spacing in the lengthwise direction of the elongated member left between the curving initial end forming means and the curving completion end forming means is desired to be preferably less than a length corresponding to ½ of the wavelength of microwave, more preferably less than a length corresponding to ¼ of the microwave wavelength.

In the case where a plurality of microwave applicator means are disposed to confront each other, a special arrangement must be made to prevent the microwave energy radiated by one microwave applicator means being received by the other microwave applicator means and arriving at the microwave power source of the latter applicator to damage the power source, or cause such negative influence as causing abnormality on microwave oscillation. Particularly, a plurality of the microwave applicator means are necessarily arranged such that the electric field directions of microwaves transmitting in the microwave applicator means are not in parallel with each other.

In the case where the microwave energy is radiated from either side surface of the two side surfaces of the film-forming space, it is necessary to be so structured that microwave energy does not leak through the other side surface. For this purpose, the remaining side surface is hermetically sealed with an electroconductive member, or it is covered with a metal mesh member or a punching metal having a plurality of perforations respectively with a size being preferably less than ½ or more preferably less than ¼ of the microwave wavelength.

There is a tendency for the microwave energy radiated into the film-forming space that although depending upon the kind of a film-forming raw material gas as supplied, the microwave energy will be attenuated in the interrelation with the gas pressure in the film-forming space as the distance from the microwave introduction opening increases. Furthermore, it is considerably affected by the transportation speed of the dielectric sheet positioned substantially in contact with the microwave introduction opening such that it is considerably attenuated as the thickness of the deposited film on the dielectric sheet increases. Therefore, in the case of using an elongated member having a relatively large width, in order to generate uniform microwave plasma in the width direction, it is desired to maintain the inner pressure at a sufficiently low value and to radiate a microwave energy into the film-forming space through the two sides thereof using at least two microwave applicator means oppositely arranged and maintaining the transportation speed of the dielectric sheet at sufficient high speed.

In any case, the microwave applicator means is desired to be vertically disposed with respect to the side surface of the film-forming space such that a microwave energy radiated into the film-forming space by the applicator means propagates in the direction substantially parallel to the side wall of the film-forming space formed by the elongated member. It is desired that the microwave applicator be arranged at the position of the side face of the film-forming chamber which is equally distant from the above-described side wall thereof. However, there is not any particular limitation for the position of the microwave applicator means in the case where the shapes of the curved portions of side wall are asymmetrical. And when a plurality of microwave applicator means are oppositely arranged, it is not always necessary that their central axes are on the same line.

According to the present invention, the curved shape formed by the elongated member is desired to always be maintained constant without causing crease, slack, side slippage, etc. by the curving initial end forming means and the curving completion end forming means, so that the stability and uniformity of microwave plasma as generated can be maintained constant as desired. It is possible to use supporting means in order to secure the curved shape in addition to the curving initial end forming means and the curving completion end forming means. In more detail in this respect, it is possible to continuously maintain a desired curved shape by supporting means provided on the inside or the outside of the above-described curved elongated member.

In the case where such supporting means is provided on the inside of the curved elongated member, it is necessary to make the portion of the supporting means to be contacted with the face on which the deposited film is to be formed small as possible. For instance, such supporting means is desired to be disposed at the two end portion of the elongated member.

As the elongated member, it is desired to use such a material that has a sufficient flexibility capable of continuously forming the above-described curved shape and forming a smooth shape at the intermediate curved portion between the curving initial end portion and the curving completion end portion.

The deposited film-forming raw material gas introduced into the film-forming space by the gas supply means is efficiently exhausted by the exhausted means to maintain the film-forming space at a desired pressure at which the microwave plasma can be uniformly generated.

In the MW-PCVD method according to the present invention, there is an optimum condition for each of the film-forming parameters in order to stably produce and maintain microwave plasma having a desirable uniformity in the columnar film-forming space. However, it is difficult to generalize those film-forming parameters since the film-forming parameters such as the shape and the volume of the film-forming space, the type and the quantity of the raw material gas to be introduced into the film-forming space, the pressure in the film-forming space, the transportation speed of the dielectric sheet, the quantity of the microwave energy to be radiated into the film-forming space and matching of microwave, etc. are complicatedly interrelated in terms of organic relation. Therefore, it is preferable that the suitable parameters are set.

That is, according to the present invention, the film-forming space, the side wall of which is made of the elongated member, is formed, and as well as the elongated member constituting the side wall of the film-forming space is continuously moved. In addition, the microwave applicator means and the dielectric sheet conveying speed means are disposed such that the microwave energy is substantially uniformly radiated to the widthwise direction of the elongated member constituting the side wall of the film-forming space. Thus, the conditions for generating and maintaining the microwave plasma are adjusted most suitably so that the large area functional deposited film can be continuously uniformly formed.

The feature by which the method according to the present invention is apparently distinguished from the conventional deposited film-forming method is that the film-forming space is formed into the columnar shape and the side wall of the columnar shape has a function of a structural member while being moved continuously. Furthermore, it also serves as a substrate or a supporting member for forming the deposited film. In addition, the movable dielectric sheet positioned in contact with the surface of the microwave introduction opening is continuously moved so that the quantity of the deposited film on the microwave energy introduction portion can be reduced. Therefore, the microwave plasma can be generated and maintained more stably.

The function of the side wall as the structural member is to physically and chemically isolate the atmospheric space for forming the film. That is, separating the film-forming space and the atmospheric space which does not relate to the film formation from each other. Specifically, it is a function for forming spaces including different gas compositions or status, controlling the gas flowing direction and forming spaces having different pressures.

That is, the present invention is arranged in such a manner that the side wall of the columnar film-forming space is formed by curving the elongated member and the deposited film-forming raw material gas and the microwave energy are supplied/exhausted to the film-forming space through any of the two end surfaces or the spacing formed in a portion of the above-described side wall. As a result, the microwave plasma is confined in the film-forming space so that the functional deposited film is formed on the elongated member which constitutes the above-described side wall. The above-described elongated member serves as an essential structural member for insulating the film-forming space from the outer atmospheric space which is not concerned with the film formation. Furthermore, it can be used as the substrate or the supporting member for forming the deposited film.

Therefore, the outer atmosphere of the film-forming space formed in such a manner that the elongated member is used as the side wall can be significantly different in terms of composition, status and the pressure of the gas from the above-described film-forming space.

To the contrary, the conventional deposited film-forming method is arranged in such a manner that the substrate and the supporting member for forming the deposited film is disposed in the film-forming space for forming the deposited film. Therefore, it serves as an exclusive member for making the precursor or the like for forming the deposited film to be generated in the film-forming space to be deposited. Therefore, it is completely different from the present invention in which it serves as the structural member for constituting the above-described film-forming space.

In contrast, the method according to the present invention is arranged in such a manner that the elongated member capable of serving as a substrate or a supporting member for forming the functional deposited film is used as the side wall of the film-forming space thereby exhibiting the function as the structural member and as well as the capability of having the functional deposited film continuously formed on the elongated member.

According to the method of the present invention, the side wall of the columnar space is formed by using the elongated member and the microwave energy is substantially uniformly radiated in the widthwise direction of the elongated member into the columnar space so that the microwave is confined in the columnar space. Furthermore, the dielectric sheet is properly conveyed so that the consumption of the microwave energy in the microwave introduction portion is reduced. Therefore, the microwave energy can be efficiently consumed in the columnar space so that uniform microwave plasma is generated as well as improving the uniformity of the formed deposited-film. Furthermore, by continuously moving the elongated member constituting the side wall which is exposed to the microwave plasma it is moved so as to be exhausted outside of the film-forming space. As a result, the deposited film reveals excellent uniformity as it is formed on the elongated member in its moving direction.

According to the method of the present invention, the film-forming space is formed by the elongated member and the gas composition and the status of the gas in the portion outside the film-forming space are set to be different from those in the film-forming space so as to form the deposited film in only the film-forming space. For example, the composition of the gas positioned outside the film-forming space may be set to be a gas atmosphere which is not directly concerned with the formation of the deposited film. It may be made to be an atmosphere which contains the raw material gas to be exhausted from the film-forming space. In order to improve the stability and the reproducibility of the plasma and to prevent the film deposition in the undesired portions, the microwave plasma must, of course, be confined in the film-forming space and the leakage of the microwave plasma into the outside portion of the film-forming space must be prevented. Specifically, it is effective to make the pressure different between the inside portion and the outside portion of the film-forming space, to form an atmosphere of a gas having a small electric dissociation such as an inactive gas or $H_2$ gas and to provide means to prevent the leakage of the microwave from the film-forming space. As the means for preventing the microwave leakage, the spacing portion between the inside and the outside portions of the film-forming space is hermetically sealed with an electroconductive member, or it is covered with a metal mesh member or a punching metal having a plurality of perforations respectively with a size corresponding to ¼ of the microwave wavelength. It is also preferable that the maximum distance of the spacing formed between the inside portion and the outside portion of the film-forming space be ½ or less of the microwave wavelength, more preferably, ¼ or less of the same. Furthermore, by setting the pressure in the portion outside the film-forming space to be at a considerably low level or high level in comparison to the pressure in the film-forming space, the conditions can be set such that the microwave plasma cannot be generated in the portion outside the film-forming space.

As described above, the present invention is characterized in that the elongated member has the function as the structural member which constitutes the film-forming space and the formation of the deposited film in the microwave energy introduction portion is prevented. As a result, the generation and the maintenance of the microwave plasma are stable. Therefore, an additional desirable effect can be obtained in comparison to the conventional method of forming a deposited film.

The structure and the characteristics of the microwave PCVD apparatus according to the present invention will now be sequentially described.

In the apparatus according to the present invention, the microwave plasma is confined by the elongated member which is moving in the microwave plasma region. Therefore, the precursor which contributes to the formation of the deposited film generated in the microwave plasma region can be caught on the substrate at a high yield. Furthermore, the deposited film can be continuously formed on the elongated member. Therefore, the utilization efficiency of the deposited film-forming raw material gas can be significantly improved.

Furthermore, the microwave plasma can be uniformly formed in the film-forming space by using the microwave applicator means and the dielectric sheet conveying means. Therefore, the deposited film formed in the widthwise direction of the elongated member reveals excellent uniformity. In addition, the deposited film formed in the lengthwise direction of the elongated member reveals excellent uniformity because the elongated member is substantially vertically conveyed with respect to the lengthwise direction of the microwave applicator means.

Furthermore, according to the apparatus of the present invention, discharge can be maintained continuously, stably and uniformly. Therefore, the functional deposited film revealing stable characteristics can be continuously formed on the elongated member. Therefore, a laminated device revealing excellent interfacial characteristics can be manufactured.

In the apparatus according to the present invention, the elongated member serving as the structural member may be arranged in such a manner that atmospheric air may be present in the outside portion of the film-forming chamber. However, in a case where the introduction of atmospheric air into the film-forming chamber deteriorates the characteristics of the functional deposited film, a proper air introduction checking means may be provided. Specifically, a mechanical sealing structure comprising an "O" ring, a gasket, a helicoflex, magnetic fluid or the like may be employed. As an alternative to this, an insulating container for forming a dilution gas atmosphere which does not affect the characteristics of the formed deposited film or a proper vacuum atmosphere may be disposed in a circumferential portion. In a case where the mechanical sealing structure is employed, the sealing effect can be maintained in a state where the elongated member is being continuously moved. In a case where the apparatus according to the present invention and a plurality of individual deposited film-forming means are combined with one another to continuously form the deposited film on the elongated member, it is preferable that each of the units be connected to each other by using gasket means or the like. In a case where a plurality of the apparatuses according to the present invention are connected, a structure may be arranged in which one insulating chamber is used. An alternative structure is one in which an insulating chamber is provided for each unit because the film-forming chamber of each unit has individual film-forming atmospheres.

According to the apparatus of the present invention, the pressure at the portion outside the film-forming chamber may be made to be either a reduced pressure state or a pressurized state. However, in a case where the elongated member is considerably deformed by the outer pressure difference from the portion in the film-forming chamber, a proper auxiliary structural member may be disposed in the film-forming chamber. As the auxiliary structural member, it is preferable that it be a wire, a thin plate or the like made of metal, ceramics or a reinforced resin or the like, formed into substantially the same shape as that of the side wall of the film-forming chamber. Furthermore, since the portion of the elongated member confronting the side of the auxiliary structural member which is not exposed to the microwave plasma is covered by the auxiliary structural member, the formation of the deposited film is substantially prevented. Therefore, it is preferable that the projection area of the auxiliary structural member on the elongated member be reduced.

By positioning the auxiliary structural member to be in contact with the elongated member and by rotating or moving the same in synchronization with the transportation speed of the elongated member, the mesh pattern or the like provided on the auxiliary structural member can be formed on the elongated member.

A preferable material for the elongated member according to the method and apparatus of the present invention is one that cannot be deformed and distorted and possesses a desired strength and conductivity at the temperature required at the time of forming the functional deposited film by the microwave PCVD method. Specifically, the material is exemplified by a thin plate made of metal such as stainless steel, aluminum, aluminum alloy, iron, iron alloy, composite member made of the above-described materials, and the above-described thin plate or the composite member subjected to a surface coating treatment of a metal thin film made of a different material and/or an insulating thin film such as $SiO_2$, $Si_3N_4$, $Al_2O_3$, AlN or the like by the sputtering method, the evaporation method, the coating method or the like. Additionally, the following materials may be employed: a heat-resisting resin sheet made of polyimide, polyamide, polyethylene terephthalate, epoxy or the like or a composite member of the above-described material and glass fiber, carbon fiber, boron fiber, metal fiber or the like the surface of which is subjected to a conductive treatment of a single metal, an alloy and a transparent conductive oxide (TCO) or the like prepared by the coating, evaporation, sputtering or application method.

The thickness of the elongated member must be reduced as much as possible to reduce the cost and the required accommodation space to the extent that the desired strength for maintaining the curved shape formed at the time of the conveyance operation by the conveyance means can still be obtained. Specifically, it is preferable that the thickness be 0.01 mm to 5 mm, more preferably 0.02 mm to 2 mm, most preferably 0.05 mm to 1 mm. In this state, desired strength can be relatively easily obtained by using the metal thin plate if the thickness is reduced.

The width of the elongated member must be determined such that the uniformity of the microwave plasma can be maintained in the lengthwise direction and the above-described curved shape can be maintained in a case where the microwave applicator means is used. Specifically, it is preferable that the width be 5 cm to 100 cm, more preferably 10 cm to 80 cm.

The length of the elongated member is not specifically limited, and therefore the length may be determined such that the elongated member can be taken up in the form of a roll or an elongated shape may be realized by welding or the like.

The means for supporting/conveying the elongated member while continuously curving it must be capable of maintaining the curved shape while preventing the occurrence of looseness, wrinkles, side slip or the like of the elongated member during the conveyance. For example, a structure may be employed in which at least a pair of supporting/conveying rings having a desired curved shape is provided and the two end portions of the elongated member are preferably supported by the supporting/conveying rings. The elongated member is curved along the shape of the supporting/conveying ring and it is curved into substantially columnar shape by the supporting/conveying rollers serving as the curving initial end forming means and the curving completion end forming means. A driving force is applied to either the supporting/conveying ring of the supporting/conveying roller so that the elongated member is conveyed in its longitudinal direction while maintaining the curved shape.

The elongated member may be supported and conveyed by the supporting/conveying ring by means of simple sliding friction or a gear-like structure in which a sprocket hole or the like is formed in the elongated member and sawtooth shape projections are formed on the outer surface of the supporting/conveying ring.

It is preferable that the supporting/conveying ring be formed into a circular shape to form the curved shape. However, an oval, rectangular and a polygonal shape may be employed if a predetermined shape can be continuously maintained. The critical factor is to maintain a predetermined transportation speed to convey the elongated member in order to prevent looseness, wrinkles and side slip of the curved shape. Therefore, it is preferable that a mechanism for detecting the transportation speed of the elongated member and a transportation speed adjustment mechanism arranged to receive feed back by the transportation speed detecting mechanism be provided for the supporting/conveying mechanism. The above-described mechanisms will significantly control the film thickness when a semiconductor device is manufactured.

The supporting/conveying rings are necessarily disposed in the microwave plasma region, although the degree of exposure to plasma differs depending upon their positions. Therefore, it is preferable that it is made of material capable of withstanding the microwave plasma. That is, the material exhibits excellent heat resistance and corrosion resistance. Furthermore, there is a concern that if the deposited film adheres to the surface, the adhesion film will separate and fly from the surface after a film deposition operation has proceeded for a long period of time. The result is that it adheres on the deposited film, causing a problem of a pin hole forming in the deposited film. Consequently, the characteristics of the produced semiconductor device and the manufacturing yield are deteriorated. Therefore, the material must have a small adhesion coefficient to the deposited film or must have adhesion force to a considerable film thickness even if the same adheres thereto and the surface is also designed with which the same purpose can be achieved. Specifically, it is exemplified by stainless steel, nickel, titanium, paladium, tungsten, molybdenum, niobium, their alloys and the above-described material coated with ceramic material such as alumina, quartz, magnesia, zirconia, silicon nitride, boron nitride and aluminum nitride by the spraying, evaporating, sputtering, ion plating and CVD method. Furthermore, a sole ceramic material or a composite material molded as desired may be employed. The method of forming the outer shape is selected from the mirror finish method, the roughness forming method or the like with consideration of the stress of the deposited film.

The deposited film adhered to the supporting/conveying ring must be removed prior to the occurrence of separation and flying off. It is preferable that it be removed by a chemical or a physical method such as the wet etching or the beads blast method after drying etching or decomposition has been performed in vacuum air.

Since the supporting/conveying roller has a larger area which comes in contact with the elongated member than the supporting/conveying ring, it has a large heat exchange effectiveness with the elongated member. Therefore, it is preferable that the supporting/conveying roller has a mechanism for adjusting the temperature to prevent the excessive rise or lowering of the temperature of the elongated member. Therefore, the supporting/conveying rollers consisting of one pair or more, respectively have different set temperature levels. Furthermore, it is effective for the supporting/conveying roller to include a conveyance tension detection mechanism for detecting the tension of the elongated member in order to maintain a predetermined conveyance speed.

Furthermore, the supporting/conveying roller preferably has a crown mechanism for preventing the deflection, distortion and side slip of the elongated member during its conveyance.

The curved shape formed according to the present invention is formed such that it includes a portion of the leading portion of the applicator means.

The shape of each of the two end surfaces of the columnar film-forming chamber serving as the side wall of the elongated member is preferably formed into a substantially circular shape, an oval shape, a rectangular shape or a polygonal shape. Furthermore, the microwave applicator means is preferably disposed near the central portion of the end surfaces in order to uniformly generate the microwave plasma in the film-forming chamber and thereby improve the uniformity of the deposited film to be formed. Furthermore, the inner diameter of the curved portion determines the propagation mode of the microwave and the volume of the microwave plasma region. Substantially, the thickness of the deposited film is determined correlatively with the time in which the elongated member is exposed to the microwave plasma region during its conveyance. In addition, in correlation with the width of the elongated member, the area ratio of the side wall with respect to the inner surface of the film-forming chamber is determined. Thus, the efficiency of utilizing the deposited film forming raw material gas is determined. Furthermore, the microwave power density (W/cm$^3$) for maintaining the stable microwave plasma is determined correlatively with the type, rate and the pressure of the raw material gas, the radiation of the microwave to the Microwave applicator and to the dielectric sheet, propagation performance and the absolute value of the microwave plasma region. Therefore, it cannot be defined simply.

In a case where the elongated member is used as the substrate for a solar cell, an electrode for directly outputting an electric current may be provided if the elongated member is made of an electroconductive material such as metal. In a case where an electrical insulating material such as synthetic resin is used, the following material may be used so as to previously form an electric current outputting electrode: a single metal or an alloy such as Al, Ag, Pt, Au, Ni, Ti, Mo, W, Fe, V, Cr, Cu, stainless steel, brass, nichrome, Sn, $O_2$, $In_2O_3$, ZnO and $SnO_2$—$In_2O_3$ (ITO) or a transparent conductive oxide (TCO) previously applied by coating, evaporating or sputtering.

In a case where the elongated member is made of electroconductive metal, a metal layer of a different kind may, of course, be formed on the substrate on the side on which the deposited film is formed in order to improve the reflectance of the long wavelength light on the surface of the substrate, prevent the interactive diffusion of the component element between the substrate material and the deposited film or to serve as an interference layer for preventing the short circuit. Furthermore, in a case where a solar cell has a layer structure constituted in such a manner that light incidence is made from the elongated member side because the elongated member is relatively transparent, it is preferable that the above-described conductive thin film such as the transparent conductive oxide thin film or the metal thin film be previously deposited.

The surface of the elongated member may be either an even surface or an uneven surface having minute irregularities.

In the case of the uneven surface, the minute irregularities may comprise a plurality of dimples of round, conical or pyramid forms, wherein the maximum height (Rmax) of the dimple is preferably from 500 Å to 5000 Å. As a result, light is irregularly reflected to increase the optical path length or reflected line at the surface.

The microwave introduction opening is disposed at the leading portion of the microwave applicator means to insulate the vacuum atmosphere in the film-forming chamber from open air in which the microwave applicator means is positioned, the microwave introduction opening being arranged to withstand the pressure difference present between the above-described inside portion and the outside portion. Specifically, it is preferably formed into a circle, rectangle, oval flat plate, bell jar, tablet or a cone.

The thickness of the microwave introduction opening in a direction in which the microwave propagates must be determined such that the reflection of the microwave can be prevented as much as possible with consideration of the dielectric constant of the material employed. For example, in a case where the microwave introduction opening is formed into a flat plate, it is preferable that the width be made to be substantially the same as the length corresponding to ½ of the wavelength. The material is one capable of transmitting the microwave energy radiated from the microwave applicator means into the film-forming chamber with minimum loss and also exhibits excellent airtightness to prevent air introduction into the film-forming chamber. Specifically, it is exemplified by glass made of quartz, alumina, silicon nitride, beryllia, magnesia, zirconia, boron nitride or silicon carbide or fine ceramics.

The microwave introduction opening is uniformly cooled in order to prevent the thermal damage (cracks and/or breakage) due to the microwave energy and/or plasma energy.

As the specific cooling means, there can be employed, for example, a cooling mechanism for blowing a cooling air flow to the surface of the microwave introduction opening facing the open air; or a mechanism for cooling the microwave applicator means by a cooling medium such as cooling air, water, oil or Freon so as to cool the microwave introduction opening via the portion which is positioned in contact with the microwave applicator means. Since the microwave introduction opening can be cooled sufficiently as described above, the microwave introduction opening can be protected from damage such as cracks generated by heat even if the microwave energy having relatively great power is introduced into the film-forming chamber. Therefore, high electron density plasma can be generated.

The dielectric sheet conveying means for the apparatus according to the present invention is substantially hermetically disposed in contact with the microwave introduction opening such that the deposited film to be deposited on the microwave introduction opening is deposited and conveyed to the dielectric sheet. As a result, the microwave energy to be radiated from the microwave applicator means into the film-forming chamber can be transmitted into the film-forming chamber while satisfactorily reducing the loss. Therefore, the high electron density plasma can be uniformly and stably maintained for a long period of time.

The dielectric sheet is desirably capable of preventing the absorption and reflection of the microwave considering the dielectric constant and the loss angle of the dielectric material. The material must have heat resistance which remains stable in a high temperature region. Specifically, it is exemplified by a structure constituted by glass fiber impregnated with ceramic paper or a metal oxide the main component of which is aluminum oxide or silicon oxide; a structure in which polyimide, Teflon or glass fiber is coated with the above-described polymer or polyimide is coated with Teflon or the like. The size of the dielectric sheet is not particularly limited so long as it is able to completely surround the microwave introduction opening. Therefore, the size must be determined based on the structure of the microwave introduction opening and the microwave PCVD apparatus. If the thickness of the dielectric sheet is too small, desired mechanical strength cannot be obtained, and if it is too thick, the sheet cannot easily be bent. Therefore, the preferred with range is 0.1 mm to 1.3 mm.

The dielectric sheet is preferably conveyed while being hermetically positioned in contact with the surface of the microwave introduction opening. In a case where the contact is unsatisfactory and thereby undesirable spacing is too large, the microwave energy can be absorbed by the above-described spacing. As a result, the discharge state is undesirably changed. Therefore, the allowable range of the spacing size is 0.5 mm or less. Because of the above-described reasons, the dielectric sheet conveying unit must have a satisfactory accuracy in terms of the structure thereof. Therefore, the surface of the dielectric sheet on the side positioned in contact with the microwave introduction opening is desirably grounded.

The conveyance speed of the dielectric sheet must be determined in relation to the deposition speed of the formed deposited film and the heat resisting temperature of the dielectric sheet. Thus, it is desirably that the conveyance speed be determined such that the deposition film thickness on the dielectric sheet is 25 μm or less and the temperature does not exceed the heat resisting temperature.

The microwave applicator means according to the present invention is structured such that the microwave energy supplied from the microwave source is radiated into the film-forming chamber so as to cause the deposited film forming raw material gas introduced from the gas introduction means to be formed into the plasma and to maintain the plasma thus formed.

Specifically, it is preferable that the microwave introduction opening be formed in the leading portion of the microwave propagating waveguide tube in such a manner that airtightness can be secured. The microwave applicator means may be so arranged as to have either the same specification as that of the microwave propagating waveguide tube or different specification. The size and the shape of the microwave applicator are determined so as to make the mode for propagating the microwave in the microwave applicator means to be a single mode so as to efficiently propagate the microwave energy in the film-forming chamber and stably generate, maintain and control the microwave plasma. However, plural propagation modes may be employed by properly selecting the conditions for generating the microwave plasma such as a raw material gas, its pressure and the microwave power. The single mode propagation mode is exemplified by, for example, TE10 mode, TE11 mode, eH1 mode, TM11 mode and TM01 mode, preferably the TE10 mode and the TE11 mode and the eH1 mode. A waveguide tube adapted to the above-described propagation mode is desired to be connected to the microwave applicator means in such a manner that the propagation mode of the waveguide tube and the propagation mode in the microwave applicator means are preferably made to coincide with each other. The waveguide tube is desired to be a type properly selected depending upon the band of the employed microwave and having the cut-off frequency smaller than the employed frequency. Specifically, it is exemplified by a rectangular waveguide tube, a circular waveguide tube, oval waveguide tube or the like conforming to JIS, EIAJ, IEC and JAN and a domestic standard waveguide tube using 2.45 GHz microwave having a rectangular cross sectional shape and 96 mm in width and 27 mm in height.

The microwave energy to be supplied from the microwave power source according to the present invention is efficiently radiated into the film-forming chamber via the microwave applicator means so that problems relating to the reflected wave due to the microwave applicator can be prevented. Therefore, the necessity of using a microwave matching circuit such as the three-stub tuner or the E-H tuner can be eliminated in the microwave circuit when a relative stable discharge is maintained. However, the above-described microwave matching circuit is desired to be provided for the purpose of protecting the microwave power source in a case where strong reflected wave is generated before the commencement of the discharge or due to abnormal discharge even after the discharge has been commenced.

The apparatus according to the present invention is arranged in such a manner that the spacing is formed in the film-forming chamber at a position between the curving initial end forming means and the curving completion end forming means so that the raw material gas is exhausted through the spacing for the purpose of maintaining the inside portion of the film-forming chamber at a predetermined low pressure state. The size of the spacing must be determined such that a satisfactory exhaust conductance can be obtained and the leakage of the microwave energy radiated into the film-forming chamber to the portion outside the film-forming chamber can be prevented.

Specifically, the microwave applicator means must be disposed such that the direction of the electric field of the microwave which is being propagated in the microwave applicator means and a plane including the central axis of the supporting/conveying roller serving as the curving initial end forming means and the central axis of the supporting/conveying roller serving as the curving end forming means do not run parallel to each other. That is, the waveguide tube is disposed in such a manner that the plane including the longer side or the longer axis of the waveguide tube connected to the microwave applicator means and the plane including the central axes of a pair of the supporting/conveying rollers do not run parallel to each other.

In a case where the microwave energy is radiated into the film-forming chamber via the microwave applicator means, each microwave applicator means must be disposed as described above.

It is preferable that the spacing left between the curving initial end forming means and the curving completion end forming means be arranged in such a manner that the maximum width of the opening in the lengthwise direction of the elongated member is ½ of the wavelength of the microwave, more preferably ¼ of the same.

In a case where the apparatus according to the present invention is arranged in such a manner that a plurality of microwave applicator means are disposed to confront one another, the structure must be arranged in such a manner that the microwave energy radiated from either of the microwave applicator means and received by the other microwave applicator means do not reach the microwave power source connected to the other microwave applicator means so as to protect the microwave power source or prevent an adverse influence such as abnormal oscillation of the microwave.

Specifically, the microwave applicator means is disposed in such a manner that the directions of the electric fields of the microwave propagating through the microwave applicator means do not run parallel to each other. That is, the waveguide tube is disposed in such a manner that the planes each including the longer side or the longer axis of the waveguide tube connected to the microwave applicator means do not run parallel to each other.

In a case where the microwave energy is radiated from only one side of the two end surfaces of the film-forming chamber, the leakage of the microwave energy from the other end surface must be prevented. Therefore, it is required to seal the end surfaces by using a conductive member or to cover them with a metal mesh or a punching board having perforations the diameter of each of which is ½ or less of the wavelength of the employed microwave, preferably, ¼ or less of the same.

Figure 10:
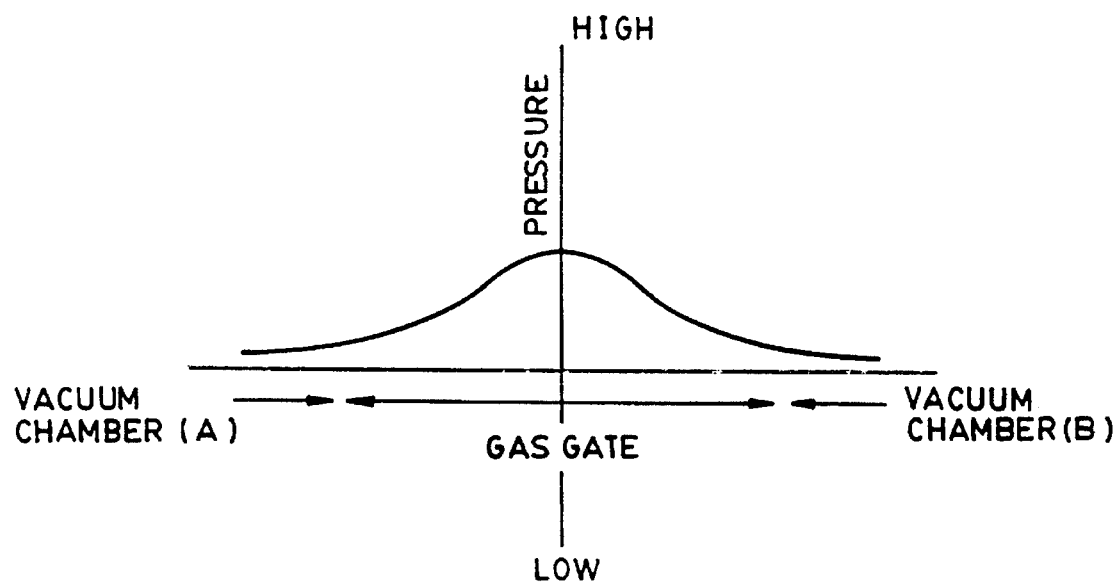
FIG. 10 schematically illustrates the pressure gradient realized by gas gate means according to the present invention.
Figure 10:
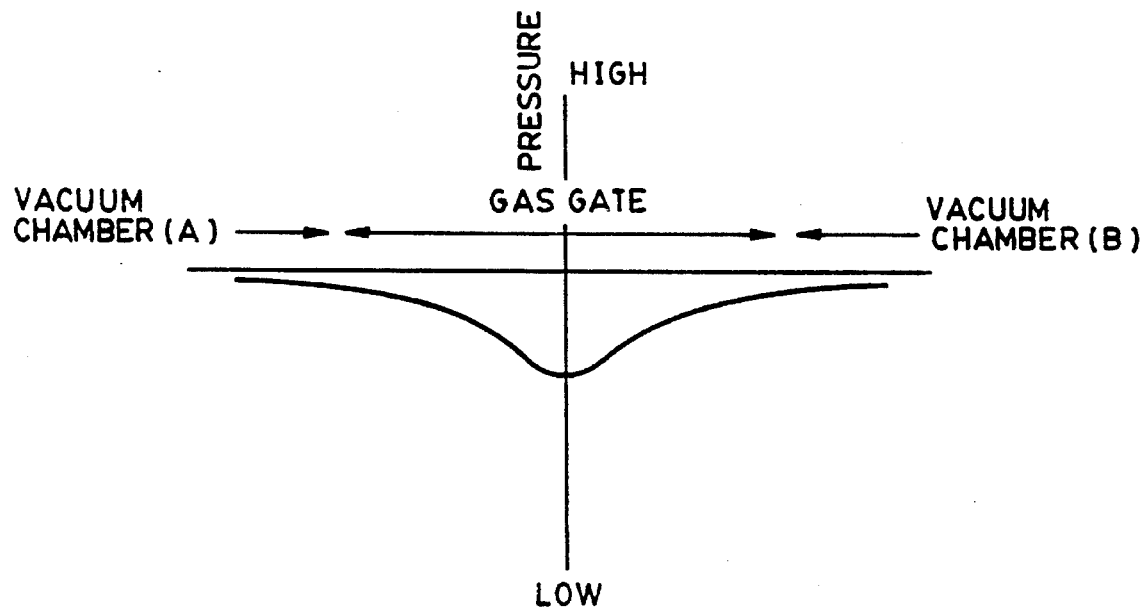

The apparatus according to the present invention preferably employs a gas gate means for the purpose of separating and making the vacuum air to be individually between the film-forming chamber and/or the insulating container and the vacuum container having the other film-forming means and a means for continuously conveying the elongated member through the above-described elements. Since the pressure in the film-forming chamber and/or the insulating container is preferably maintained at a low pressure required to enable an operation to be performed in the vicinity of the minimal value of the modified Paschen's curve, the pressure of the other vacuum containers which are connected to the film-forming chamber and/or the insulating container is usually maintained at the level of the above-described elements or at a level higher than the same. Therefore, the gas gate means must be capable of preventing the diffusion of the deposited film forming raw material gases in the above-described containers which will be taking place due to the pressure difference generated in the containers. As a result, although a gas gate means disclosed in U.S. Pat. No. 4,438,723 can be employed, its performance must be improved. Specifically, it must withstand the pressure difference of about $10^6$ times. Therefore, an exhaust pump exemplified by an oil diffusion pump, a turbo molecular pump or a mechanical booster pump, each of which reveals great exhausting performance, is employed. The gas gate is arranged to have a slit-like or a similar cross sectional shape. Furthermore, its size is determined by using an ordinary conductance equation to adapt to the overall length and the exhausting performance of the employed exhausting pump. Furthermore, it is preferable that a gate gas be employed for the purpose of improving the separating performance, for example, a dilute gas such as Ar, He, Ne, Kr, Xe or Rn or a deposited film forming dilute gas such as $H_2$. The gate gas flow is properly determined in accordance with the conductance of the overall body of the gas gate and the performance of the employed exhaust pump. Accordingly, it may be arranged so as to substantially realize the pressure gradient shown in FIGS. 10A and 10B. Referring to FIG. 10A, there is a point at which the pressure level is the highest in the central portion of the gas gate. Therefore, the gate gas flows from the central portion of the gas gate to the vacuum container side disposed on the two end portions. Referring to FIG. 10B, there is a point at which the pressure level is lowest in the substantially central portion of the gas gate. Therefore, the gate gas is, together with the deposited film forming raw material gas introduced from the containers disposed at the two end portions, and is exhausted from the central portion of the gas gate. Therefore, the interactive gas diffusion between the containers disposed at the two side ends can be prevented as much as possible. In actuality, the optimum condition is determined by measuring the quantity of the gas being diffused by using a gas analyzer or by analyzing the composition of the deposited film.

As the deposited film forming means disposed in the other vacuum container connected to the above-described insulating container by the gas gate means is exemplified by the means for the RF PCVD method, the sputtering method, the reactive sputtering method, the ion plating method, the optical CVD method, the heat CVD method, the MOCVD method, the MBE method and the HR-CVD method each of which is employed to form the functional deposited film. Furthermore, means for the microwave PCVD method according to the present invention and another microwave PCVD method may, of course, be connected in such a manner that a proper means for manufacturing a desired semiconductor device is selected so as to be connected by the above-described gas gate means.

It is preferable to employ the commercial microwave frequency of 2.45 GHz to be supplied from the microwave power source of the apparatus according to the present invention. The other frequency band may be used if it can easily be employed. In order to stabilize the discharge, a so-called continuous oscillation is desired to be employed while arranging its ripple width of 30% or less in the employed output region, preferably 10% or less.

It is effective according to the present invention to perform continuous formation of the deposited film while preventing the film-forming chamber and/or the insulating container from being exposed to open air in order to prevent the mixture of impurities so as to stabilize the characteristics of the deposited film to be formed. However, since the length of the elongated member is finite, it must be connected to another one by welding or the like. Specifically, such a chamber may be disposed adjacent to a container in which the elongated member is accommodated (the pay-off side and the take-up side).

A specific processing method will now be described with reference to the drawings.

Figure 9:
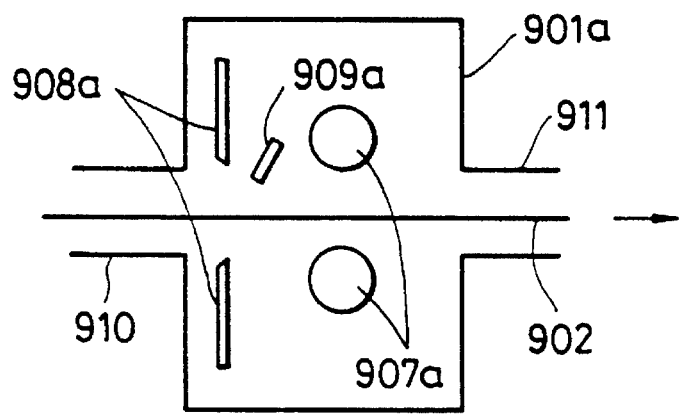
FIGS. 9 (a) to 9 (j) illustrate a method of processing an elongated member.
Figure 9:
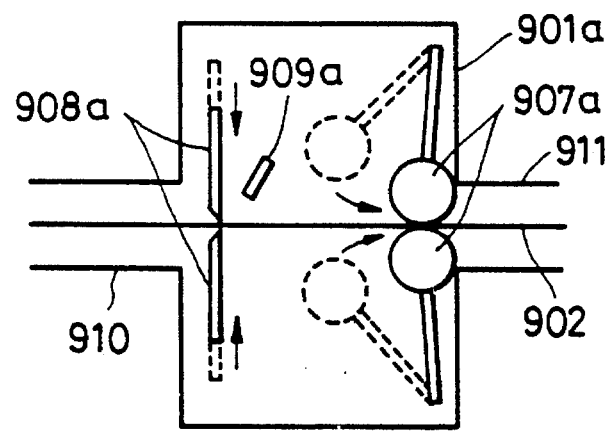
Figure 9:
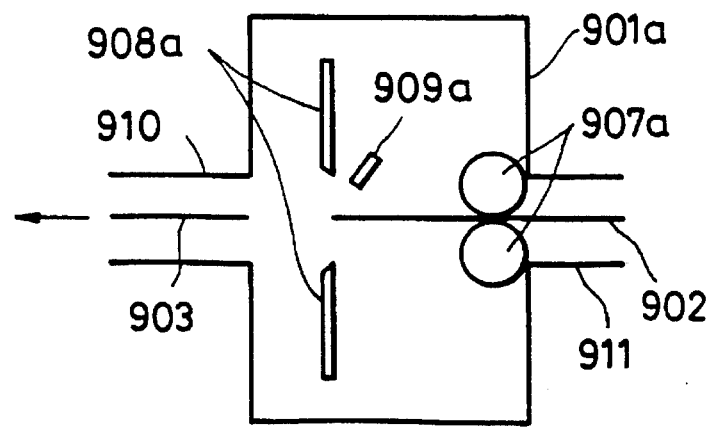
Figure 9:
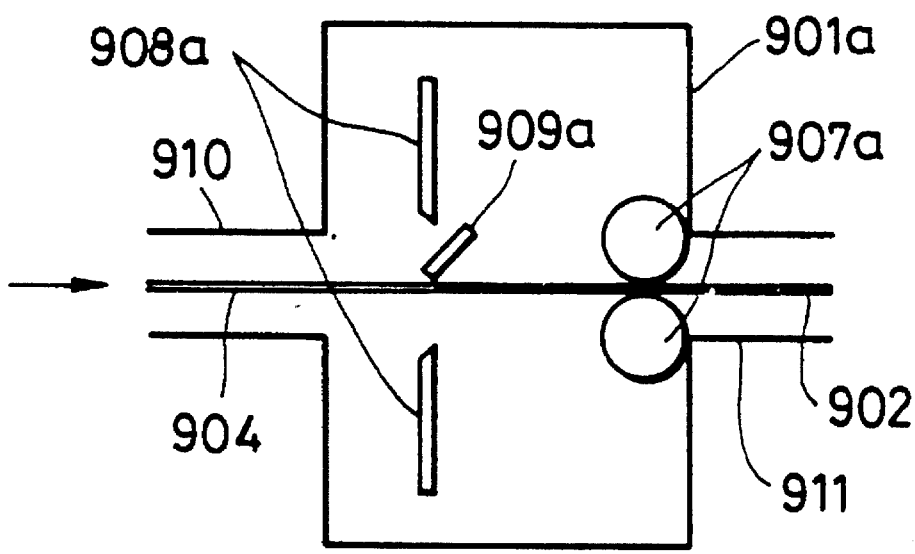
Figure 9:
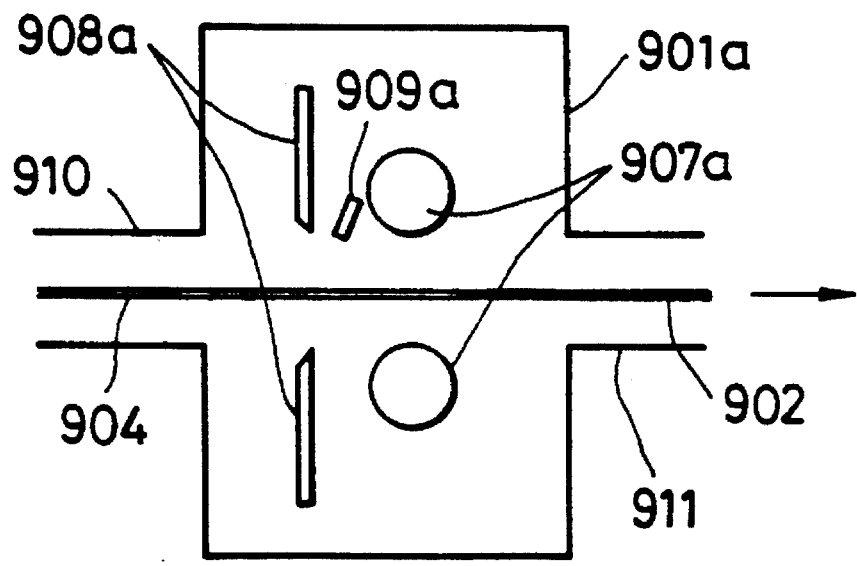
Figure 9F:
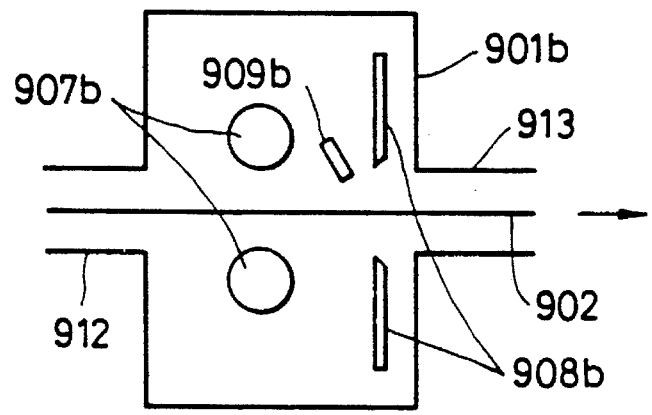
Figure 9G:
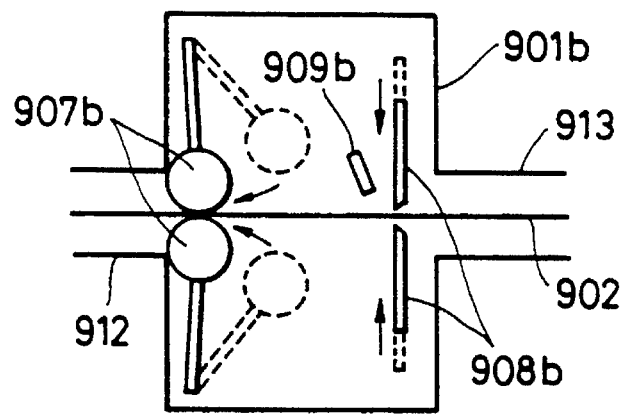
Figure 9H:
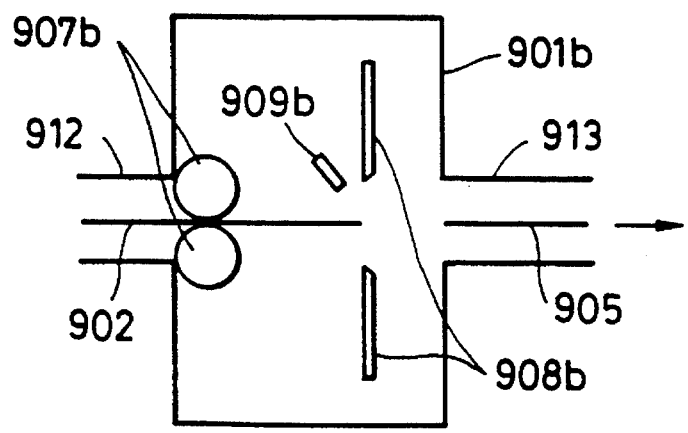
Figure 9I:
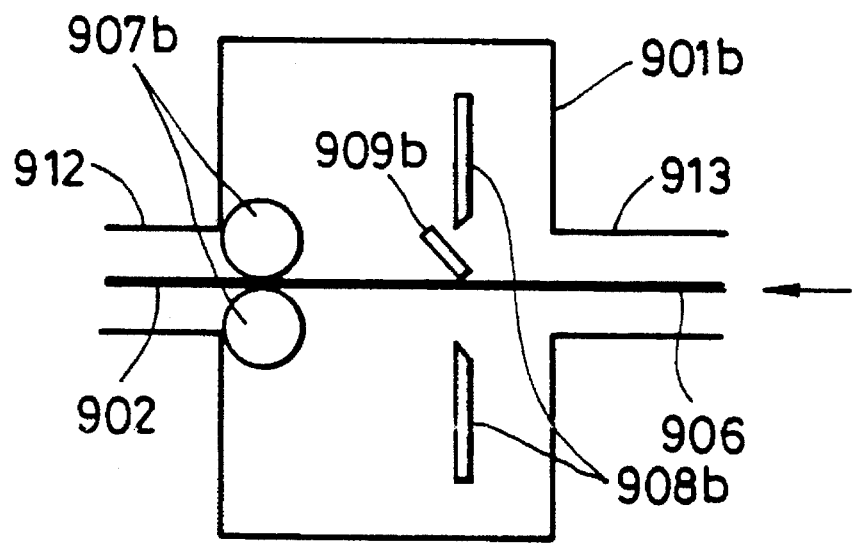
Figure 9J:
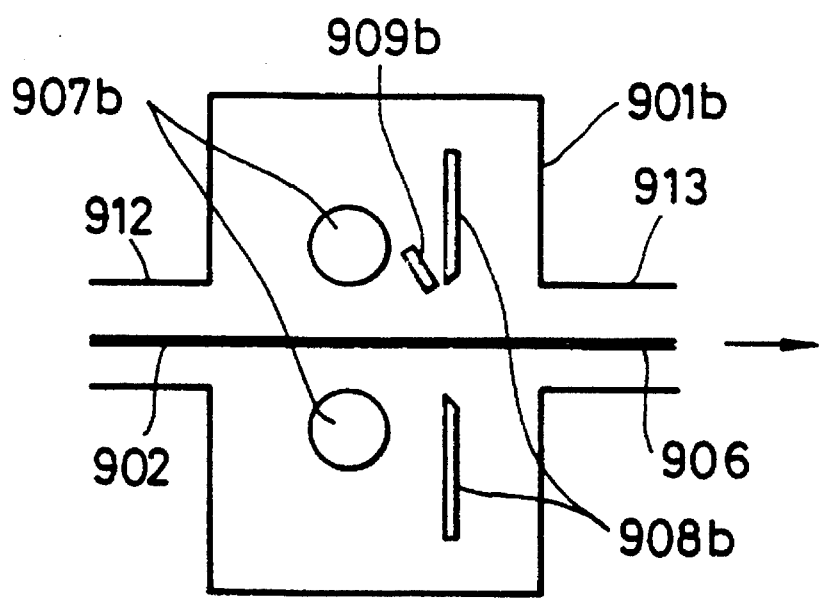

FIGS. 9 (a) to 9 (j) respectively are schematic views which illustrate the schematic structure of the elongated member processing chamber and the operation of the elongated member to be performed at the time of forming the film.

Referring to FIG. 9, reference numeral 901a represents an elongated member processing chamber (A) disposed in the elongated member pay-off side. Reference numeral 901b represents an elongated member processing chamber (B) disposed in the elongated member take-up side and including rollers 907a and 907b manufactured by Byton, cutting blades 908a and 908b and welding jigs 909a and 909b.

That is, FIG. 9 (a) illustrates a state of a normal film formation mode in which an elongated member 902 is being moved in a direction designated by an arrow and the roller 907a, the cutting blade 908a and the welding jig 909a are not positioned in contact with the elongated member 902. Reference numeral 910 represents a connection means (gas gate) for establishing a connection with an elongated member accommodating chamber (omitted from illustration). Reference numeral 911 represents a connection means (gas gate) for establishing a connection with a vacuum chamber (omitted from illustration).

FIG. 9 (b) illustrates a first process for changing for a new elongated member after the film formation on a roll of an elongated member has been completed. First, the elongated member 902 is stopped before the roller 907a is moved from a point designated by a dashed line in a direction designated by an arrow so that the it is brought into contact witch the elongated member 902 and the wall Of the elongated member processing chamber 901a. In this state, the cutting blade 908a is operated in a direction designated by an arrow so that the elongated member 902 is cut. The cutting blade 908a is a blade capable of mechanically, electrically or thermally cutting the elongated member 902.

FIGS. 9 (c) illustrates a state where the elongated member 903, which has been cut and separated, is wound around into the elongated member accommodating container side.

The above-described cutting and winding processes may be performed in any state, that is, in the elongated member accommodating container, in a vacuum state or an open air pressure leakage state.

FIG. 9 (d) illustrates a process in which a new elongated member 904 is supplied and it is connected to the elongated member 902. The elongated members 904 and 902 are connected to each other at their end portions so as to be welded by the welding jig 909a.

FIG. 9 (e) illustrates a state where the roller 907a is separated from the elongated member 902 and the wall of the elongated member processing chamber (A) 901a and the elongated members 902 and 904 are wound up after the inside portion of an elongated member accommodating container (omitted from illustration) has been vacuum-exhausted so as to sufficiently eliminate the pressure difference from the film-forming chamber.

Then the operation of the elongated member on the winding side will now be described.

FIG. 9 (f) illustrates a state at the time of film is being formed normally, wherein each of the jigs is disposed substantially symmetrically to the positions illustrated with reference to FIG. 9 (a).

Reference numeral 912 represents a connection means (gas gate) for establishing a connection with a vacuum chamber (omitted from illustration). Reference numeral 913 represents a connection means (gas gate) for establishing a connection with an elongated member accommodating chamber (omitted from illustration).

FIG. 9 (g) illustrates a process in which, after a roll of the elongated member has been subjected to the film formation process, it is taken out so as to change for an empty bobbin for taking upon the next elongated member on which the film has been formed.

First, the elongated member 902 is stopped before the roller 907b is moved from a position designated by a dashed line in a direction designated by an arrow so as to bring it into hermetically contact with the elongated member 902 and the wall of the elongated member processing chamber 901b. In this state, the elongated member accommodating container and the film forming chamber are hermetically separated from each other. Then, the cutting blade 908b is operated in the direction designated by an arrow so as to cut the elongated member 902. The cutting blade 908b is a blade capable of mechanically, electrically or thermally cutting the elongated substrate 902.

FIG. 9 (h) illustrates a state in which the elongated member 905 which has been cut and separated after the film had been formed thereon is being taken up on the elongated member accommodating container side.

The above-described cutting and taking up process may be performed in any state in which it is performed in the elongated member accommodating container, in a vacuum state or in an atmospheric pressure leak state.

FIG. 9 (i) illustrates a state in which a sub-elongated member 906 set to a new take-up bobbin is supplied and is connected to the elongated member 902. The sub-elongated member 906 and the elongated member 902 are positioned in contact with each other at their end portions so as to be connected to each other by the welding jig 909b.

FIG. 9 (j) illustrates a state where the roller 907b is separated from the elongated member 902 and the wall of the elongated member processing chamber (B) 901b and the elongated members 902 and 906 are wound up after the inside portion of an elongated member accommodating container (omitted from illustration) has been vacuum-exhausted so as to sufficiently eliminate the pressure difference from the film-forming chamber.

The functional deposited film to be continuously formed by the method and apparatus according to the present invention are: a IV group amorphous or crystalline semiconductor thin film containing Si, Ge or C; a IV group alloy semiconductor thin film containing Si, Ge, SiC or SiSn; a III–V group compound semiconductor thin film containing GaAs, GaF, GaSb, InP or InAs; and a II–VI group compound semiconductor thin film containing ZnSe, ZnS, ZnTe, CdS, CdSe or CdTe.

As the functional deposited film forming raw material gas for use in the method and the apparatus according to the present invention, the hydrides, halides or the organic metal compounds of the component elements of the above-described semiconductor thin film is exemplified, preferably a material which can be introduced into the film-forming chamber in a gaseous state.

Two kinds of the above-described raw material compounds can be mixed for use. Furthermore, they may be introduced after they are mixed with a rare gas selected from He, Ne, Ar, Kr, Xe, Rn or the like or a dilute gas of $H_2$, HF, HCl or the like.

The above-described semiconductor thin film to be continuously formed can be subjected to a valence electron control and a forbidden band width control. Specifically, a raw material compound containing a valence electron control agent or a forbidden band width control agent is either separately introduced into the film-forming chamber or mixed with the deposited film raw material gas or the above-described dilute gas before it is introduced into the film-forming chamber.

The deposited film forming raw material gas or the like is uniformly discharged into the columnar film-forming chamber through a gas introduction tube having a single discharge hole or a plurality of gas discharge holes at the leading portion thereof and disposed in the columnar film-forming chamber composed of the elongated member. Thus, it is formed into plasma so that the microwave plasma region is formed. As the material for constituting the gas introduction tube, a material which cannot be damaged in the microwave plasma is preferably used. Specifically, it is exemplified by heat resisting metals such as stainless steel, nickel, titanium, tungsten, panadium and nichrome. Alternatively, ceramics such as alumina or silicon nitride may be sprayed on the surface of any one of the above-described metals.

In the apparatus according to the present invention, the deposited film forming raw material gas introduced into the columnar film-forming chamber through the gas introduction tube is decomposed in part or completely so that a precursor for forming the deposited film is generated. As a result, the deposited film is formed. However, it is necessary for the non-decomposed raw material gas or a gas having a different composition due to the decomposition to be smoothly exhausted from the columnar film-forming chamber. However, the exhaust hole area cannot be enlarged excessively as it is important to prevent the leakage of the microwave energy through the exhaust hole which will cause the plasma to be unstable or adversely influence the other electronic equipment or injure humans. Therefore, it is desired that the exhaust hole in the apparatus according to the present invention the spacing formed between the curving initial end and the curving completion end of the elongated member corresponding to ½ or less of the wavelength of the employed microwave, more preferably ¼ or less of the same in order to prevent the leakage of the microwave.

APPARATUS EMBODIMENTS

Embodiments of the apparatus according to the present invention will now be described with reference to the drawings. However, the present invention is not limited to the descriptions to be made hereinafter.

Apparatus Embodiment 1

FIG. 1 is a schematic transparent view which illustrates a microwave PCVD apparatus according to the present invention.

Reference numeral 101 represents an elongated member having a columnar curved shape realized by supporting/conveying rollers 102 and 103 and supporting/conveying rings 104 and 105. It is conveyed in a direction designated by an arrow (→) so that a film-forming chamber 116 is continuously formed. Reference numerals 106a to 106e represent temperature control mechanisms for heating or cooling the elongated member 101, each of the mechanisms 106a to 106e being individually performs the temperature control operation.

In the apparatus according to this embodiment, a pair of microwave applicators 107 and 108 are disposed to confront each other and having, at their leading portions, microwave introduction openings 109 and 110. The microwave introduction openings 109 and 110 respectively have, on the surface thereof, dielectric sheets 117 and 118. Rectangular waveguide tubes 111 and 112 are disposed in such a manner that its plane including the longer side is not vertical to a plane including the central axis of the supporting/conveying roller and their planes each including the longer side also do not run parallel. Referring to FIG. 1, the microwave applicator 107 and the dielectric sheet 117 are separated from the supporting/conveying ring 104. However, they are disposed in a direction designated by an arrow at the time of forming the deposited film.

Reference numeral 113 represents a gas introduction tube and 114 represents an exhaust pipe which is connected to an exhaust pump (omitted from illustration). Reference numerals 115a and 115b represent insulating passages which are provided when the apparatus according to the present invention is connected to a container or the like including the other film forming means.

The supporting/conveying rollers 102 and 103 respectively include a conveyance speed detection mechanism and a tension detection/adjusting mechanism (which are omitted from illustration) so that the conveyance speed of the elongated member 101 is maintained at constant speed and a predetermined curved shape is maintained.

A microwave power source (omitted from illustration) is connected to the rectangular waveguide tubes 111 and 112.

Figure 2A:
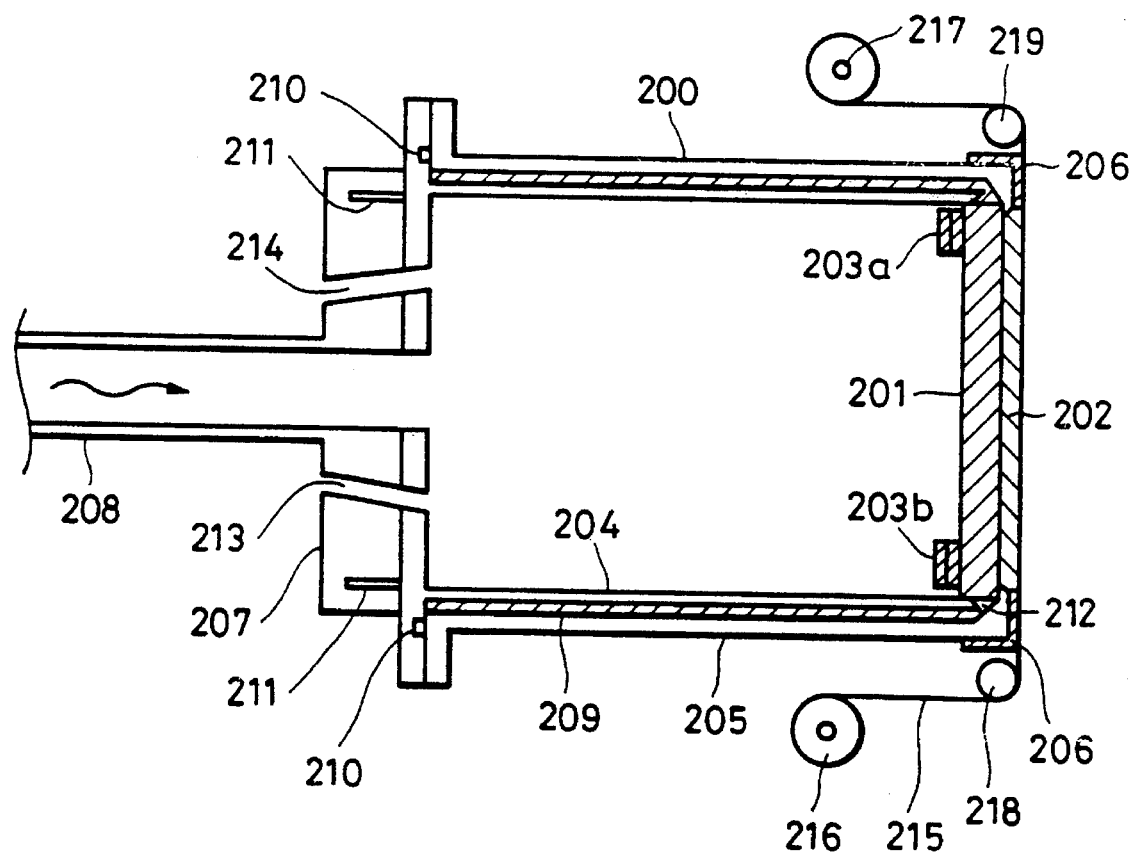
FIG. 2 (a) is a schematic view which illustrates a microwave applicator means and a sheet conveying means made of a dielectric material according to the present invention.
Figure 2B:
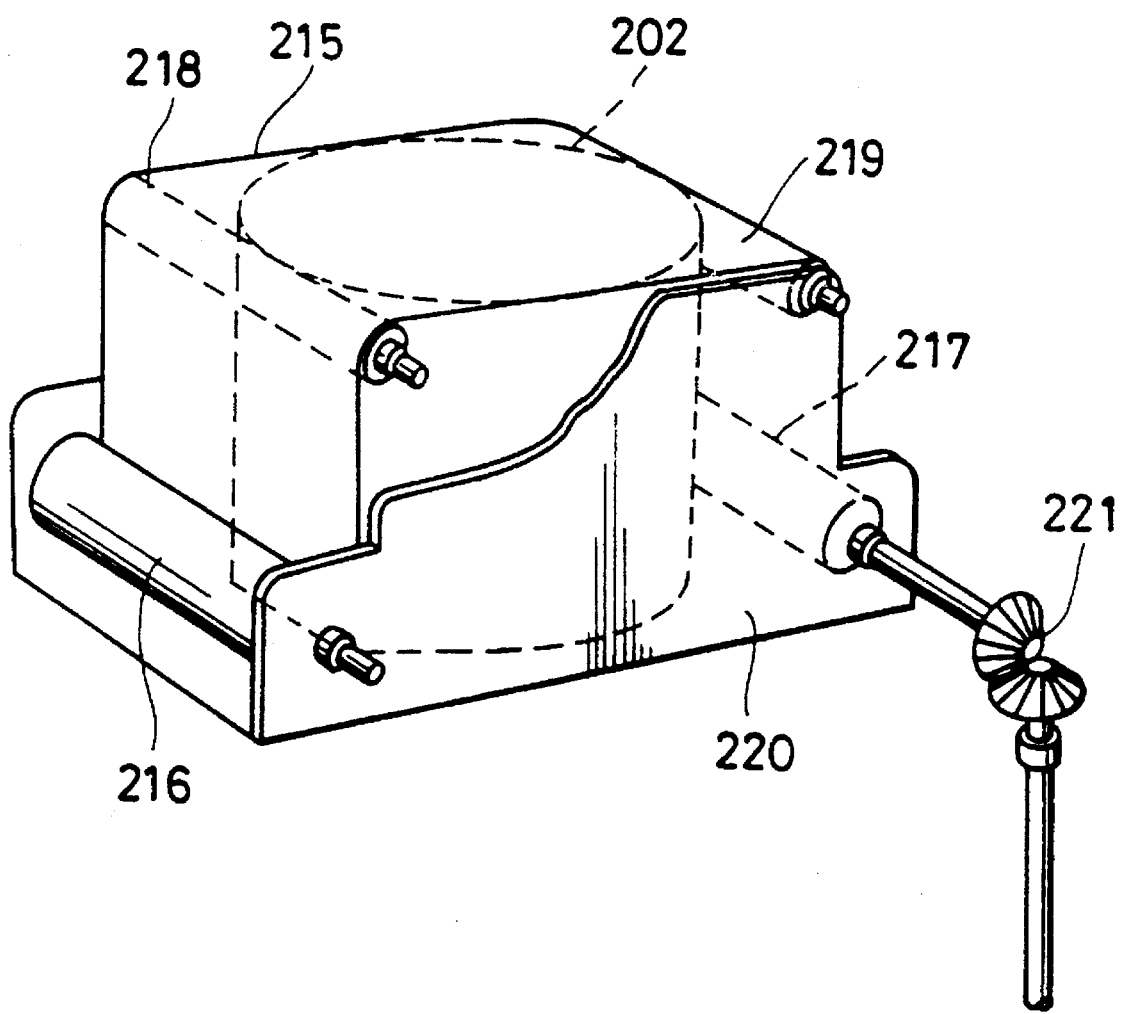

FIG. 2 (a) is a schematic cross sectional view which illustrates microwave applicator means 107 and 108 and a dielectric sheet conveyance unit.

Reference numeral 200 represents a microwave applicator to which microwave is transmitted from the microwave power source (omitted from illustration) in a direction from left through the rectangular waveguide 208.

Reference numerals 201 and 202 represent microwave introduction openings which are secured to an inner cylinder 204 and an outer cylinder 205 by using a metal seal 212 and a fixing ring 206 so that a vacuum seal is formed. The portion between the inner cylinder 204 and the outer cylinder 205 can be arranged in such a manner that a cooling medium 209 is able to flow therethrough. An end portion of them is sealed by an "O" ring 210 so that the overall body of the microwave applicator 200 is uniformly cooled. As the cooling medium 209, water, Freon, oil, cooling air or the like is desirable. Microwave matching discs 203a and 203b are secured to the microwave introduction opening 201. A choke flange 207 having a groove 211 is connected to the outer cylinder 205. Reference numerals 213 and 214 represent cooling air introduction and/or exhausting holes for cooling the inner portion of the applicator.

Reference numeral 215 represents a dielectric sheet which is taken up by a dielectric sheet take-up roller 217 while maintaining a state in which it is substantially contact with the microwave introduction opening 201 after it has been supplied from a dielectric sheet supply roller 216 via dielectric sheet guide rollers 218 and 219.

FIG. 2 (b) is a schematic transparent view which illustrates a dielectric sheet conveyance unit.

Reference numeral 215 represents the dielectric sheet which is positioned on the microwave introduction opening 202 in such a manner that it is positioned substantially in contact with the opening 202 to cover the same. Reference numeral 216 represents the dielectric sheet supply roller and 217 represents the dielectric sheet take-up roller. Reference numerals 218 and 219 represent guide rollers for guiding the dielectric sheet in such a manner that the dielectric sheet 215 can be smoothly conveyed while maintaining a state in which it is positioned substantially in contact with the microwave introduction opening 202. Reference numeral 221 represents a gear member for transmitting rotational force from a drive motor (omitted from illustration) disposed outside the film-forming space to the dielectric sheet take-up roller 217 so as to rotate the dielectric sheet take-up roller 217. Reference numeral 220 represents a chassis portion for retaining the above-described elements.

The apparatus according to this embodiment is arranged in such a manner that the inner shape of the inner cylinder 204 is formed into a cylindrical shape having the inner diameter and the length through which the microwave propagates so designed as to sufficiently act as the waveguide tube. That is, the inner diameter is desired to be smaller than the frequency of the microwave serving as the cut-off frequency and also small enough to prevent the plural modes. Furthermore, the length is made to be an appropriate length so as to prevent the standing wave from being generated inside. The inner shape of the inner cylinder 204 may be formed into a rectangular column.

Apparatus Embodiment 2

According to this embodiment, the apparatus according to Apparatus Embodiment 1 is disposed in an insulating container.

The shape of the insulating container is not particularly limited if it is able to include the structural jigs according to the Apparatus Embodiment 1. However, it is preferable that a cubic, a parallelpiped and cylindrical shape be employed. An auxiliary gas introduction tube is formed in a remaining space between the film-forming chamber 116 and the insulating container so that a rare gas, $H_2$ gas or the like for adjusting the pressure for preventing the discharge in the above-described space is introduced through the auxiliary gas introduction tube. The above-described space may be exhausted by the exhausting pump of the film-forming chamber 116 or individual exhausting pump may be connected to the same.

Apparatus Embodiment 3

According to this embodiment, the structure is arranged similarly to apparatus embodiment 1 except for the shape of the microwave applicator formed into a rectangular column. The cross sectional size of the rectangular columnar microwave applicator may be determined to be either the same as that of the employed waveguide tube or different from it. Furthermore, it is preferable that it has as large a size as possible if the plural modes is not generated.

Apparatus Embodiment 4

According to this embodiment, the same structure as that according to Apparatus Embodiment 2 is employed except for employing the rectangular columnar microwave applicator means according to Apparatus Embodiment 3.

Apparatus Embodiments 5 and 6

According to this embodiment, the structure is arranged similarly to Apparatus Embodiments 1 and 2 except for employing an oval columnar microwave applicator means as an alternative to the cylindrical microwave applicator means.

Apparatus Embodiment 7

Figure 3:
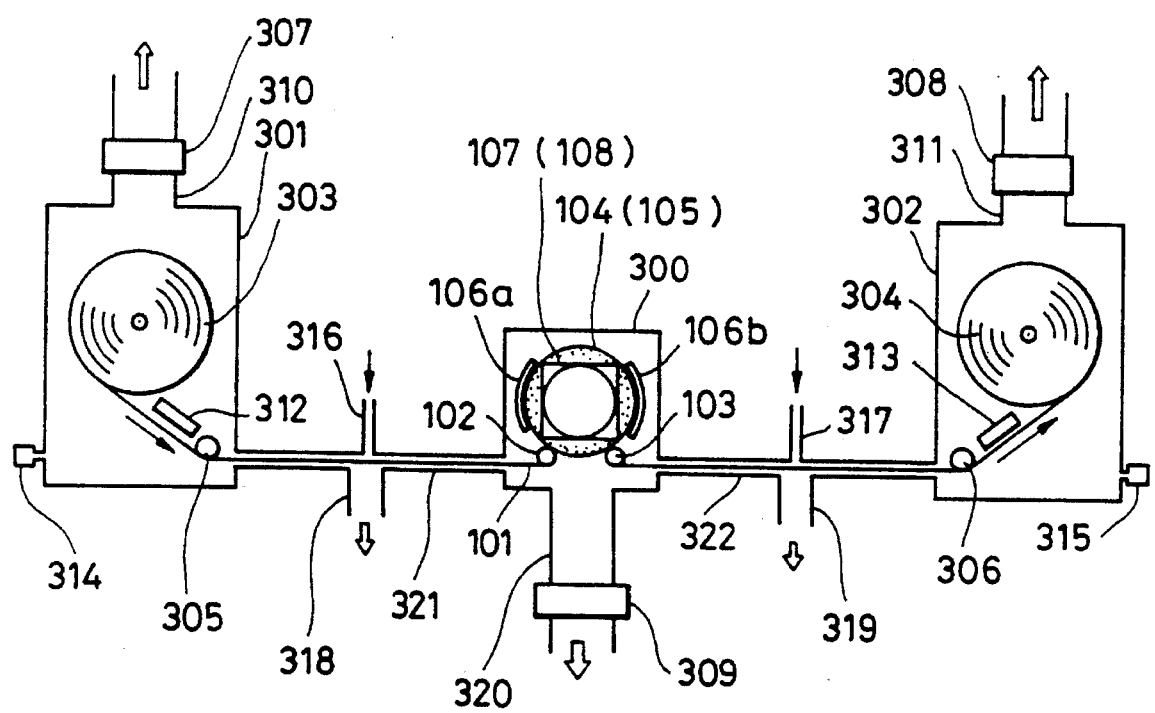
FIGS. 3, 4 and 5 are overall schematic views which illustrate examples of a continuous type microwave PCVD apparatus according to the present invention.

According to this embodiment as shown in FIG. 3, the structure is arranged in such a manner that vacuum containers 301 and 302 for paying off and taking up the elongated member 101 are, by using gas gates 321 and 322, connected to the microwave PCVD apparatus according to Apparatus Embodiment 2 and acting for forming the deposited film.

Reference numeral 300 represents an insulating container, 303 represents a bobbin for paying off the elongated member and 304 represents a bobbin for taking up the elongated member. The elongated member is conveyed in a direction designated by an arrow. The conveyance direction can, of course, be reversed. The vacuum containers 301 and 302 may have take-up and pay-off means made of synthetic paper for protecting the surface of the elongated member. The synthetic paper is desired to be made of polyimide, Teflon or glass wool having heat resistance. Reference numerals 306 and 307 represent conveying rollers serving as tension adjusting means and as well as an elongated member position detection means. Reference numerals 312 and 313 represent temperature adjusting mechanisms for pre-heating or cooling the elongated member. Reference numerals 307, 308 and 309 represent throttle valves for adjusting the exhaust quantity. Reference numerals 310, 311 and 320 represent exhaust pipes each of which is connected to an exhaust pump (omitted from illustration). Reference numerals 314, 315 represent pressure gauges, 316, 317 represent gate gas introduction tubes and 318 and 319 represent gate gas exhaust pipes so that the gate gas and/or the deposited film forming raw material gas is exhausted from the exhaust pump (omitted from illustration). The reference numerals 101 to 108 are the same as those used to identify the elements of FIG. 1.

Apparatus Embodiment 8

Figure 4:
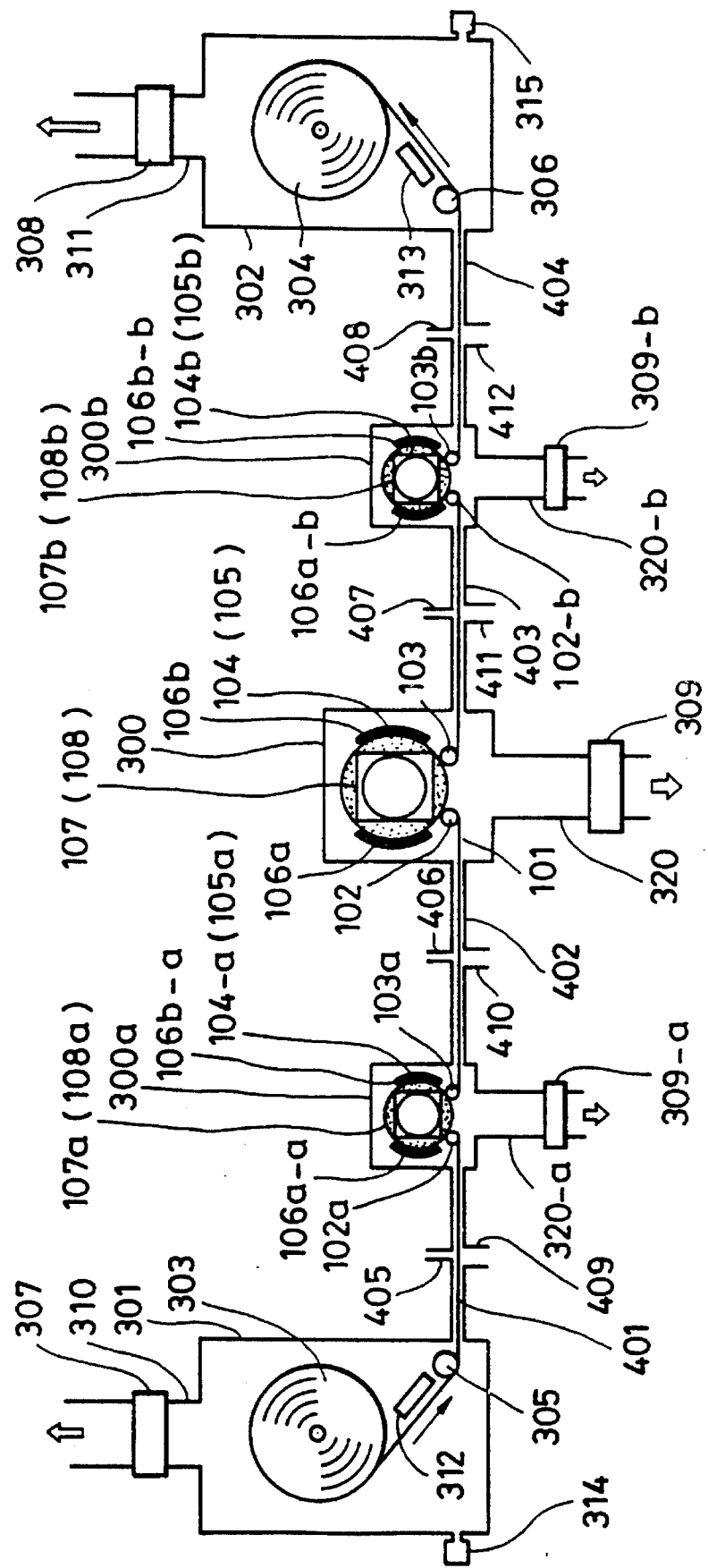

According to this embodiment, the structure is, as shown in FIG. 4, arranged in such a manner that two insulating containers 300a and 300b each of which includes a deposited film forming apparatus arranged to perform the microwave PCVD method are disposed on the two side portions of the apparatus according to the Apparatus Embodiment 7 for the purpose of manufacturing a laminated type device.

Elements given Symbols a or c are mechanism having the same functions as those employed in the insulating container 300.

Reference numerals 401, 402, 4103 and 404 represent gas gates, 405, 406, 407 and 408 represent gate gas introduction tubes and 409, 410, 411 and 412 represent gate gas exhaust pipes. The reference numerals 101 to 108 are the same as those used to identify the elements of FIG. 1 and the reference numerals 300 to 320 are the same as those used to identify the elements of FIG. 3.

Apparatus Embodiments 9 and 10

The structure according to this embodiment is arranged similarly to Apparatus Embodiments 7 and 8 except for an arrangement made in such a manner that the microwave applicator 200 according to Apparatus Embodiment 7 and 8 is replaced by a rectangular columnar microwave applicator.

Apparatus Embodiments 11 and 12

The structure according to this embodiment is arranged similarly to Apparatus Embodiments 7 and 8 except for an arrangement made in such a manner that the microwave applicator according to Apparatus Embodiment 7 and 8 is replaced by an oval columnar microwave applicator according to Apparatus Embodiment 5 or 6.

Apparatus Embodiment 13

Figure 5:
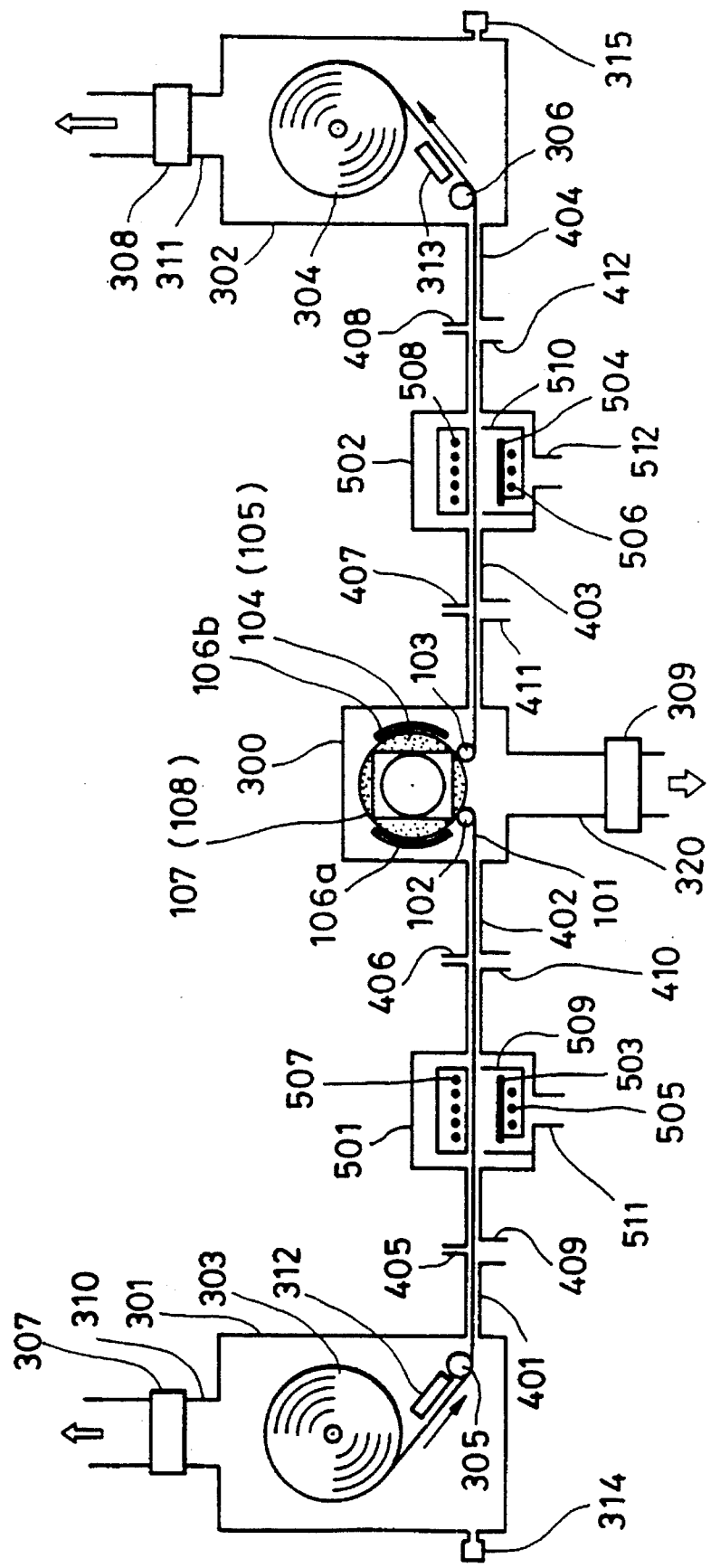

The structure according to this embodiment is, as shown in FIG. 5, two conventional RF PCVD apparatuses are connected to the two side portions of the apparatus according to Apparatus Embodiment 7 for the purpose of manufacturing a laminated type device.

Reference numerals 501 and 502 represent vacuum containers, 503 and 504 represent RF applying cathode electrodes, 505 and 506 represent gas introduction tubes and as well as heaters, 507 and 508 represent halogen lamps for heating the substrate, 509 and 510 represent anode electrodes and 511 and 512 represent exhaust pipes. Reference numerals 103 to 108, reference numerals 300 to 320 and reference numerals 400 to 410 are the same as those used to identify the elements of FIGS. 1, 3 and 4, respectively.

Apparatus Embodiments 14 and 15

The structure according to this embodiment is arranged similarly to the apparatus according to Apparatus Embodiments 1 and 2 except for an arrangement made in such a manner that the microwave applicator is disposed on an end surface on either side of the film-forming chamber in a case where an elongated member having a relatively narrow width is used. However, in this case, the metal mesh, the punching board or the metal thin plate for preventing the leakage of the microwave is disposed on the other end surface.

Other Apparatus Embodiments

An apparatus may be employed which is arranged similarly to that according to Apparatus Embodiment 8 except for an arrangement made in such a manner that the insulating containers 300, 300a and 300b for forming the deposited film and the above-described various shaped microwave applicators are combined with one another.

Another apparatus may be employed in which two or three apparatuses according to Apparatus Embodiment 8 are successively connected to one another. Another apparatus may be employed in which the deposited film forming means are combined and arranged to perform in accordance with the RF plasma CVD method.

Furthermore, another apparatus may be employed which is arranged similarly to that according to Apparatus Embodiment 1 or 2 except for an arrangement made in such a manner that two or more pairs of microwave applicators are disposed on the two end surfaces of the film-forming chamber; and a further large microwave plasma region is created; whereby the functional deposited film of relatively large thickness can be formed while conveying the elongated mender at the same speed as that in the other cases.

A solar cell is exemplified as a semiconductor device which can be manufactured by the method and the apparatus according to the present invention. A typical layer structure of the solar cell is schematically shown in FIGS. 8 (a) to (d).

Figure 8:
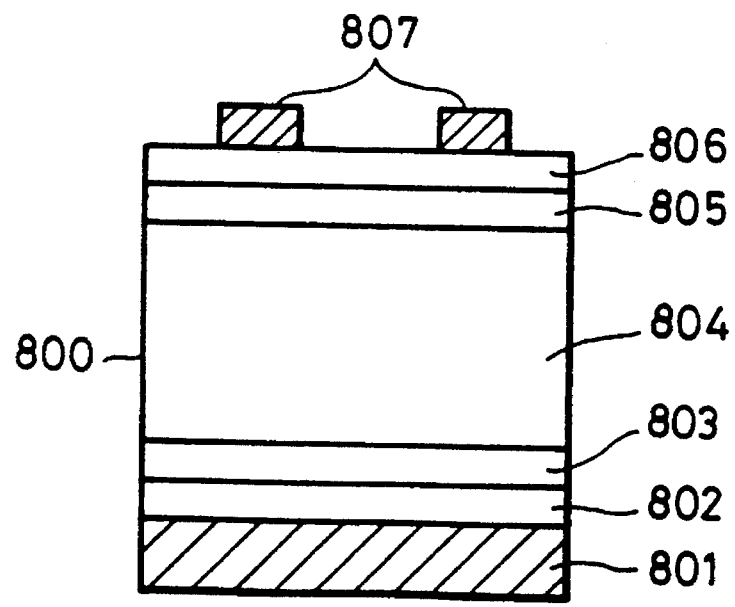
FIGS. 8 (a) to 8 (d) are cross sectional schematic views which illustrate a pin-type photovolatic device (a single, a tandem and a triple type) manufactured by a method according to the present invention.
Figure 8:
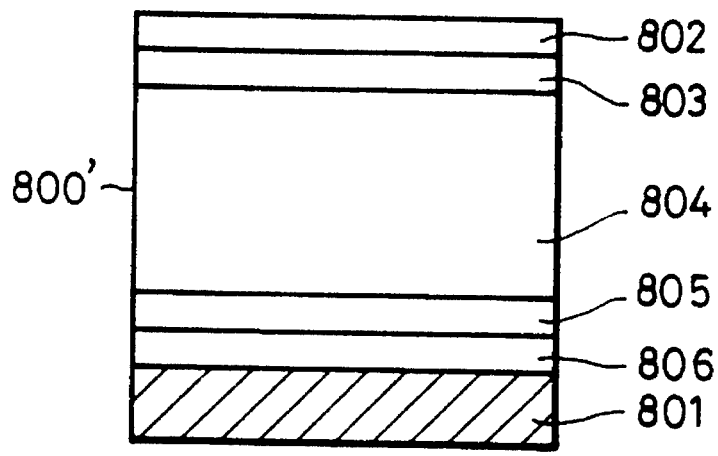
Figure 8:
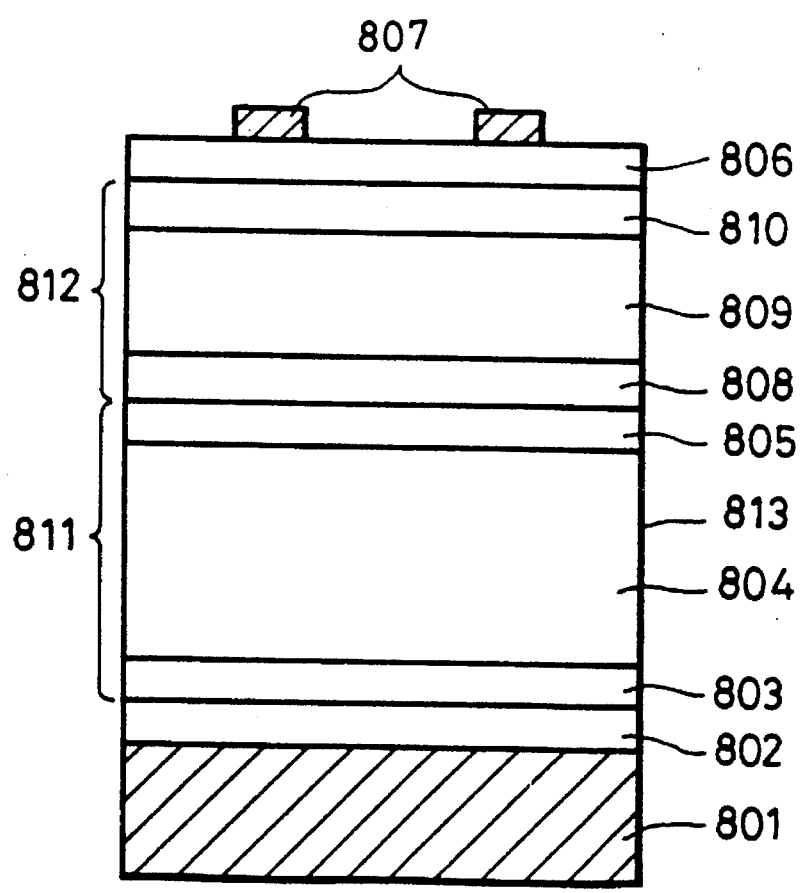
Figure 8D:
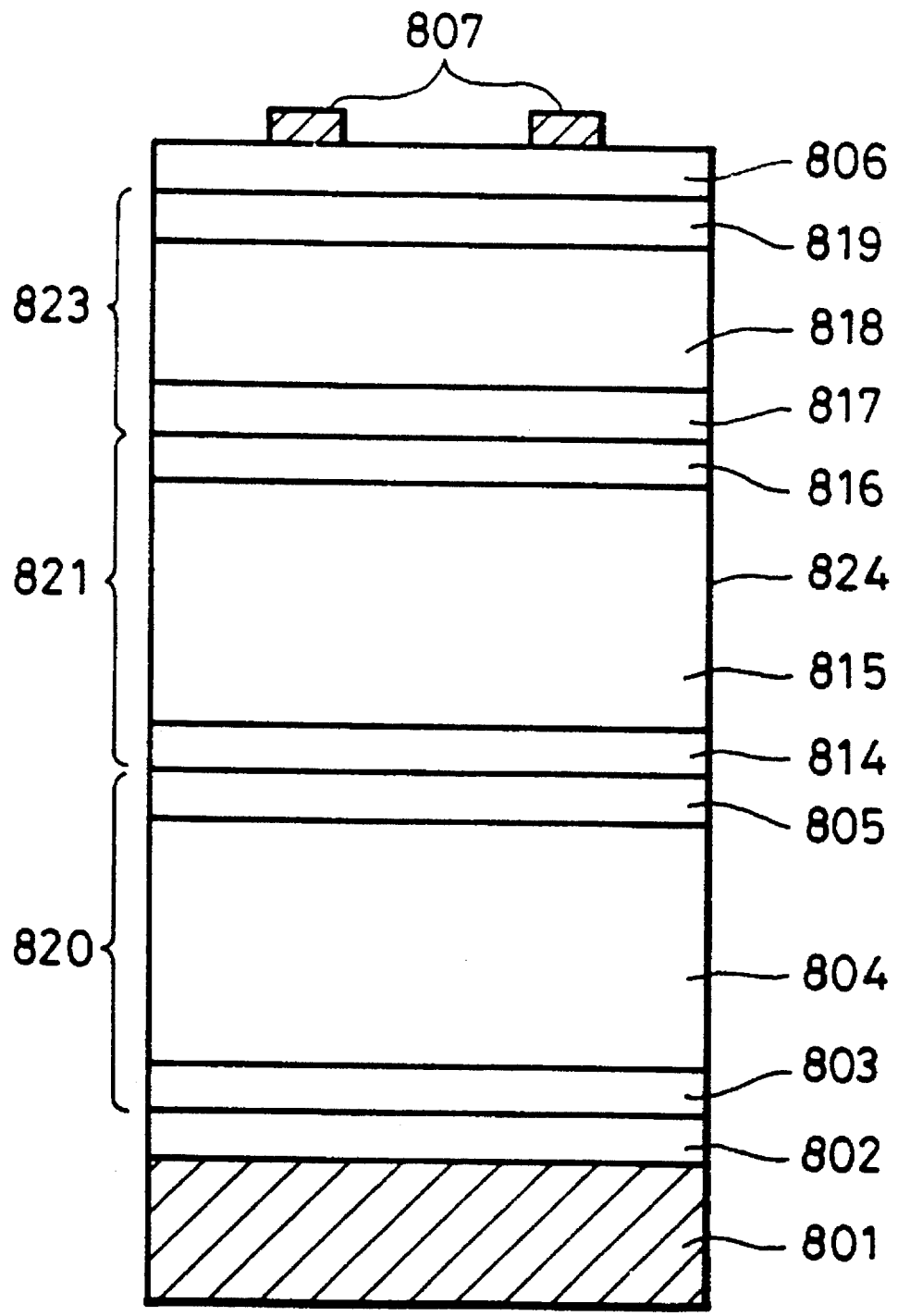

FIG. 8 (a) shows a photovolatic device 800 formed by sequentially depositing, on a supporting member 801, a lower electrode 802, an n-type semiconductor layer 803, an i-type semiconductor layer 804, a p-type semiconductor layer 805, a transparent electrode 806 and a collector electrode 807 in this sequential order. The photovolatic device according to this embodiment is arranged in such a manner that light is made incident upon the transparent electrode 806 side.

FIG. 8 (b) shows a photovolatic device 800' formed by sequentially depositing, on the light transmissive supporting member 801, the transparent electrode 806, the p-type semiconductor layer 805, the i-type semiconductor layer 804, the n-type semiconductor layer 803 and the lower electrode 802 in this sequential order. The photovolatic device according to this embodiment is arranged in such a manner that light is made incident upon the light transmissive supporting member 801.

FIG. 8 (c) illustrates a so-called tandem type photovolatic device 813 structured by stacking up two pin junction type photovolatic devices 811 and 812 in each of which two kinds of semiconductor layers having different band spacing and/or thickness of the layer are made to be the i-layer. Reference numeral 80i represents the supporting member on which the lower electrode 802, the n-type semiconductor layer 803, the i-type semiconductor layer 804, the p-type semiconductor layer 805, an n-type semiconductor layer 808, an i-type semiconductor layer 809, a p-type semiconductor layer 810, the transparent electrode 806 and the collector electrode 807 are sequentially stacked up in this sequential order. The photovolatic device according to this embodiment, is arranged in such a manner that light is made incident upon the transparent electrode 806 side.

FIG. 8 (d) illustrates a so-called triple type photovolatic device 824 structured by stacking up three pin junction type photovolatic devices 820, 821 and 823 in each of which three kinds of semiconductor layers having different band spacing and/or thickness of the layer are made to be the i-layer. Reference numeral 801 represents the supporting member on which the lower electrode 802, the n-type semiconductor layer 803, the i-type semiconductor layer 804, the p-type semiconductor layer 805, an n-type semiconductor layer 814, an i-type semiconductor layer 815, a p-type semiconductor layer 816, an n-type semiconductor layer 817, an i-type semiconductor layer 818, a p-type semiconductor layer 819, the transparent electrode 806 and the collector electrode 807 are sequentially stacked up in this sequential order. The photovolatic device according to this embodiment is arranged in such a manner that light is made incident upon the transparent electrode 806 side.

According to any of the photovolatic devices, the stacking order of the n-type semiconductor layer and the p-type semiconductor layer may be changed as desired.

The structure of the photovolatic device will now be described.

Supporting Member

The supporting member 801 according to the present invention is desired to be made of a flexible material capable of forming the curved shape. It may be either conductive or electric insulating type. It may be either light transmissive or non light transmissive. In a case where the light is made incident upon the supporting member 801 side, it must, of course, be light transmissive.

Specifically, the elongated member according to the present invention is exemplified. By using the elongated member according to the present invention, the weight of the solar cell to be manufactured can be reduced, the strength of the same can be improved and the space required to transport it can be reduced.

Electrode

Proper electrodes are employed in the photovolatic device according to the present invention in accordance with the arranged structure and status of the device. The electrodes are exemplified by the lower electrode, the upper electrode (transparent electrode) and the collecting electrode (however, the "upper electrode" is an electrode disposed on the light incidental side, while the "lower electrode" is an electrode disposed opposing the upper electrode while holding the semiconductor layer therebetween).

The electrodes will now be described.
(I) Lower Electrode

The position at which the lower electrode 802 according to the present invention is disposed differs depending on whether or not the material for the supporting member 801 is light transmissive because the surface to which photovolatic power generating light is irradiated is different (in a case where the supporting member 801 is made of a non light transmissive material such as metal as shown in FIG. 8 (a), photovolatic power generating light is irradiated from the transparent electrode 806 side).

Specifically, in a case where the layer structure is arranged as shown in FIG. 8 (a), (c) or (d), the lower electrode 802 is disposed between the supporting member 801 and the n-type semiconductor layer 803. In a case where the supporting member 801 is conductive, the supporting member 801 is able to also serve as the lower electrode. However, in a case where the supporting member 801 is conductive and as well as the sheet resistance is large, the electrode 802 may be disposed as the low-resistance electrode for outputting an electric current for the purpose of raising the reflectance at the surface of the supporting member and effectively utilizing incidental light.

In the case shown in FIG. 8 (b), the light transmissive supporting member 801 is employed so that light is made incident upon the supporting member 801 side. Therefore, the lower electrode 802 is disposed to oppose the supporting member 801 while holding the semiconductor layer therebetween for the purpose of outputting an electric current and reflecting light at the electrode.

In a case where an electric insulating supporting member 801 is employed, the lower electrode 802 is disposed between the supporting member 801 and the n-type semiconductor layer 803 so as to serve as an electric-current outputting electrode.

The material of the electrode is exemplified by the following metal or their alloy: Ag, Au, Pt, Ni, Cr, Cu, Al, Ti, An, Mo and W. The thin film of any of the above-described element is formed by vacuum evaporating, electron beam evaporating or sputtering. The formed metal thin film must be arranged in such a manner that it does not function as a resistance factor against the-output from the photovolatic device. Therefore, the sheet resistance is desired to be 50Ω or less, more preferably 10Ω or less.

A diffusion prevention layer made of conductive zinc oxide or the like may be formed between the lower electrode 802 and the n-type semiconductor layer 803. The diffusion prevention layer acts to prevent the diffusion of metal elements composing the electrode 802 into the n-type semiconductor layer. Furthermore, since a certain resistance value is given to the same, a short circuit generated between the lower electrode 802 and the transparent electrode 806 disposed while holding the semiconductor layer due to a fault such as a pin hole can be prevented. In addition, another effect can be obtained in that a multiple interference due to the thin film is generated so that incidental light can be confined in the photovolatic device.

(II) Upper Electrode Transparent Electrode)

The transparent electrode 806 according to the present invention is desired to have a light transmissivity of 85% or more for the purpose of effectively causing light from the sun or a white fluorescent lamp to be absorbed into the semiconductor layer. Furthermore, it does not function as the resistance factor against the output from the photovolatic device in terms of the electrical factor. Therefore, it is preferable that the sheet resistance be 100Ω or less. A material having the above-described characteristics is exemplified by: a metal oxide, such as $SnO_2$, $In_2O_3$, ZnO, CdO, $Cd_2SnO_4$ and ITO ($In_2O_3+SnO_2$); or a metal thin film manufactured by forming metal such as Au, Al or Cu into an extremely thin transparent film. Since the transparent electrode is layered on the p-type semiconductor layer 805 in the structure shown in FIGS. 8 (a), (c) and (d) and the same is layered on the substrate 801 in the structure shown in FIG. 8 (b), a material exhibiting excellent adhesion ability must be selected. It can be manufactured by a proper method selected from the resistance heat evaporating method, the electron beam heat evaporating method, the sputtering method and the spraying method.

(III) Collecting Electrode

The collecting electrode 807 according to the present invention is disposed on the transparent electrode 806 for the purpose of reducing the surface resistance value of the transparent electrode 806. The material for the electrode is exemplified by metal such as Ag, Cr, Ni, Al, Ag, Au, Ti, Pt, Cu, Mo and W or their alloy. The thin film thus-formed may be used in a stacked manner. Furthermore, the shape and the area are determined to sufficiently secure the quantity of light made incident upon the semiconductor layer.

For example, the shape is desired so as to uniformly disperse the light on the light receiving surface of the photovolatic device, as well as having an area ratio with respect to the light receiving area of 15% or less, more preferably 10% or less.

The sheet resistance is desired to be 50Ω or less, more preferably 10Ω or less.

i-Type Semiconductor Layer

The material for the semiconductor for constituting the i-type semiconductor layer for use in the photovolatic device manufactured by the method according to the present invention is exemplified by: a IV group or IV group alloy type semiconductor material such as A-Si:H, A-Si:F, A-Si:H:F, A-SiC:H, A-SiC:F, A-SiC:H:F, A-SiGe:H, A-SiGe:F; A-SiGe:H:F, poly-Si:H, poly-Si:F and poly-Si:H:F. Additionally, a II–VI group and III–V group compound semiconductor material are further examples.

p-Type Semiconductor Layer and n-Type Semiconductor Layer

The semiconductor material for constituting the p-type or the n-type semiconductor layer for use in the photovolatic device manufactured by the method according to the present invention can be obtained by doping the valence electron control agent into the semiconductor material constituting the above-described i-type semiconductor layer.

FORMATION EXAMPLES

Then, formation examples by using the microwave PCVD apparatus according to the present invention will now be described. However, the present invention is not limited to the following examples.

Formation Example 1

Amorphous silicone film was continuously deposited by using the continuous type microwave; PCVD apparatus (see FIG. 3) according to Apparatus Embodiment 7.

First, a bobbin 303 to which SUS430BA elongated substrate (45 cam in width, 200 m long and 0.25 mm in thickness) which has been sufficiently degreased and cleaned was wound was set to the vacuum container 301 having the substrate pay-off mechanism. The substrate 101 was conveyed to the vacuum container 302 having the substrate take-up mechanism via the gas gate 321, the conveying mechanism in the insulating container 300 and the gas gate 322. Then, the tension was adjusted to a degree at which looseness can be prevented.

Then, the vacuum containers 301, 302 and the insulating container 300 were evacuated by a rotary pump (omitted from illustration) before the pressure was lowered by a mechanical booster pump (omitted from illustration) to a level about $10^{-3}$ Torr. Then, the pressure was lowered to a level $5\times10^{-6}$ Torr or lower by using an oil diffusion pump (HS-32 manufactured by Barian) while maintaining the surface temperature of the elongated member at 250° C. by using the temperature control mechanisms 106a and 106b.

The conditions such as the shape of the microwave applicator, the curved shape and the conveyance speed of the dielectric sheet are shown in Table 8.

At the moment at which the degasification has been performed satisfactorily, 450 sccm $SiH_4$, 5 sccm $SiF_4$ and 130 sccm $H_2$ were introduced through a gas introduction tube (omitted from illustration) before the opening degree of a throttle valve provided for the oil diffusion pump was adjusted so that the pressure in the insulating container 300 was maintained at 5 mTorr. When the pressure has been stabilized, microwave of an effective power of 0.85 kW×2 was radiated into the film-forming chamber from a 2.45 GHz microwave power source (emitted from illustration) through the applicators 107 and 108 disposed to confront each other. The introduced raw material gas was immediately formed into plasma so that a plasma region was formed, the leakage of the plasma region thus-formed being prevented through the spacing formed between the supporting/conveying rollers 102 and 103.

Then, the supporting/conveying rollers 102 and 103 and the supporting/conveying rings 104 and 105 (the driving mechanism of each of which is not shown) were operated so that the conveyance speed of the substrate 101 was controlled to 6 m/min.

50 sccm of $H_2$ gas was, as the gate gas, introduced into the gas gates 321 and 322 from the gate gas introduction tubes 316 and 317 and the same was exhausted by an oil diffusion pump (omitted from illustration) through the exhaust ports 318 so that the internal pressure in the gas gate was controlled to 1 mTorr.

The deposited film was formed continuously for 30 minutes from the commencement of the conveyance. Since the long substrates was used, the other deposited film was formed successively upon the completion of the operation according to this formation example. After all of the deposition operations had been completed, the substrate was cooled and removed so as to measure the widthwise and longitudinal film thickness distribution of the deposited film manufactured on the substrate by a method according to this formation example. The results were obtained in which all of the specimens were included in a range of 4% or less and the average film deposition speed was 125 Å/sec. Furthermore, the infrared ray absorption spectrum of a specimen obtained by cutting a portion of the same by using a FT-IR (1720X manufactured by Parckin Elmer) in accordance with a reflection method was measured. As a result of the examination, absorption was found at 2000 $cm^{-1}$ and 630 $cm^{-1}$ which was a specific absorption pattern for the a-Si:H:F film. Furthermore, the crystallinity of the film was evaluated by using a RHEED (JEM-100SX manufactured by Nihon Denshi). As a result, a halo pattern was found and it was found to be amorphous. Furthermore, the amount of hydrogen atoms contained in the film was examined by using a hydrogen content analyzer (EMGA-1100 manufactured by Horiba Seisakusho). As a result, it was found to be 19 ±2 atomic %.

Formation Example 2

An amorphous silicon germanium film was continuously deposited under the same conditions as those according to Formation Example 1, except for a procedure in which after the deposited film had been formed by the method according to Formation Example 1, the introduction of the raw material gas was stopped and the internal pressure in the insulating container 300 was evacuated to a level less than 5×10$^{-6}$ Torr; 130 sccm $SiH_4$, 80 sscm $GeH_4$, 3 sccm $SiF_4$ and 100 sccm $H_2$ were introduced through the gas introduction tube (omitted from illustration); the internal pressure was maintained at 10 mTorr; the microwave power was set to 0.5 kW×2; and the conveyance speed was set to 30 cm/min.

After the respective operations according to this formation example and the other formation examples had been completed, the substrate was cooled and removed so as to measure the widthwise and longitudinal film thickness distribution of the deposited film manufactured on the substrate by a method according to this formation example. The results were obtained in which all of the specimens were included in a range of 4% or less and the average film deposition speed was 49 Å/sec.

Furthermore, the infrared ray absorption spectrum of a specimen obtained by cutting a portion of the same by using a FT-IR (1720X manufactured by Parckin Elmer) in accordance with a reflection method was measured. As a result of the examination, absorption was found at 2000 $cm^{-1}$, 1880 $cm^{-1}$ and 630 $cm^{-1}$ which was a specific absorption pattern for the A-SiGe:H:F film. Furthermore, the crystallinity of the film was evaluated by using the RHEED (JEM-100SX manufactured by Nihon Denshi). As a result, a halo pattern was found and it was found to be amorphous. Furthermore, the amount of hydrogen atoms contained in the film was examined by using the hydrogen content analyzer (EMGA-1100 manufactured by Horiba Seisakusho). As a result, it was found to be 14±2 atomic %.

Formation Example 3

An amorphous silicon carbide film was continuously deposited in the same conditions as those according to Formation Example 1 except for a procedure in which, after the deposited film had been formed by the method according to Formation Example 1, the introduction of the raw material gas was stopped and the internal pressure in the insulating container 300 was evacuated to a level less than 5×10$^{-6}$ Torr; 140 sccm $SiH_4$, 20 sscm $CH_4$, 5 sccm $SiF_4$ and 300 sccm $H_2$ were introduced through the gas introduction tube (omitted from illustration); the internal pressure was maintained at 22 mTorr; and the microwave power was set to 1.1 kW×2.

After the respective operations according to this formation example and the other formation examples had been completed, the substrate was cooled and removed so as to measure the widthwise and longitudinal film thickness distribution of the deposited film manufactured on the substrate by a method according to this formation example. The results were obtained in which all of the specimens were included in a range of 5% or less and the average film deposition speed was 42 Å/sec.

Furthermore, the infrared ray absorption spectrum of a specimen obtained by cutting a portion of the same by using a FT-IR (1720X manufactured by Parckin Elmer) in accordance with a reflection method was measured. As a result of the examination, absorption was found at 2080 $cm^{-1}$, 1250 $cm^{-1}$ and 960 $cm^{-1}$ which was a specific absorption pattern for the A-SiC:H:F film. Furthermore, the crystallinity of the film was evaluated by using the RHEED (JEM-100SX manufactured by Nihon Denshi). As a result, a halo pattern was found and it was found to be amorphous. Furthermore, the amount of hydrogen atoms contained in the film was examined by using the hydrogen content analyzer (EMGA-1100 manufactured by Horiba Seisakusho). As a result, it was found to be 12±2 atomic %.

Formation Example 4

A p-type fine crystal silicon film was continuously deposited in the same conditions as those according to Formation Example i except for a procedure in which, after the deposited film had been formed by the method according to Formation Example 1, the introduction of the raw material gas was stopped and the internal pressure in the insulating container 300 was evacuated to a level less than $5 \times 10^{-6}$ Torr; 240 sccm $SiH_4$, 40 sccm $BF_3$ (diluted with $H_2$ to 3000 ppm), 25 sccm $SiF_4$ and 600 sccm $H_2$ were introduced through the gas introduction tube (omitted from illustration); the internal pressure was maintained at 7 mTorr; and the microwave power was set to 1.2 kW×2.

After the respective operations according to this formation example and the other formation examples had been completed, the substrate was cooled and removed so as to measure the widthwise and longitudinal film thickness distribution of the deposited film manufactured on the substrate by a method according to this formation example. The results were obtained in which all of the specimens were included in a range of 5% or less and the average film deposition speed was 60 Å/sec.

Furthermore, the infrared ray absorption spectrum of a specimen obtained by cutting a portion of the same by using a FT-IR (1720X manufactured by Parckin Elmer) in accordance with a reflection method was measured. As a result of the examination, absorption was found at 2100 $cm^{-1}$ and 630 $cm^{-1}$ which was a specific absorption pattern for the µC-Si:H:F film. Furthermore, the crystallinity of the film was evaluated by using the RHEED (JEM-100SX manufactured by Nihon Denshi). As a result, a ring pattern was found and it was found to be non-oriented polycrystalline film. Furthermore, the amount of hydrogen atoms contained in the film was examined by using the hydrogen content analyzer (EMGA-1100 manufactured by Horiba Seisakusho). As a result, it was found to be 3±1 atomic %.

Formation Example 5

A n-type amorphous silicon film was continuously deposited under the same conditions as those according to Formation Example 1 except for a procedure in which, after the deposited film had been formed by the method according to Formation Example 1, the introduction of the raw material gas was stopped and the internal pressure in the insulating container 300 was evacuated to a level less than $5 \times 10^{-6}$ Torr; 320 sccm $SiH_4$, 27 sccm $PH_3$ (diluted with $H_2$ to 1%), 5 sccm $SiF_4$ and 50 sccm $H_2$ were introduced through the gas introduction tube (omitted from illustration); the internal pressure was maintained at 8 mTorr; and the microwave power was set to 0.8 kW×2.

After the respective operations according to this formation example; and the other formation examples had been completed, the substrate was cooled and removed so as to measure the widthwise and longitudinal film thickness distribution of the deposited film manufactured on the substrate by a method according to this formation example. The results were obtained in which all of the specimens were included in a range of 5% or less and the average film deposition speed was 86 Å/sec.

Furthermore, the infrared ray absorption spectrum of a specimen obtained by cutting a portion of the same by using a FT-IR (1720X manufactured by Parckin Elmer) in accordance with a reflection method was measured. As a result of the examination, absorption was found at 2000 $cm^{-1}$ and 630 $cm^{-1}$ which was a specific absorption pattern for the A-Si:H:F film. Furthermore, the crystallinity of the film was evaluated by using the RHEED (JEM-100SX manufactured by Nihon Denshi). As a result, a halo pattern was found and it was found to be amorphous film. Furthermore, the amount of hydrogen atoms contained in the film was examined by using the hydrogen content analyzer (EMGA-1100 manufactured by Horiba Seisakusho). As a result, it was found to be 21±1 atomic %.

Formation Example 6

An amorphous silicon film was continuously deposited in the same conditions as those according to Formation Example 1 except for a procedure in which a PET (Polyethylene Telephthalate) elongated substrate (45 cm in width, 100 mm long and 0.9 mm in thickness) was used and the temperature of the substrate surface was set to 210° C.

The substrate was cooled and removed so as to measure the widthwise and longitudinal film thickness distribution of the deposited film. The results were obtained in which all of the specimens were included in a range of 5% or less and the average; film deposition speed was 120 Å/sec. Furthermore, the infrared ray absorption spectrum of a specimen obtained by cutting a portion of the same by using a FT-IR (1720X manufactured by Parckin Elmer) in accordance with a reference transmission method was measured. As a result of the examination, absorption was found at 2000 $cm^{-1}$ and 630 $cm^{-1}$ which was a specific absorption pattern for the a-Si:H:F film. Furthermore, the amount of hydrogen atoms contained in the film was examined from the absorption assigned to Si—H adjacent to 2000 $cm^{-1}$. As a result, it was found to be 24±2 atomic %.

Furthermore, the crystallinity of the film was evaluated by using the RHEED (JEM-100SX manufactured by Nihon Denshi). As a result, a halo pattern was found and it was found to be amorphous film.

Furthermore, 20 other portions were cut out at random so as to evaporate an Al comb-type spacing electrode (250 µm wide and 5 mm in length) by the resistance heat evaporating method to each of 20 specimens. The photoelectric current value under irradiation of AM-1 light (100 mw/$cm^2$) and the dark current value in dark were measured by using an HP4140B so that a light conductivity $\sigma_p$ (S/cm) and a dark conductivity $\sigma_d$ (S/cm) were obtained. As a result, they were respectively within $(6.0\pm0.5) \times 10^{-5}$ S/cm and $(1.5\pm0.5) \times 10^{-11}$ S/cm.

Formation Example 7

Figure 7:
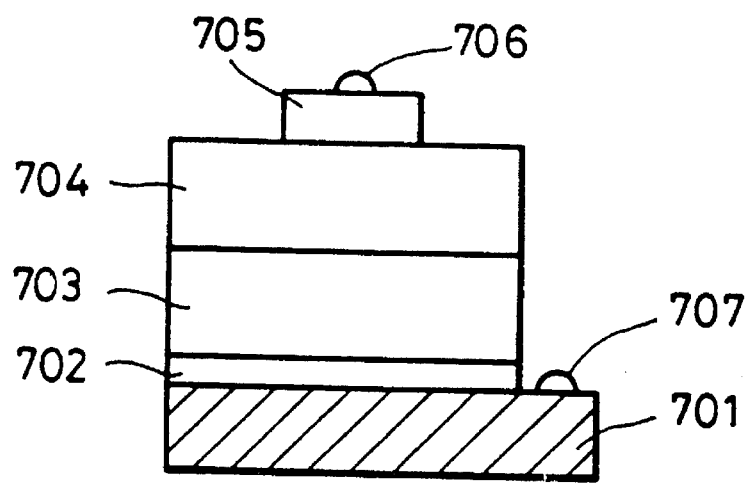
FIG. 7 is a cross sectional schematic view which illustrates a Shottky coupled type diode manufactured by a method according to the present invention.

According to this formation example, a Shottky junction type diode the schematic cross section of a layer structure of which is shown in FIG. 7 was manufactured by the apparatus shown in FIG. 3.

Reference numeral 701 represents a substrate, 702 represents a lower electrode, 703 represents an $n^+$-type semiconductor layer, 704 represents a non-doped semiconductor layer, 705 represents a metal layer and 706 and 707 represent current output terminals.

First, a SUS430BA elongated substrate similar to that used according to Formation Example 1 was set in a continuously sputtering apparatus so as to deposit a 1300 Å Cr thin film for making a Cr (99.98%) electrode so that the lower lower electrode 702 was formed.

Then, the elongated member was set in the pay-off bobbin 303 disposed in the vacuum container 301 of the continuous deposited film forming apparatus according to Apparatus Embodiment 7 and shown in FIG. 3 before its end portion was fitted to the take-up bobbin 304 disposed in the vacuum container 302 via the insulating container 300 while making the surface on which the Cr thin film was formed face downward. Then, the tension was adjusted to remove looseness.

The conditions according to this formation example such as the curved shape of the substrate and the microwave applicator were set similarly to those shown in Table 8.

TABLE 8

| | |
|---|---|
| Inner diameter of the curved portion | φ20 cm |
| Spacing L | 3.2 cm |
| Size of microwave applicator (inner diameter × length) | φ97 mm × 135 mm |
| Microwave propagating waveguide | EIAJ, WRI-32 |
| Conditions for conveying dielectric sheet | material of sheet: alumina ceramic paper |
| | size of sheet: width 12 cm, thickness 0.4 mm, length 2 m |
| | sheet conveying speed: 0.5 cm/min |

Then, each vacuum container was subjected to primary and vacuum evacuations by an exhausting pump (omitted from illustration) via the corresponding exhaust pipes 309, 310 and 311. During this, the surface temperature of the elongated member was set at 250° C. by using the temperature control mechanisms 106a and 106b.

At the moment at which the degasification has been performed satisfactorily, 300 sccm $SiH_4$, 4 sccm $SiF_4$, 55 sccm $PH_3/H_2$ (diluted with $H_2$ to 1%) and 40 sccm $H_2$ were introduced through a gas introduction tube (omitted from illustration) before the opening of a throttle valve 309 was adjusted so that the pressure in the insulating container 300 was maintained at 8 mTorr. When the pressure has been stabilized, microwave of 0.85 kW×2 was radiated from a microwave power source (omitted from illustration) through the applicators 107 and 108. Simultaneously with the generation of plasma, the conveyance was commenced at a conveyance speed of 60 cm/min in a direction from left to right of the drawing for 5 minutes, in which the film deposition operation was performed. As a result, an $n^+$ A-Si:H:F film serving as the $n^+$ semiconductor layer 703 was formed on the lower electrode 702.

50 sccm of $H_2$ gas was, as the gate gas, introduced into the gas gates 321 and 322 and the same was exhausted by an exhaust pump (omitted from illustration) through the exhaust ports 318 so that the internal pressure in the gas gate was controlled to 1.5 mTorr.

After the supply of the microwave and the introduction of the raw material gas had been stopped and as well as the conveyance of the elongated member had been stopped, the internal pressure of the insulating container 300 was evacuated to a level less than $5 \times 10^{-6}$ Torr. Then, 320 sccm $SiH_4$, 6 sccm $SiF_4$ and 60 sccm $H_2$ were again introduced from the gas introduction tube before the opening degree of the throttle valve was adjusted so as to make the internal pressure of the insulating container 300 to be 6 mTorr. When the pressure has been stabilized, microwave of 0.7 kW×2 was radiated from a microwave power source (omitted from illustration) through the applicators 107 and 108. Simultaneously with the generation of plasma, the conveyance was commenced at a conveyance speed of 60 cm/min in a reverse direction from right to left of the drawing for 5 minutes, in which the film deposition operation was performed. As a result, an A-Si:H:F film serving as the non-dope semiconductor layer 704 was formed on the $n^+$ A-Si:H:F film.

After all of the film deposition operations had been completed, the supply of microwave and the raw material gas were stopped, the conveyance of the substrate was also stopped, the residual gas in the insulating container 300 was sufficiently exhausted and the substrate was taken out after it had been cooled.

Permalloy masks of a diameter of φ5 mm were, at random, brought into contact with 10 portions of the substrate before an Au thin firm was, as the metal layer 705, evaporated by the electron beam evaporating method by a thickness of 80 Å. Then, the current output terminals 706 and 707 were bonded by a wire bonder so as to evaluate the diode characteristics by using the HP4140B.

As a result, a desirable diode factor n=1.2±0.05 and about 6 digits for the rectification ratio at ±1 V were obtained.

Formation Example 8

According to this example, the pin-type photovolatic device of the layer structure the schematic cross section of which was shown in FIG. 8 (a) was manufactured by using the apparatus shown in FIG. 4.

The photovolatic device 800 is formed by sequentially depositing, on the supporting member 801, the lower electrode 802, the n-type semiconductor layer 803, the i-type semiconductor layer 804, the p-type semiconductor layer 805, the transparent electrode 806 and the collector electrode 807 in this sequential order. The photovolatic device according to this embodiment is arranged in such a manner that light is made incident upon the transparent electrode 806 side.

A PET elongated substrate similar to that according to Formation Example 6 was set to the continuous sputtering apparatus so that a 1000 Å Ag thin film was formed by sputtering by using an Ag (99.99%) electrode as the target and 1.2 μm ZnO thin film was formed by sputtering by continuously using a ZnO (99.999%) electrode as the target so that the lower electrode 802 was formed.

Then, the elongated substrate having the lower electrode 802 formed was set to the continuous deposited film forming apparatus shown in FIG. 4 by the same quantity as that according to Formation Example 7. The conditions such as the curved shape of the substrate and the conveyance condition of the dielectric sheet in the insulating container 300 are shown in Table 9.

TABLE 9

| | | |
|---|---|---|
| Insulating chamber Parameter | 300 | |
| Deposited film forming raw material gas (sccm) | $SiH_4$ | 240 |
| | $H_2$ | 80 |
| | $SiF_4$ | 8 |
| Pressure (mTorr) | 6 | |
| Microwave power (kW) | 0.65 × 2 | |
| Inner diameter of curved curved portion (cm) | φ20 | |
| Spacing L (cm) | 3.2 | |
| Size of microwave applicator (inner diameter × length) | φ98 mm × 135 mm | |
| Microwave propagating waveguide | EIAJ, WRI-26 | |
| Surface temperature of elongated member (°C.) | 210 | |
| Conditions for conveying dielectric sheet | material of sheet | alumina ceramic paper |
| | size of sheet | width 12 cm |
| | | thickness 0.5 mm |
| | | length 4 m |
| | sheet conveying speed | 1 cm/min |

TABLE 10

| Parameter | Insulating container 300-a | 300-b |
|---|---|---|
| Deposited film forming raw material gas (sccm) | SiH4 30<br>H2 100<br>PH3/H2 5<br>(diluted by H2 to 1%)<br>SiF4 3 | SiH4 25<br>H2 250<br>B2H6/H2 20<br>(diluted by H2 to 3000 ppm)<br>SiF4 3 |
| Pressure (mTorr) | 9 | 8 |
| Microwave power (kW) | 0.65 × 2 | 0.75 × 2 |
| Inner diameter of curved portion (cm) | φ15.5* | φ15.5* |
| Spacing L (cm) | 1.0 | 1.0 |
| Size of microwave applicator (inner diameter × Length) | φ80 mm × 125 mm | φ80 mm × 120 mm |
| Microwave propagating wave guide | EIAJ, WRI-26 | EIAJ, WRI-26 |
| Surface temperature of elongated member (°C.) | 210 | 200 |
| Conditions for conveying dielectric sheet — material of sheet | Teflon coated polyamide | ceramic paper |
| size of sheet | width 85 cm<br>thickness 0.3 mm<br>length 2 m | width 85 cm<br>thickness 0.35 mm<br>length 2 m |
| Sheet conveyance speed | 10 cm/min | 2 cm/min |

*A substrate cover for fine-adjusting the film thickness is inserted into the curved portion.

In the insulating containers 300-*a* and 300-*b,* an n-type a-Si:H:F film and p$^+$ type µc-Si:H:F film were respectively formed under the deposited film forming conditions shown in Table 10.

First, microwave plasma was generated in each of the film-forming chambers before the elongated member 101 was conveyed from left to right when viewed in the drawing at a conveyance speed of 55 cm/min after the discharge or the like had been stabilized so that the n, i, p type semiconductor layers were continuously formed.

After the semiconductor layer had been stacked on the overall length of the elongated member 101, it was taken out after cooling. Then, a continuously module forming apparatus was used and 35 cm×70 cm solar cell modules were continuously manufactured.

The characteristics of the manufactured solar cell module were evaluated under the irradiation of AM1.5 (100 mW/cm$^2$) light. As a result, a desirable photoelectric conversion efficiency of 8.3% or more was found and the deviation in the characteristics between the modules was within 5%.

Furthermore, the change rate of the photoelectric conversion efficiency after a continuous irradiation of AM1.5 (100 mW/cm$^2$) light for 500 hours with respect to the initial value was within 10%.

The above-described modules were connected to one another so that a power supply system of 3 kW could be manufactured.

Formation Example 9

According to this example, the pin type photovolatic device manufactured according to Formation Example 8 was arranged in such a manner that the a-Si:H:F film serving as the i-type semiconductor layer was replaced by an a-SiGe:H:F film.

The a-SiGe:H:F film was formed similarly to the method according to Formation Example 2 except for the arrangement made in such a manner that the conveyance speed was set to 52 cm/min and the surface temperature of the elongated member was set to 200° C. The other semiconductor and module formation processes were performed by the same method as that, according to Formation Example 8 so that a solar cell was manufactured.

The characteristics of the manufactured solar cell module were evaluated under the irradiation of AM1.5 (100 mW/cm$^2$) light. As a result, a desirable photoelectric conversion efficiency of 7.3% or more was found and the deviation in the characteristics between the modules was within 5%.

Furthermore, the change rate of the photoelectric conversion efficiency after a continuous irradiation of AM1.5 (100 mW/cm$^2$) light for 500 hours with respect to the initial value was within 10%. The above-described modules were connected to one another so that a power supply system of 3 kW could be manufactured.

Formation Example 10

According to this this example, the pin type photovolatic device manufactured according to Formation Example 8 was arranged in such a manner that the a-Si:H:F film serving as the i-type semiconductor layer was replaced by an a-SiC:H:F film.

The a-SiC:H:F film was formed similarly to the method according to Formation Example 3 except for the arrangement made in such a manner that the conveyance speed was set to 48 cm/min and the surface temperature of the elongated member was set to 220° C. The other semiconductor and module formation processes were performed by the same method as that according to Formation Example 8 so that a solar cell was manufactured.

The characteristics of the manufactured solar cell module were evaluated under the irradiation of AM1.5 (100 mW/cm$^2$) light. As a result, a desirable photoelectric conversion efficiency of 6.4% or more was found and the deviation in the characteristics between the modules was within 5%.

Furthermore, the change rate of the photoelectric conversion efficiency after a continuous irradiation of AM1.5 (100 mW/cm$^2$) light for 500 hours with respect to the initial value was within 10%.

The above-described modules were connected to one another so that a power supply system of 3 kW could be manufactured.

Formation Example 11

According to this example, a photovolatic device the layer structure of which is shown in FIG. 8 (*c*) was manufactured. The same was manufactured by using an apparatus (omitted from illustration) obtained by arranging the apparatus shown in FIG. 4 in such a manner that insulating containers 300*a'*, 300' and 300*b'* respectively arranged similarly to the insulating containers 300*a*, 300 and 300*b* are, in this sequential order, connected to one another via gas gates.

The elongated member employed was an elongated member made of the same material as that for the elongated member according to Formation Example 1 and subjected to the same process. The layer structure of the lower cell was the same as that according to Formation Example 9, while the layer structure of the upper cell was the same as that according to Formation Example 8. The conditions for forming the deposited film for each layer are as shown in Table 11. The module formation process was arranged to be the same as that according to Formation Example 8 to manufacture a solar cell.

The characteristics of the manufactured solar cell module were evaluated under the irradiation of AM1.5 (100 mW/cm$^2$) light. As a result, a desirable photoelectric conversion efficiency of 10.3% or more and the deviation in the characteristics between the modules was within 5%.

Furthermore, the change rate of the photoelectric conversion efficiency after a continuous irradiation of AM1.5 (100 mW/cm$^2$) light for 500 hours with respect to the initial value was within 9%.

The above-described modules were connected to one another so that a power supply system of 3 kW could be manufactured.

Formation Example 12

According to this example, a photovoltaic device the layer structure of which is shown in FIG. 8 (c) was manufactured. The same was manufactured by using an apparatus (omitted from illustration) which was obtained by arranging the apparatus shown in FIG. 4 in such a manner that insulating containers 300$b'$, 300' and 300$b'$ respectively arranged similar to the insulating containers 300$a$, 300 and 300$b$ were, in this sequential order, connected to one another via gas gates.

The elongated member employed was an elongated member made of the same material as that for the elongated member according to Formation Example 1 and subjected to the same process. The layer structure of the lower cell was the same as that according to Formation Example 8, while the layer structure of the upper cell was the same as that according to Formation Example 10. The conditions for

TABLE 11

| Semiconductor layer | Lower cell | | |
|---|---|---|---|
| Parameter | 300-a | 300 | 300-b |
| Deposited film forming raw material gas (sccm) | SiH4  30<br>H2  100<br>PH3/H2  5<br>(diluted by H2 to 1%)<br>SiF4  3 | SiH4  120<br>GeH4  95<br>H2  120<br>SiF4  5 | SiH4  25<br>H2  250<br>BF3/H2  20<br>(diluted by H2 to 3000 ppm)<br>SiF4  3 |
| Pressure (mTorr) | 9 | 10 | 8 |
| Microwave power (kW) | 0.65 × 2 | 0.6 × 2 | 0.75 × 2 |
| Inner diameter of curved shape (cm) | φ16* | φ20 | φ16* |
| Spacing L (cm) | 1.0 | 3.2 | 1.0 |
| Size of microwave applicator (inner diameter × length) | φ95 mm × 125 mm | φ98 mm × 135 mm | φ85 mm × 120 mm |
| Microwave propagating waveguide | EIAJ, WRI-26 | EIAJ, WRI-26 | EIAJ, WRI-26 |
| Dielectric sheet conveyance condition — Sheet material | ceramic paper | ceramic paper | Teflon |
| Sheet size | width 10 cm<br>thickness 0.3 mm<br>length 3 m | width 12 cm<br>thickness 0.3 mm<br>length 3 m | width 9 cm<br>thickness 0.5 mm<br>length 10 m |
| Sheet conveyance speed | 2 cm/min | 4 cm/min | 12 cm/min |
| Surface temperature of elongated member (°C.) | 260 | 250 | 240 |
| Conveyance speed | | 55 cm/min | |

| Semiconductor layer | Upper cell | | |
|---|---|---|---|
| Parameter | 300-a' | 300' | 300-b' |
| Deposited film forming raw material gas (sccm) | SiH4  28<br>H2  95<br>PH3/H2  5<br>(diluted by H2 to 1%)<br>SiF4  3 | SiH4  220<br>H2  70<br>SiF4  7 | SiH4  22<br>H2  220<br>BF3/H2  18<br>(diluted by H2 to 3000 ppm)<br>SiF4  2 |
| Pressure (mTorr) | 9 | 6 | 8 |
| Microwave power (kW) | 0.65 × 2 | 0.6 × 2 | 0.75 × 2 |
| Inner diameter of curved shape (cm) | φ16* | φ20 | φ16* |
| Spacing L (cm) | 1.0 | 3.2 | 1.0 |
| Size of microwave applicator (inner diameter × length) | same as 300-a | same as 300 | same as 300-b |
| Microwave propagating waveguide | EIAJ, WRI-26 | EIAJ, WRI-26 | WIAJ, WRI-26 |
| Dielectric sheet conveyance condition — Sheet material | ceramic paper | ceramic paper | Teflon |
| Sheet size | width 10 cm<br>thickness 0.3 mm<br>length 3 m | width 12 cm<br>thickness 0.3 mm<br>length 3 m | width 9 cm<br>thickness 0.5 mm<br>length 10 m |
| Sheet conveyance speed | 2 cm/min | 4 cm/min | 12 cm/min |
| Surface temperature of elongated member (°C.) | 240 | 230 | 230 |
| Conveyance speed | | 55 cm/min | |

*substrate cover for adjusting the film thikcness is inserted into the curved portion forming the deposited film for each layer are as shown in Table 12. The module formation process was arranged to be the same as that according to Formation Example 8 to manufacture a solar cell.

The characteristics of the manufactured solar cell module were evaluated under the irradiation of AM1.5 (100 mW/cm$^2$) light. As a result, a desirable photoelectric conversion efficiency of 10.2% or more and the deviation in the characteristics between the modules was within 5%.

Furthermore, the change rate of the photoelectric conversion efficiency after a continuous irradiation of AM1.5 (100 mW/cm$^2$) light for 500 hours with respect to the initial value was within 9%.

The above-described modules were connected to one another so that a power supply system of 3 kW could be manufactured.

Formation Example 13

According to this example, a photovolatic device the layer structure of which is shown in FIG. 8 (*d*) was manufactured. The same was manufactured by using an apparatus (omitted from illustration) which was obtained by arranging the apparatus shown in FIG. 4 in such a manner that insulating containers 300*a'*, 300' and 300*b'* respectively arranged similar to the insulating containers 300*a*, 300 and 300*b* were, in this sequential order, connected to one another via gas gates.

The elongated member employed was an elongated member made of the same material as that for the elongated member according to Formation Example 1 and subjected to the same process. The layer structure of the lower cell was the same as that according to Formation Example 9, the layer structure of the intermediate cell was the same as that

TABLE 12

Semiconductor layer
Parameter

| | Lower cell | | |
|---|---|---|---|
| | 300-a | 300 | 300-b |
| Deposited film forming raw material gas (sccm) | SiH4 30<br>H2 100<br>PH3/H2 5<br>(diluted by H2 to 1%)<br>SiF4 3 | SiH4 25<br>H2 250<br>SiF4 20 | SiH4 25<br>H2 250<br>BF3/H2 20<br>(diluted by H2 to 3000 ppm)<br>SiF4 3 |
| Pressure (mTorr) | 9 | 6 | 8 |
| Microwave power (kW) | 0.65 × 2 | 0.70 × 2 | 0.75 × 2 |
| Inner diameter of curved shape (cm) | φ16* | φ20 | φ16* |
| Spacing L (cm) | 1.0 | 3.2 | 1.0 |
| Size of microwave applicator (inner diameter × length) | φ95 mm × 125 mm | φ98 mm × 135 mm | φ85 mm × 120 mm |
| Microwave propagating waveguide | EIAJ, WRI-26 | EIAJ, WRI-26 | EIAJ, WRI-26 |
| Dielectric sheet conveyance condition — Sheet material | ceramic paper | ceramic paper | ceramic paper |
| Sheet size | width 10 cm<br>thickness 0.5 mm<br>length 3 m | width 11 cm<br>thickness 0.4 mm<br>length 3 m | width 9 cm<br>thickness 0.5 mm<br>length 3 m |
| Sheet conveyance speed | 1 cm/min | 2 cm/min | 1 cm/min |
| Surface temperature of elongated member (°C.) | 270 | 260 | 260 |
| Conveyance speed | | 52 cm/min | |

| | Upper Cell | | |
|---|---|---|---|
| | 300-a' | 300' | 300-b' |
| Deposited film forming raw material gas (sccm) | SiH4 28<br>H2 95<br>PH3/H2 5<br>(diluted by H2 to 1%)<br>SiF4 3 | SiH4 180<br>CH4 25<br>H2 400<br>SiF4 10 | SiH4 22<br>H2 220<br>BF3/H2 18<br>(diluted by H2 to 3000 ppm)<br>SiF4 2 |
| Pressure (mTorr) | 9 | 6 | 8 |
| Microwave power (kW) | 0.65 × 2 | 0.70 × 2 | 0.75 × 2 |
| Inner diameter of curved shape (cm) | φ16* | φ20* | φ16* |
| Spacing L (cm) | 1.0 | 3.2 | 1.0 |
| Size of microwave applicator (inner diameter × length) | same as 300-a | same as 300 | same as 300-b |
| Microwave propagating waveguide | EIAJ, WRI-26 | EIAJ, WRI-26 | EIAJ, WRI-26 |
| Dielectric sheet conveyance condition — Sheet material | ceramic paper | ceramic paper | ceramic paper |
| Sheet size | width 10 cm<br>thickness 0.5 mm<br>length 3 m | width 11 cm<br>thickness 0.4 mm<br>length 3 m | width 9 cm<br>thickness 0.5 mm<br>length 3 m |
| Sheet conveyance speed | 1 cm/min | 2 cm/min | 1 cm/min |
| Surface temperature of elongated member (°C.) | 250 | 260 | 240 |
| Conveyance speed | | 52 cm/min | |

*substrate cover for adjusting the film thickness is inserted into the curved portion according to Formation Example 8 and the layer structure of the upper cell was the same as that according to Formation Example 10. The conditions for forming the deposited film for each layer are as shown in Table 13. The module formation process was arranged to be the same as that according to Formation Example 8 to manufacture a solar cell.

The characteristics of the manufactured solar cell module were evaluated under the irradiation of AM1.5 (100 mW/cm$^2$) light. As a result, a desirable photoelectric conversion efficiency of 10.4% or more and the deviation in the characteristics between the modules was within 5%.

Furthermore, the change rate of the photoelectric conversion efficiency after a continuous irradiation of AM1.5 (100 mW/cm$^2$) light for 500 hours with respect to the initial value was within 8.5%.

The above-described modules were connected to one another so that a power supply system of 3 kW could be manufactured.

TABLE 13

| Semiconductor layer | Lower cell | | |
|---|---|---|---|
| Parameter | 300-a | 300 | 300-b |
| Deposited film forming raw material gas (sccm) | SiH4 30<br>H2 100<br>PH3/H2 5<br>(diluted by H2 to 1%)<br>SiF4 3 | SiH4 130<br>GeH4 100<br>H2 150<br>SiF4 5 | SiH4 25<br>H2 250<br>BF3/H2 20<br>(diluted by H2 to 3000 ppm)<br>SiF4 3 |
| Pressure (mTorr) | 9 | 6 | 8 |
| Microwave power (kW) | 0.65 × 2 | 0.70 × 2 | 0.75 × 2 |
| Inner diameter of curved shape (cm) | φ16* | φ20 | φ16* |
| Spacing L (cm) | 1.0 | 3.2 | 1.2 |
| Size of microwave applicator (inner diameter × length) | φ95 mm × 125 mm | φ98 mm × 135 mm | φ85 mm × 120 mm |
| Microwave propagating waveguide | EIAJ, WRI-26 | EIAJ, WRI-32 | EIAJ, WRI-26 |
| Dielectric sheet Sheet material | ceramic paper | ceramic paper | ceramic paper |
| Sheet size | width 10 cm<br>thickness 0.4 mm<br>length 5 m | width 11 cm<br>thickness 0.4 mm<br>length 3 m | width 9 cm<br>thickness 0.5 mm<br>length 5 m |
| conveyance condition Sheet conveyance speed | 2 cm/min | 2 cm/min | 2 cm/min |
| Surface temperature of elongated member (°C.) | 280 | 260 | 270 |
| Conveyance speed | | 54 cm/min | |

| Semiconductor layer | Intermediate Cell | | |
|---|---|---|---|
| Parameter | 300-a' | 300' | 300-b' |
| Deposited film forming raw material gas (sccm) | SiH4 28<br>H2 95<br>PH3/H2 5<br>(diluted by H2 to 1%)<br>SiF4 3 | SiH4 250<br>H2 90<br>SiF4 8 | SiH4 22<br>H2 220<br>BF3/H2 18<br>(diluted by H2 to 3000 ppm)<br>SiF4 2 |
| Pressure (mTorr) | 8 | 6 | 8 |
| Microwave power (kW) | 0.65 × 2 | 0.70 × 2 | 0.75 × 2 |
| Inner diameter of curved shape (cm) | φ16* | φ20 | φ16* |
| Spacing L (cm) | 1.0 | 3.2 | 1.0 |
| Size of microwave applicator (inner diameter × length) | same as 300-a | same as 300 | same as 300-b |
| Microwave propagating waveguide | EIAJ, WRI-26 | EIAJ, WRI-32 | EIAJ, WRI-26 |
| Dielectric sheet Sheet material | ceramic paper | ceramic paper | ceramic paper |
| Sheet size | width 10 cm<br>thickness 0.4 mm<br>length 5 m | width 11 cm<br>thickness 0.4 mm<br>length 5 m | width 9 cm<br>thickness 0.5 mm<br>length 5 m |
| conveyance condition Sheet conveyance speed | 2 cm/min | 3 cm/min | 2 cm/min |
| Surface temperature of elongated member (°C.) | 270 | 260 | 260 |
| Conveyance speed | | 52 cm/min | |

| Semiconductor layer | Upper Cell | | |
|---|---|---|---|
| Parameter | 300-a' | 300' | 300-b' |
| Deposited film forming raw material gas (sccm) | SiH4 26<br>H2 90<br>PH3/H2 4<br>(diluted by H2 to 1%)<br>SiF4 3 | SiH4 185<br>CH4 27<br>H2 400<br>SiF4 10 | SiH4 20<br>H2 200<br>BF3/H2 16<br>(diluted by H2 to 3000 ppm)<br>SiF4 2 |
| Pressure (mTorr) | 8 | 22 | 7 |
| Microwave power (kW) | 0.65 × 2 | 1.3 × 2 | 0.70 × 2 |
| Inner diameter of curved shape (cm) | φ16* | φ20 | φ16* |
| Spacing L (cm) | 1.0 | 3.2 | 1.2 |

TABLE 13-continued

| | | | | |
|---|---|---|---|---|
| Size of microwave applicator (inner diameter × length) | | same as 300-a | same as 300 | same as 300-b |
| Microwave propagating waveguide | | EIAJ, WRI-26 | EIAJ, WRI-26 | EIAJ, WRI-26 |
| Dielectric sheet | Sheet material | ceramic paper | ceramic paper | ceramic paper |
| | Sheet size | width 10 cm thickness 0.4 mm length 5 m | width 11 cm thickness 0.4 mm length 5 m | width 9 cm thickness 0.5 mm length 5 m |
| conveyance condition | Sheet conveyance speed | 2 cm/min | 3 cm/min | 2 cm/min |
| Surface temperature of elongated member (°C.) | | 250 | 250 | 240 |
| Conveyance speed | | | 54 cm/min | |

*substrate cover for adjusting the film thickness is inserted into the curved portion Although the present invention has been described with particularity it is to be understood that the invention is not limited to the disclosed embodiments. The present invention is intended to cover various modifications and equivalent arrangements without departing from the spirit and the scope of the invention as hereinafter claimed.

What is claimed is:

1. A method of continuously forming a functional deposited film by a microwave plasma CVD method comprising the steps of simultaneously:

(i) providing a columnar film-forming chamber having opposed end walls and a cylindrical side wall, said cylindrical side wall being an intermediate portion of a continuously moving elongated member;

(ii) introducing a deposited film-forming raw material gas into said film forming chamber via gas supply means; and (iii) generating a microwave plasma in said film-forming chamber through a continuously moving sheet made of dielectric material positioned in contact with a surface of a microwave introduction opening to said film-forming chamber wherein the microwave is introduced through said continuously moving sheet and conveyed to the continuously moving elongated member constituting the side wall of said film forming chamber and generates microwave plasma; and thereafter depositing the film from said raw material gas on the surface of said elongated member constituting said side wall of said columnar film-forming chamber by exposing said side wall to said microwave plasma.

2. A method of continuously forming a functional deposited film by a microwave plasma CVD method according to claim 1, wherein said sheet is a dielectric material from 0.1 mm to 1.3 mm thick.

3. A method a continuously forming a functional deposited film by a microwave plasma CVD method according to claim 1, wherein the distance from said sheet to said microwave introduction opening is no more than 0.5 mm.

4. A method of continuously forming a functional deposited film by a microwave plasma CVD method according to claim 1, wherein said sheet is polished.

5. A method of continuously forming a functional deposited film by a microwave plasma CVD method according to claim 1, wherein said deposited film formed on said sheet has a thickness of 25 μm or less.

6. A method of continuously forming a functional deposited film by a microwave plasma CVD method according to claim 1, wherein said moving elongated member is curved at an intermediate portion by using a curving initial end forming means and a curving completion end forming means to form said side wall of said film-forming chamber.

7. A method of continuously forming a functional deposited film by a microwave plasma CVD method according to claim 1, wherein a microwave energy is radiated into said film-forming chamber via at least one microwave applicator means disposed in at least one end surface of said columnar film-forming chamber.

8. A method of continuously forming a functional deposited film by a microwave plasma CVD method according to claim 7, wherein said microwave applicator means is vertically disposed with respect to said end surface so as to radiate said microwave energy in a direction which is in parallel to the side walls of said columnar film-forming chamber.

9. A method of continuously forming a functional deposited film by a microwave plasma CVD method according to claim 1, wherein said microwave applicator means and said film-forming chamber are hermetically sealed at said microwave introduction opening.

10. A method of continuously forming a functional deposited film by a microwave plasma CVD method according to claim 7, wherein said microwave applicator means are disposed to confront each other at said two end surfaces, such that microwave energy radiated from either of said microwave applicator means is not received by the other microwave applicator means.

11. A method of continuously forming a functional deposited film by a microwave plasma CVD method according to claim 1, wherein leakage of microwave energy radiated into said columnar film-forming chamber to the outside portion of said film-forming chamber is prevented by sealing the end surface of said columnar film-forming chamber.

12. A method of continuously forming a functional deposited film by a microwave plasma CVD method according to claim 1, wherein said raw material gas introduced into said film-forming chamber is exhausted through a spacing between said curving initial end forming means and said curving completion end forming means.

13. A method of continuously forming a functional deposited film by a microwave plasma CVD method according to claim 1, wherein either side of said elongated member is subjected to an electroconductive treatment.

\* \* \* \* \*

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

On the title page, item [56] REFERENCES CITED

Foreign Patent Documents,
    "2175878" should read --2-175878--.

COLUMN 2

Line 33, "charge" should read --discharge--.
    Line 45, "plurality" should read --plurality of--.

COLUMN 3

Line 33, "passage way" should read --passageway--.

COLUMN 5

Line 27, "fall off" should read --falloff--.
    Line 51, "s low" should read --slow--.

COLUMN 6

Line 56, "view" should read --view of--.

COLUMN 7

Line 41, "continuous" should read --continuously--.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 8

Line 31, "cross sectional" should read --cross-sectional--.
Line 34, "cross sectional" should read --cross-sectional--.
Line 35, "Shottky" should read --Schottky--.
Line 37, "cross sectional" should read --cross-sectional--.

COLUMN 11

Line 14, "film forming" should read --film-forming--.

COLUMN 12

Line 41, "face A'—A'." should read --face A—A'.--.

COLUMN 13

Line 6, "SiH4:" should read --$SiH_4$:--.
Table 2, "$\theta_z(\ )\quad \theta_1+\theta_z(\ )$" should read --$\theta_2(\ )\quad \theta_1+\theta_2(\ )$--;
"power is" should read --power source is--; and
"microwave discharge" should read --microwave, discharge--. (all occurrences)

COLUMN 16

Table 4, "curbed" should read --curved--.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

Page 3 of 15

It is certified that error appears in the above-identified patent and that said Letters Patent is hereby corrected as shown below:

COLUMN 17

Table 4, cont'd., "curbed" should read --curved--.
Line 47, "$\theta_1$" should read --$\theta_2$--.
Line 59, "gas" should read --gases--.
Line 62, "SiH4" should read --$SiH_4$--.

COLUMN 19

Line 27, "effect" should read --affect--.

COLUMN 25

Line 16, "subject" should read --subjected--.

COLUMN 27

Line 23, "portion" should read --portions--.
Line 33, "exhausted means" should read --exhausting means--.

COLUMN 31

Line 65, "of" should read --or--.

COLUMN 32

Line 16, "feed back" should read -feedback--.
Line 40, "paladium," should read --palladium,--.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.    Page 4 of 15

It is certified that error appears in the above-identified patent and that said Letters Patent is hereby corrected as shown below:

COLUMN 33

Line 32, "Microwave" should read --microwave--.

COLUMN 35

Line 10, "with" should be deleted.
Line 27, "desirably" should read --desirable--.

COLUMN 36

Line 4, "cross sectional" should read
--cross-sectional--.

COLUMN 37

Line 42, "cross sectional" should read
--cross-sectional--.

COLUMN 38

Line 67, "witch" should with --with--.

COLUMN 39

Line 1, "Of" should read --of--.
Line 48, "into" should read --to--.

UNITED STATES PATENT AND TRADEMARK OFFICE
CERTIFICATE OF CORRECTION

PATENT NO.  : 5,523,126
DATED       : June 4, 1996
INVENTOR(S) : MASAFUMI SANO ET AL.

It is certified that error appears in the above-identified patent and that said Letters Patent is hereby corrected as shown below:

COLUMN 40

Line 19, "GaF," should read --GaP,--.
Line 54, "panadium" should read --palladium--.

COLUMN 41

Line 8, "corresponding" should read --correspond--.
Line 32, "being" should be deleted.
Line 65, "cross sectional" should read --cross-sectional--.

COLUMN 42

Line 23, "contact" should read --in contact--.

COLUMN 43

Line 1, "parallelpiped" should read --parallelepiped--.
Line 14, "apparatus embodiment 1" should read --Apparatus Embodiment 1--.
Line 16, "cross sectional" should read --cross-sectional--.
Line 20, "is" should read --are--.

COLUMN 44

Line 13, "Symbols" should read --symbols--.
Line 17, "4103" should read --403--.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 45

Line 26, "mender" should read --member--.
Line 31, "photovolatic" should read --photovoltaic--.
Line 36, "photovolatic" should read --photovoltaic--.
Line 40, "photovolatic" should read --photovoltaic--.
Line 45, "photovolatic" should read --photovoltaic--.
Line 49, "photovolatic" should read --photovoltaic--.
Line 51, "photovolatic" should read --photovoltaic--.
Line 54, "numeral 80i" should read --numeral 801--.
Line 61, "photovolatic" should read --photovoltaic--.
Line 65, "photovolatic" should read --photovoltaic--.
Line 67, "photovolatic" should read --photovoltaic--.

COLUMN 46

Line 12, "photovolatic" should read --photovoltaic--.
Line 15, "photovolatic" should read --photovoltaic--.
Line 18, "photovolatic" should read --photovoltaic--.
Line 27, "non light" should read --non-light--.
Line 38, "photovolatic" should read --photovoltaic--.
Line 54, "volatic" should read --voltaic--.
Line 55, "non" should read --non- --.
Line 57, "photovolatic" should read --photovoltaic--.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 47

Line 17, "metal" should read --metals--.
Line 18, "An," should read --Cu--.
Line 22, "the-output" should read --the output-- and "photovolatic" should read --photovoltaic--.
Line 37, "photovolatic" should read --photovoltaic--.
Line 38, "Transparent" should read --(Transparent--.
Line 44, "photovolatic" should read --photovoltaic--.
Line 65, "metal" should read --metals--.

COLUMN 48

Line 5, "photovolatic" should read --photovoltaic--.
Line 14, "photovolatic" should read --photovoltaic--.
Line 27, "photovolatic" should read --photovoltaic--.
Line 43, "microwave;" should read --microwave--.
Line 46, "(45 cam" should read --45 cm--.
Line 48, "was wound" should read --was wound and--.

COLUMN 49

Line 10, "(emitted" should read --(omitted--.
Line 42, "Parckin" should read --Perkin--.
Line 65, "80 sscm" should read --80 sccm--.

COLUMN 50

Line 14, "Parckin" should read --Perkin--.
Line 35, "20 sscm" should read --20 sccm--
Line 51, "Parckin" should read --Perkin--.
Line 67, "Example i" should read --Example 1--.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 51

Line 21, "Parckin" should read --Perkin--.
Line 49, "example;" should read --example--.
Line 60, "Parckin" should read --Perkin--.

COLUMN 52

Line 10, "Telephthalate)" should read --Terephthalate)--.
Line 18, "average;" should read --average--.
Line 21, "Parckin" should read --Perkin--.
Line 42, "11 S/cm." should read --$^{11}$ S/cm.--.
Line 46, "Shottky" should read --Schottky--.

COLUMN 53

Line 61, "non-dope" should read --non-doped--.

COLUMN 54

Line 5, "firm" should read --film--.
Line 17, "photovolatic" should read --photovoltaic--.
Line 21, "photovolatic" should read --photovoltaic--.
Line 26, "photovolatic" should read --photovoltaic--.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 55

Table 10, "SiH4 30        SiH4 25
          H2 100         H2 250
          PH3/H2 5       B2H6/H2 20
          (diluted by H2  (diluted by H2"
should read
          --SiH$_4$ 30       SiH$_4$ 25
          H$_2$ 100          H$_2$ 250
          PH$_3$/H$_2$ 5     B$_2$H$_6$/H$_2$ 20
          (diluted by H$_2$  (diluted by H$_2$-- and
"SiF4 3    SiF4 3" should read --SiF$_4$ 3    SiF$_4$ 3--.
Line 63, "photovolatic" should read --photovoltaic--.

COLUMN 56

Line 7, "that," should read --that--.
Line 24, "this this" should read --this-- and
         "photovolatic" should read --photovoltaic--.
Line 53, "photovolatic" should read --photovoltaic--.
Line 64, ".member" should read --member--.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 57

Table 11,
"SiH4         30         SiH4     120        SiH4          25
 H2          100         GeH4      95        H2           250
 PH3/H2        5         H2       120        BF3/H2        20
 (diluted by            SiF4        5        (diluted by H2 to
 H2 to 1%)                                    3000 ppm)
 SiF4          3                              SiF4           3      "
should read
--SiH$_4$       30        SiH$_4$   120        SiH$_4$       25
  H$_2$        100        GeH$_4$    95        H$_2$        250
  PH$_3$/H$_2$   5        H$_2$     120        BF$_3$/H$_2$  20
  (diluted by             SiF$_4$     5        (diluted by H$_2$ to
  H$_2$ to 1%)                                 3000 ppm)
  SiF$_4$        3                             SiF$_4$        3     -- and
"SiH4         28         SiH4     220        SiH4          22
 H2           95         H2        70        H2           220
 PH3/H2        5         SiF4       7        BF3/H2        18
 (diluted by                                  (diluted by H2 to
 H2 to 1%)                                    3000 ppm)
 SiF4          3                              SiF4           2      "
should read
--SiH$_4$       28        SiH$_4$   220        SiH$_4$       22
  H$_2$         95        H$_2$      70        H$_2$        220
  PH$_3$/H$_2$   5        SiF$_4$     7        BF$_3$/H$_2$  18
  (diluted by                                  (diluted by H$_2$ to
  H$_2$ to 1%)                                 3000 ppm)
  SiF$_4$        3                             SiF$_4$        2     --.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 58

Line 2, "photovolatic" should read --photovoltaic--.
Line 7, "containers 300b'," should read
--containers 300a;--.

COLUMN 59

Table 12,
"SiH4   30      SiH4   25      SiH4   25
 H2    100      H2    250      H2    250
 PH3/H2  5      SiF4   20      BF3/H2 20
 (diluted by                   (diluted by H2 to 3000 ppm)
 H2 to 1%)                     SiF4    3
 SiF4    3                                              "
should read
--SiH$_4$   30      SiH$_4$   25      SiH$_4$   25
  H$_2$    100      H$_2$    250      H$_2$    250
  PH$_3$/H$_2$ 5    SiF$_4$   20      BF$_3$/H$_2$ 20
  (diluted by                         (diluted by H$_2$ to 3000 ppm)
  H$_2$ to 1%)                        SiF$_4$   3
  SiF$_4$   3                                               --;

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

Page 12 of 15

It is certified that error appears in the above-identified patent and that said Letters Patent is hereby corrected as shown below:

COLUMN 59

```
     Table 12, continued,
    "SiH4   28       SiH4  180       SiH4    22
     H2     95       CH4    25       H2     220
     PH3/H2  5       H2    400       BF3/H2  18
     (diluted by     SiF4   10       (diluted by H2 to 3000 ppm)
     H2 to 1%)                       SiF4     2
     SiF4    3                                                          "
    should read
    --SiH$_4$   28       SiH$_4$  180       SiH$_4$    22
      H$_2$     95       CH$_4$    25       H$_2$     220
      PH$_3$/H$_2$  5    H$_2$    400       BF$_3$/H$_2$  18
      (diluted by        SiF$_4$   10       (diluted by H$_2$ to 3000 ppm)
      H$_2$ to 1%)                          SiF$_4$    2
      SiF$_4$    3                                                     --;
```
and "$\phi$20*" should read --$\phi$20--.

COLUMN 60

Line 2, "photovolatic" should read --photovoltaic--.

UNITED STATES PATENT AND TRADEMARK OFFICE
CERTIFICATE OF CORRECTION

PATENT NO. : 5,523,126

DATED : June 4, 1996

INVENTOR(S) : MASAFUMI SANO ET AL.

It is certified that error appears in the above-identified patent and that said Letters Patent is hereby corrected as shown below:

COLUMN 62

Table 13,

"SiH4        30       SiH4   130      SiH4       25
 H2          100      GeH4   100      H2         250
 PH3/H2      5        H2     150      BF3/H2     20
 (diluted by          SiF4   5        (diluted by H2 to 3000 ppm)
 H2 to 1%)                            SiF4       3
 SiF4        3                                                      "

should read

--SiH$_4$       30       SiH$_4$   130      SiH$_4$    25
  H$_2$         100      GeH$_4$   100      H$_2$      250
  PH$_3$/H$_2$  5        H$_2$     150      BF$_3$/H$_2$ 20
  (diluted by            SiF$_4$   5        (diluted by H$_2$ to 3000 ppm)
  H$_2$ to 1%)                              SiF$_4$    3
  SiF$_4$      3                                                    --;

"SiH4        28       SiH4   250      SiH4       22
 H2          95       H2     90       H2         220
 PH3/H2      5        SiF4   8        BF3/H2     18
 (diluted by                          (diluted by H2 to 3000 ppm)
 H2 to 1%)                            SiF4       2
 SiF4        3                                                      "

should read

--SiH$_4$       28       SiH$_4$   250      SiH$_4$    22
  H$_2$         95       H$_2$     90       H$_2$      220
  PH$_3$/H$_2$  5        SiF$_4$   8        BF$_3$/H$_2$ 18
  (diluted by                               (diluted by H$_2$ to 3000 ppm)
  H$_2$ to 1%)                              SiF$_4$    2
  SiF$_4$      3                                                    --;
  and

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 62

Table 13, continued,

"SiH4      26        SiH4   185      SiH4         20
 H2        90        CH4    27       H2           200
 PH3/H2     4        H2     400      BF3/H2       16
 (diluted by          SiF4   10       (diluted by H2 to 3000 ppm)
 H2 to 1%)                            SiF4          2
 SiF4       3
 should read
--$SiH_4$    26      $SiH_4$  185    $SiH_4$      20
  $H_2$      90      $CH_4$    27    $H_2$        200
  $PH_3/H_2$  4      $H_2$    400    $BF_3/H_2$   16
  (diluted by         $SiF_4$   10    (diluted by $H_2$ to 3000 ppm)
  $H_2$ to 1%)                        $SiF_4$       2
  $SiF_4$     3                                                    --.

UNITED STATES PATENT AND TRADEMARK OFFICE
CERTIFICATE OF CORRECTION

PATENT NO. : 5,523,126
DATED : June 4, 1996
INVENTOR(S) : MASAFUMI SANO ET AL.

It is certified that error appears in the above-identified patent and that said Letters Patent is hereby corrected as shown below:

COLUMN 63

Line 30, "film forming" should read --film-forming--.
Line 39, "film forming" should read --film-forming--.
Line 50, "method a" should read --method of--.

Signed and Sealed this

Twenty-first Day of January, 1997

Attest:

BRUCE LEHMAN

*Attesting Officer*  *Commissioner of Patents and Trademarks*